(12) United States Patent
Katou

(10) Patent No.: US 10,546,865 B2
(45) Date of Patent: Jan. 28, 2020

(54) METHOD FOR MANUFACTURING A SEMICONDUCTOR DEVICE

(71) Applicant: Renesas Electronics Corporation, Tokyo (JP)

(72) Inventor: Shigeki Katou, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 197 days.

(21) Appl. No.: 15/858,296

(22) Filed: Dec. 29, 2017

(65) Prior Publication Data

US 2018/0204847 A1 Jul. 19, 2018

(30) Foreign Application Priority Data

Jan. 19, 2017 (JP) .................................. 2017-007448

(51) Int. Cl.
| | | |
|---|---|---|
| H01L 27/11524 | (2017.01) | |
| H01L 27/11519 | (2017.01) | |
| H01L 27/11565 | (2017.01) | |
| H01L 27/1157 | (2017.01) | |
| H01L 29/66 | (2006.01) | |

(52) U.S. Cl.
CPC .... *H01L 27/11524* (2013.01); *H01L 27/1157* (2013.01); *H01L 27/11519* (2013.01); *H01L 27/11565* (2013.01); *H01L 29/66545* (2013.01)

(58) Field of Classification Search
CPC ..................... H01L 27/11524; H01L 27/11519
See application file for complete search history.

(56) References Cited

U.S. PATENT DOCUMENTS

| | | | |
|---|---|---|---|
| 9,177,807 B2 | 11/2015 | Shinohara | |
| 9,548,366 B1 * | 1/2017 | Ho | H01L 29/6656 |
| 2005/0127435 A1 * | 6/2005 | Chen | H01L 27/115 257/327 |
| 2009/0057769 A1 * | 3/2009 | Wei | H01L 21/82345 257/369 |
| 2015/0008488 A1 * | 1/2015 | Hall | H01L 29/66636 257/288 |
| 2015/0041875 A1 * | 2/2015 | Perera | H01L 29/78 257/314 |

(Continued)

FOREIGN PATENT DOCUMENTS

JP 2014-127527 A 7/2014

*Primary Examiner* — Errol V Fernandes
(74) *Attorney, Agent, or Firm* — McDermott Will & Emery LLP

(57) ABSTRACT

The reliability of a semiconductor device is improved. A control gate electrode and a memory gate electrode for memory cell of a nonvolatile memory, a first gate electrode and a dummy gate electrode for peripheral circuit are formed. Then, a first insulation film is formed so as to cover them. The gate length of the first gate electrode is larger than the gate length of the control gate electrode. Then, an opening is formed in the first insulation film, to etch and reduce the height of the first gate electrode exposed from the opening. Thereafter, over the first insulation film, an insulation film is formed. Then, the insulation film is polished, to expose the control gate electrode, the memory gate electrode, the first gate electrode, and the dummy gate electrode. Then, the dummy gate electrode is removed. A gate electrode is formed in the removal region.

20 Claims, 33 Drawing Sheets

(56) References Cited

U.S. PATENT DOCUMENTS

| | | | |
|---|---|---|---|
| 2015/0145022 A1* | 5/2015 | Chuang | H01L 27/11573 257/326 |
| 2015/0279854 A1* | 10/2015 | Hall | H01L 29/66545 438/591 |
| 2016/0087058 A1* | 3/2016 | Perera | H01L 29/4966 257/314 |
| 2016/0141298 A1* | 5/2016 | Chuang | H01L 29/0653 257/324 |
| 2016/0268445 A1* | 9/2016 | Amo | H01L 29/66833 |

* cited by examiner

FIG. 56

| | OPERATION METHOD WRITE/ERASE | WRITE OPERATION VOLTAGE (V) Vmg/Vs/Vcg/Vd | ERASE OPERATION VOLTAGE (V) Vmg/Vs/Vcg/Vd | READ OPERATION VOLTAGE (V) Vmg/Vs/Vcg/Vd |
|---|---|---|---|---|
| A | SSI (WRITE)/ BTBT (ERASE) | 10/5/1/0.5 | -6/6/0/open | 0/0/1.5/1.5 |
| B | SSI (WRITE)/ FN (ERASE) | 10/5/1/0.5 | 12/0/0/0 | 0/0/1.5/1.5 |
| C | FN (WRITE)/ BTBT (ERASE) | -12/0/0/0 | -6/6/0/open | 0/0/1.5/1.5 |
| D | FN (WRITE)/ FN (ERASE) | -12/0/0/0 | 12/0/0/0 | 0/0/1.5/1.5 |

METHOD FOR MANUFACTURING A SEMICONDUCTOR DEVICE

CROSS-REFERENCE TO RELATED APPLICATIONS

The disclosure of Japanese Patent Application No. 2017-007448 filed on Jan. 19, 2017 including the specification, drawings and abstract is incorporated herein by reference in its entirety.

BACKGROUND

The present invention relates to a method for manufacturing a semiconductor device. More particularly, the present invention is preferably applicable to a method for manufacturing a semiconductor device having a nonvolatile memory and a MISFET.

As electrically writable/erasable nonvolatile semiconductor storage devices, EEPROMs (Electrically Erasable and Programmable Read Only Memories) have been widely used. The storage devices typified by currently and widely used flash memories have conductive floating gate electrodes surrounded by an oxide film, or trapping insulation films under gate electrodes of MISFETs. The storage devices use charge accumulation states at the floating gates or the trapping insulation film as stored information, and read out the information as a threshold value of each transistor. Incidentally, the trapping insulation film denotes an insulation film capable of accumulating electric charges. As one example thereof, mention may be made of a silicon nitride film. Implantation/discharge of electric charges into such charge accumulation regions causes each MISFET to be shifted in threshold value and to operate as a storage element. The flash memories include a split gate type cell using a MONOS (Metal-Oxide-Nitride-Oxide-Semiconductor) film. Such a memory has the following advantages: use of a silicon nitride film as a charge accumulation region leads to an excellent data holding reliability because electric charges are accumulated discretely as compared with a conductive floating gate, and the excellent data holding reliability can reduce the film thickness of the oxide films over and under the silicon nitride film, which enables a lower voltage for write/erase operation; and other advantages.

Japanese Unexamined Patent Application Publication No. 2014-127527 (Patent Document 1) describes the technology regarding a semiconductor device including a nonvolatile memory and a high-voltage MOSFET.

CITED DOCUMENT

Patent Document

[Patent Document 1] Japanese Unexamined Patent Application Publication No. 2014-127527

SUMMARY

A semiconductor device having a nonvolatile memory and a MISFET is expected to be improved in reliability. Alternatively, the semiconductor device is expected to be improved in manufacturing yield. Still alternatively, the semiconductor device is expected to be improved in reliability, and to be improved in manufacturing yield.

Other objects and novel features will be apparent from the description of this specification and the accompanying drawings.

In accordance with one embodiment, in a method for manufacturing a semiconductor device having a memory cell of a nonvolatile memory, a first MISFET, and a second MISFET, the first and second gate electrodes for the memory cell, a third gate electrode for the first MISFET, and a dummy gate electrode are formed. Then, a part of the third gate electrode is etched to be reduced in height. The gate length of the third gate electrode is larger than the gate length of the first gate electrode. Subsequently, an insulation film is formed in such a manner as to cover the first, second, and third gate electrodes and the dummy gate electrode. Then, the insulation film is polished, thereby to expose the first, second, and third gate electrodes and the dummy gate electrode. Thereafter, the dummy gate electrode is removed. Then, a fourth gate electrode for the second MISFET is formed in a trench of a region from which the dummy gate electrode has been removed.

In accordance with one embodiment, it is possible to improve the reliability of a semiconductor device.

Alternatively, it is possible to improve the manufacturing yield of the semiconductor device.

Still alternatively, it is possible to improve the reliability of the semiconductor device, and to improve the manufacturing yield of the semiconductor device.

BRIEF DESCRIPTION OF THE DRAWINGS

FIG. 56 is a table showing one example of the application conditions of voltages to respective sites of a selection memory cell at the times of "write", "erase", and "read";

DETAILED DESCRIPTION

Figure 1:
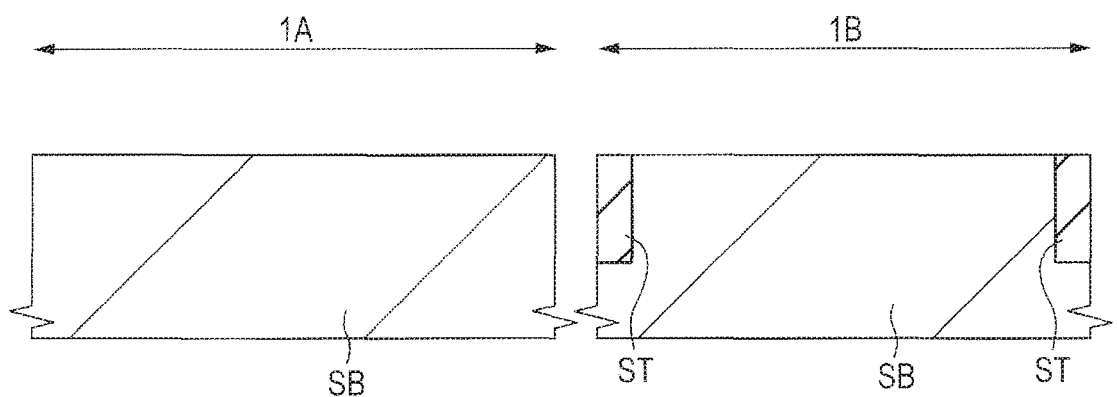
FIG. 1 is an essential part cross sectional view of a semiconductor device during a manufacturing step of one embodiment.

In description of the following embodiment, the embodiment may be described in a plurality of divided sections or embodiments for convenience, if required. However, unless otherwise specified, these are not independent of each other, but are in a relation such that one is a modified example, details, a complementary explanation, or the like of a part or the whole of the other. Further, in the following embodiments, when a reference is made to the number of elements, and the like (including number, numerical value, quantity, range, or the like), the number of elements, or the like is not limited to the specific number, but may be greater than or less than the specific number, unless otherwise specified, except for the case where the number is apparently limited to the specific number in principle, or except for other cases. Further, in the following embodiments, it is needless to say that the constitutional elements (including element steps, or the like) are not always essential, unless otherwise specified, and except for the case where they are apparently considered essential in principle, or except for other cases. Similarly, in the following embodiments, when a reference is made to the shapes, positional relationships, or the like of the constitutional elements, or the like, it is understood that they include ones substantially analogous or similar to the shapes or the like, unless otherwise specified, and unless otherwise considered apparently in principle, or except for other cases. This also applies to the foregoing numerical values and ranges.

Below, the embodiments will be described in details by reference to the accompanying drawings. Incidentally, in all the drawings for describing the embodiments, the members having the same function are given the same reference signs and numerals, and a repeated description thereon is omitted. Further, in the following embodiments, a description on the same or similar part will not be repeated in principle unless otherwise required.

Further, in drawings for use in the embodiments, hatching may be omitted even in cross section for ease of understanding of the drawing. Whereas, hatching may be added even in plan view for ease of understanding of the drawing.

Embodiment

<Regarding manufacturing steps of a semiconductor device>

A semiconductor device of the present embodiment is a semiconductor device including a nonvolatile memory (nonvolatile storage element, flash memory, or nonvolatile semiconductor storage device). In the present embodiment, a nonvolatile memory will be described with reference to a memory cell based on an n channel type MISFET (MISFET: Metal Insulator Semiconductor Field Effect Transistor). Further, the polarities (the polarities of the applied voltages at the times of write, erase, and read, and the polarities of carriers) in the present embodiment are for describing the operation in the case of a memory cell based on an n channel type MISFET. When a memory cell is based on a p channel type MISFET, by inverting all the polarities of applied potentials, the conductivity type of carriers, and the like, it is possible to obtain the same operation in principle.

A method for manufacturing a semiconductor device of the present embodiment will be described by reference to the accompanying drawings.

Figure 54:
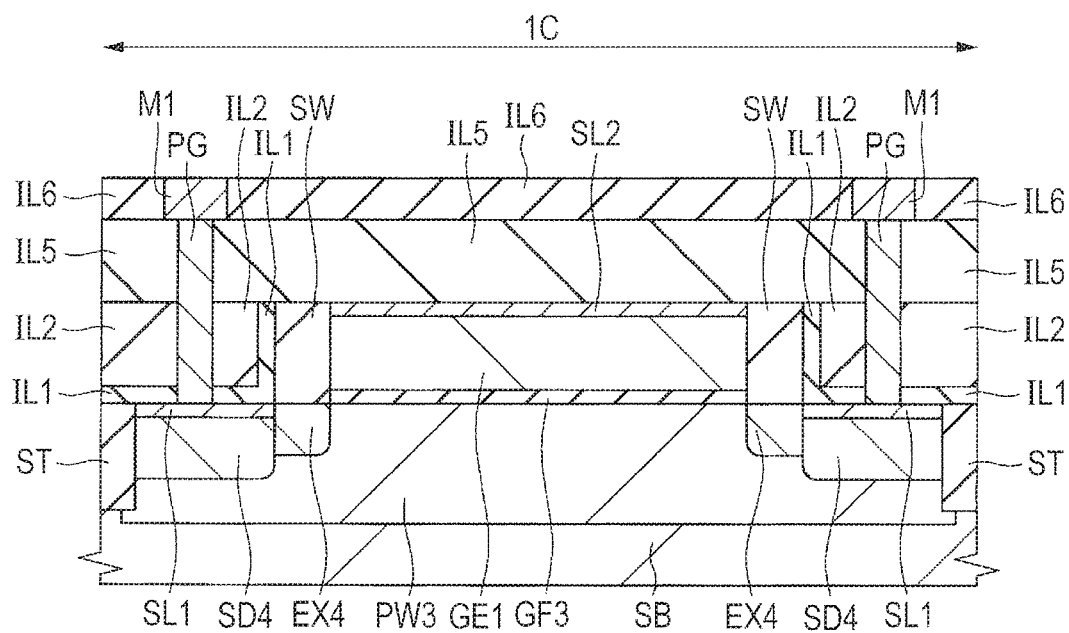
FIG. 54 is an essential part cross sectional view of the same semiconductor device as that of FIG. 53 during a manufacturing step.

FIGS. 1 to 54 are each an essential part cross sectional view of the semiconductor device of the present embodiment during a manufacturing step. Each cross sectional view of FIGS. 1 to 54 shows the manner in which a memory cell of a nonvolatile memory is formed in a memory cell region 1A, a low breakdown voltage MISFET is formed in a low breakdown voltage MIS region 1B, and a high breakdown voltage MISFET is formed in a high breakdown voltage MIS region 1C.

Herein, the memory cell region 1A is a region where a memory cell of a nonvolatile memory is formed in the main surface of a semiconductor substrate SB. Whereas, the low breakdown voltage MIS region 1B is a region where a low breakdown voltage MISFET forming a peripheral circuit is formed in the main surface of the semiconductor substrate SB. Further, the high breakdown voltage MIS region 1C is a region where a high breakdown voltage MISFET forming a peripheral circuit is formed in the main surface of the semiconductor substrate SB. The memory cell region 1A, the low breakdown voltage MIS region 1B, and the high breakdown voltage MIS region 1C correspond to mutually different planar regions in the main surface of the same semiconductor substrate SB. Whereas, the peripheral circuits are circuits other than a nonvolatile memory, and are, for example, a processor such as a CPU, a control circuit, a sense amplifier, a column decoder, a row decoder, and an input/output circuit. Further, the breakdown voltage of the high breakdown voltage MISFET to be formed in the high breakdown voltage MIS region 1C is higher than the breakdown voltage of the low breakdown voltage MISFET to be formed in the low breakdown voltage MIS region 1B. Still further, the operating voltage of the high breakdown voltage MISFET to be formed in the high breakdown voltage MIS region 1C is higher than the operating voltage of the low breakdown voltage MISFET to be formed in the low breakdown voltage MIS region 1B.

Further, in the present embodiment, the MISFET formed in each of the memory cell region 1A, the low breakdown voltage MIS region 1B, and the high breakdown voltage MIS region 1C is of an n channel type. However, the conductivity type may be inverted to a p channel type.

Figure 2:
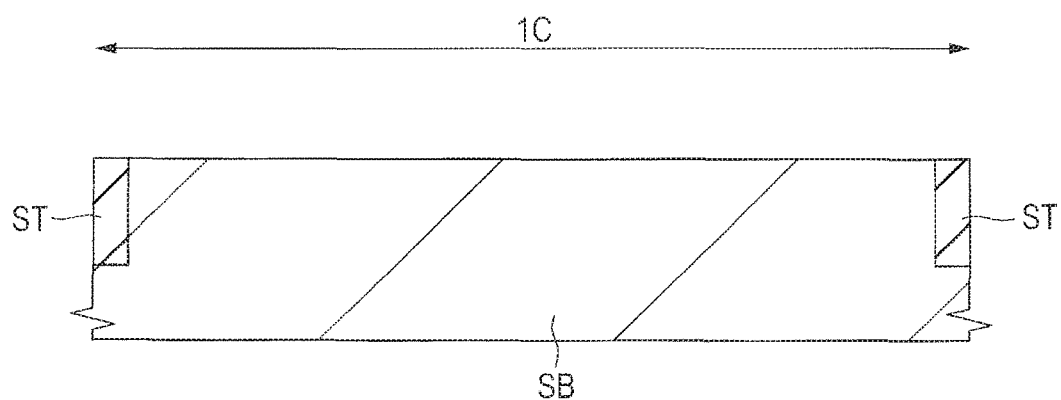
FIG. 2 is an essential part cross sectional view of the same semiconductor device as that of FIG. 1 during a manufacturing step.

For manufacturing a semiconductor device, as shown in FIGS. 1 and 2, first, a semiconductor substrate (semiconductor wafer) SB formed of a p type single crystal silicon having, for example, a specific resistance of about 1 to 10

Ωcm is prepared (provided). Then, in the main surface of the semiconductor substrate SB, an element isolation region ST for defining (partitioning) an active region is formed. The element isolation region ST is formed of an insulator such as silicon oxide, and can be formed by, for example, a ST1 (Shallow Trench Isolation) method.

Figure 3:
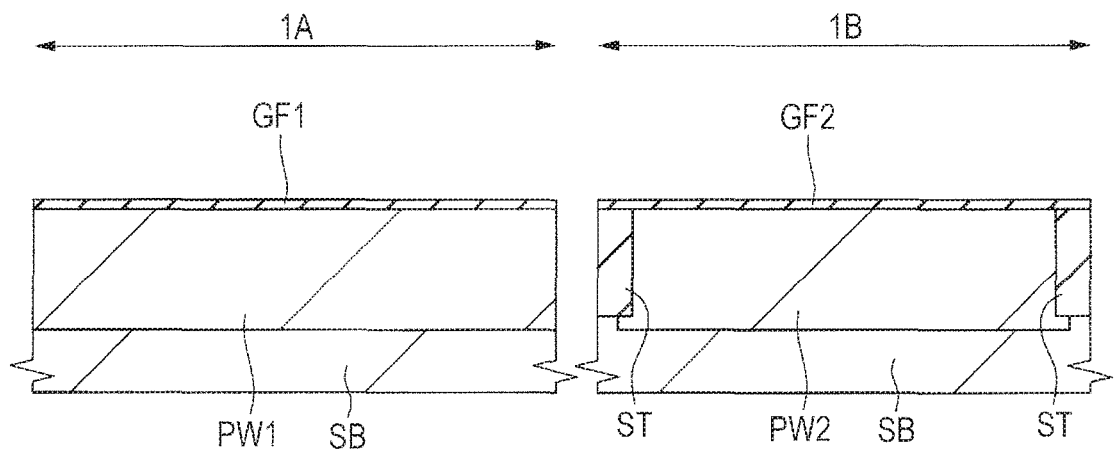
FIG. 3 is an essential part cross sectional view of the semiconductor device during a manufacturing step following FIG. 1.
Figure 4:
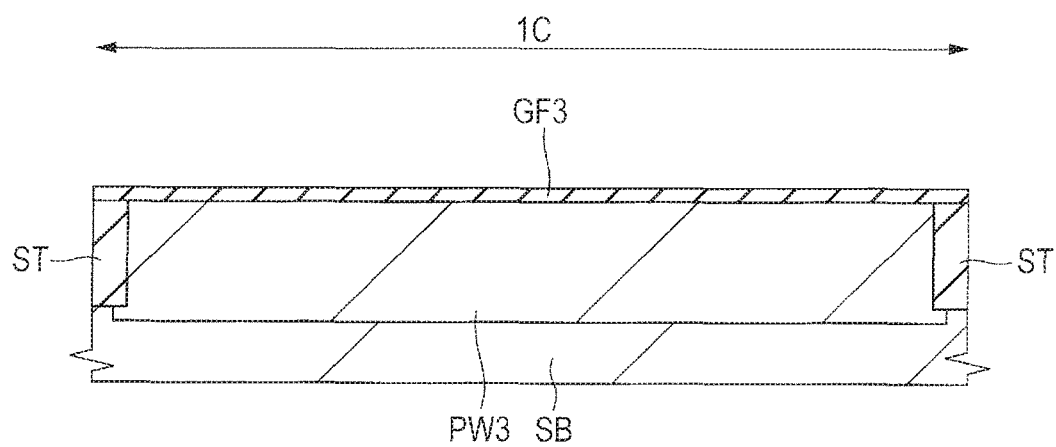
FIG. 4 is an essential part cross sectional view of the same semiconductor device as that of FIG. 3 during a manufacturing step.

Then, as shown in FIGS. 3 and 4, a p type well PW1 is formed in the semiconductor substrate SB in the memory cell region 1A; a p type well PW2, in the semiconductor substrate SB in the low breakdown voltage MIS region 1B; and a p type well PW3, in the semiconductor substrate SB in the high breakdown voltage MIS region 1C. The p type wells PW1, PW2, and PW3 can be formed by ion implanting a p type impurity such as boron (B) into the semiconductor substrate SB, or by other methods, and are formed to a prescribed depth from the main surface of the semiconductor substrate SB. The p type well PW1, the p type well PW2, and the p type well PW3 are of the same conductivity type, and hence may be formed by the same ion implantation step, or may be formed by different ion implantation steps. After the formation of the p type wells PW1, PW2, and PW3, if required, channel dope ion implantation may be performed onto respective surface layer parts of the p type wells PW1, PW2, and PW3.

Then, insulation films GF1, GF2, and GF3 are formed. The insulation film GF1 is formed at the surface of the semiconductor substrate SB in the memory cell region 1A, the insulation film GF2 is formed at the surface of the semiconductor substrate SB in the low breakdown voltage MIS region 1B, and the insulation film GF3 is formed at the surface of the semiconductor substrate SB in the high breakdown voltage MIS region 1C.

The insulation films GF1, GF2, and GF3 are each formed of, for example, a silicon oxide film. The thickness of the insulation film GF3 in the high breakdown voltage MIS region 1C can be set larger than the thickness of the insulation film GF1 in the memory cell region 1A, or the thickness of the insulation film GF2 in the low breakdown voltage MIS region 1B, and at, for example, about 3 to 20 nm. Further, the thickness of the insulation film GF1 in the memory cell region 1A and the thickness of the insulation film GF2 in the low breakdown voltage MIS region 1B are almost equal to each other, and can be set at, for example, about 1 to 5 nm.

The formation step of the insulation films GF1, GF2, and GF3 can be performed, for example, in the following manner. Namely, first, the surface of the semiconductor substrate SB is cleaned by diluted hydrofluoric acid washing, or the like. Then, at the surface of the semiconductor substrate SB, a silicon oxide film for the insulation film GF3 is formed using a thermal oxidation method or the like. Then, using a photolithography technology and an etching technology, the silicon oxide film for the insulation film GF3 in the memory cell region 1A and the low breakdown voltage MIS region 1B is removed, and the silicon oxide film for the insulation film GF3 is left in the high breakdown voltage MIS region 1C. Then, the silicon oxide film both for the insulation film GF1 and for the insulation film GF2 is formed at the surface of the semiconductor substrate SB in the memory cell region 1A and the low breakdown voltage MIS region 1B using a thermal oxidation method. This results in a structure in which the insulation film GF1 is formed at the surface of the semiconductor substrate SB in the memory cell region 1A, the insulation film GF2 is formed at the surface of the semiconductor substrate SB in the low breakdown voltage MIS region 1B, and the insulation film GF3 is formed at the surface of the semiconductor substrate SB in the high breakdown voltage MIS region 1C. Incidentally, FIGS. 3 and 4 each show the case where the insulation films GF2 and GF3 are formed over the element isolation region ST. However, when the insulation films GF1, GF2, and GF3 are formed using a thermal oxidation method, the insulation films GF1, GF2, and GF3 are not formed over the element isolation region ST.

Figure 5:
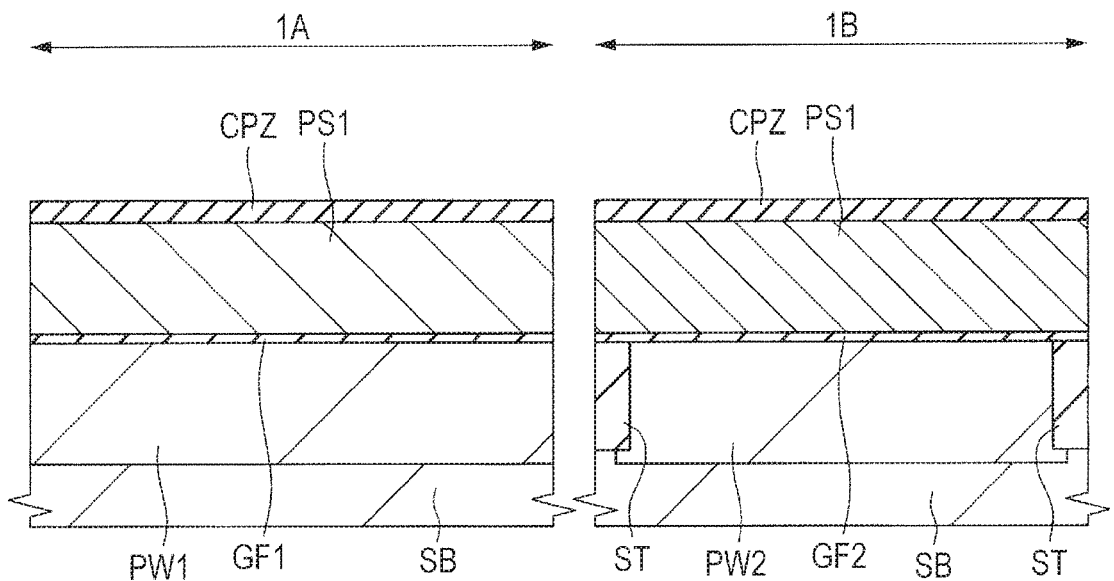
FIG. 5 is an essential part cross sectional view of the semiconductor device during a manufacturing step following FIG. 3.
Figure 6:
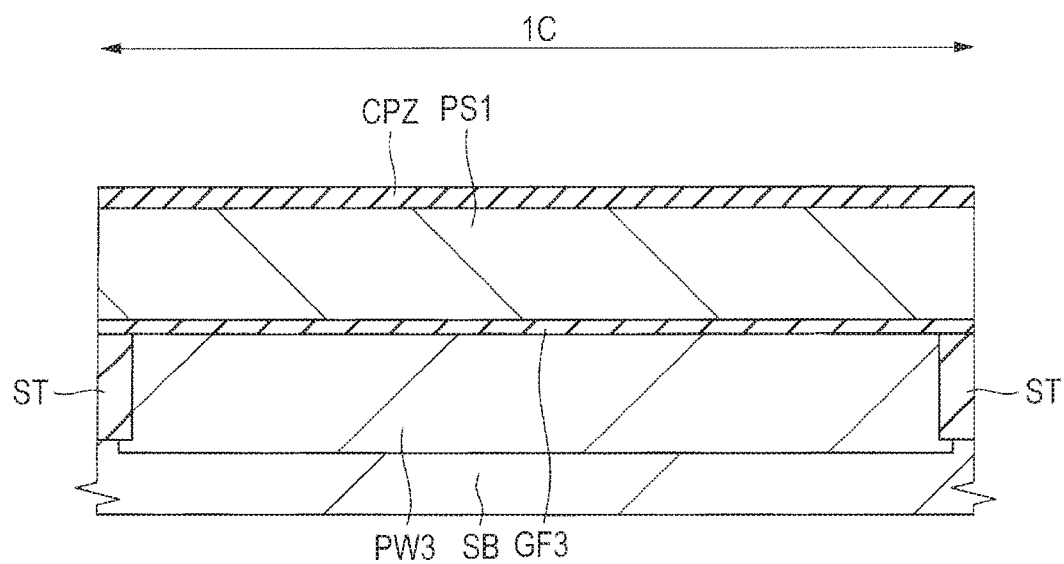
FIG. 6 is an essential part cross sectional view of the same semiconductor device as that of FIG. 5 during a manufacturing step.

Then, as shown in FIGS. 5 and 6, entirely over the main surface of the semiconductor substrate SB, namely, over the insulation films GF1, GF2, and GF3, a silicon film PS1 is formed as a conductive film for forming a control gate electrode CG.

The silicon film PS1 is a conductive film for the gate electrode of a control transistor, and also serves as a conductive film for forming a dummy gate electrode DG described later and the gate electrode GE1. Namely, the silicon film PS1 forms the control gate electrode CG described later, the dummy gate electrode DG described later, and the gate electrode GE1 described later.

The silicon film PS1 is formed of a polycrystalline silicon film (polysilicon film), and can be formed using a CVD (Chemical Vapor Deposition) method, or the like. The film thickness (deposited film thickness) of the silicon film PS1 can be set at, for example, about 50 to 250 nm. The following procedure is also acceptable: for deposition, the silicon film PS1 is formed as an amorphous silicon film; then, the subsequent heat treatment changes the silicon film PS1 formed of an amorphous silicon film into the silicon film PS1 formed of a polycrystalline silicon film. The silicon film PS1 can be formed as a doped polysilicon film with a low resistivity by being doped with an n type impurity by ion implantation after deposition, or by being doped with an n type impurity during deposition by a depositing gas. The silicon film PS1 in the memory cell region 1A is doped with an n type impurity. However, the silicon film PS1 in the low breakdown voltage MIS region 1B and the high breakdown voltage MIS region 1C may be a nondoped silicon film.

Then, as shown in FIGS. 5 and 6, an insulation film CPZ is formed over the silicon film PS1. The insulation film CPZ is formed of, for example, a silicon nitride film, and can be formed using a CVD method, or the like.

Figure 7:
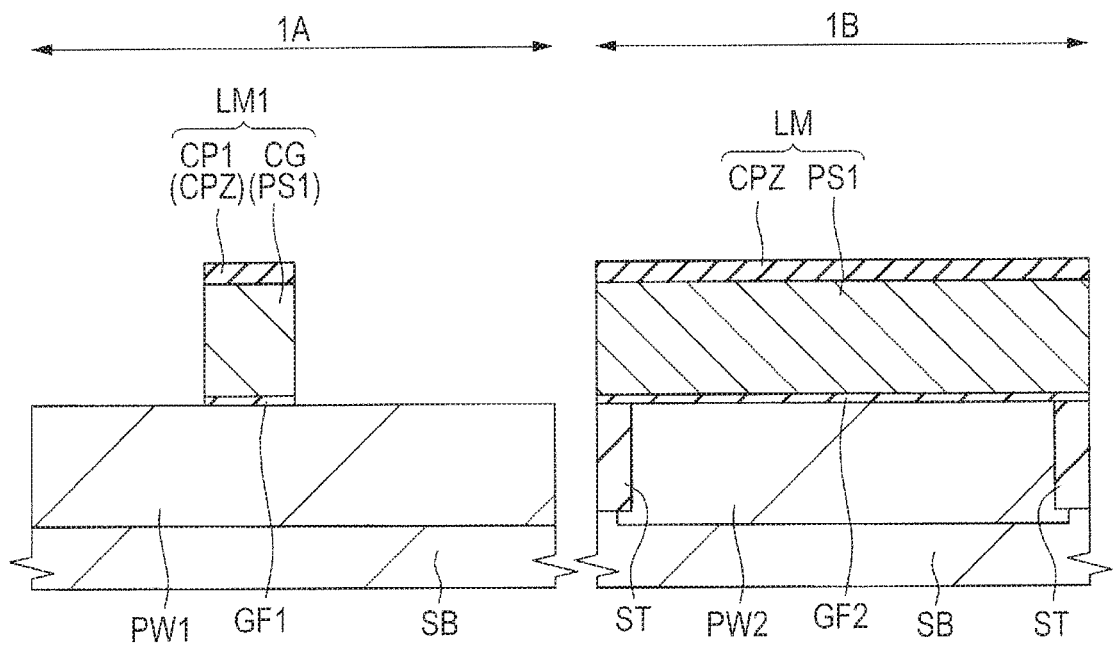
FIG. 7 is an essential part cross sectional view of the semiconductor device during a manufacturing step following FIG. 5.
Figure 8:
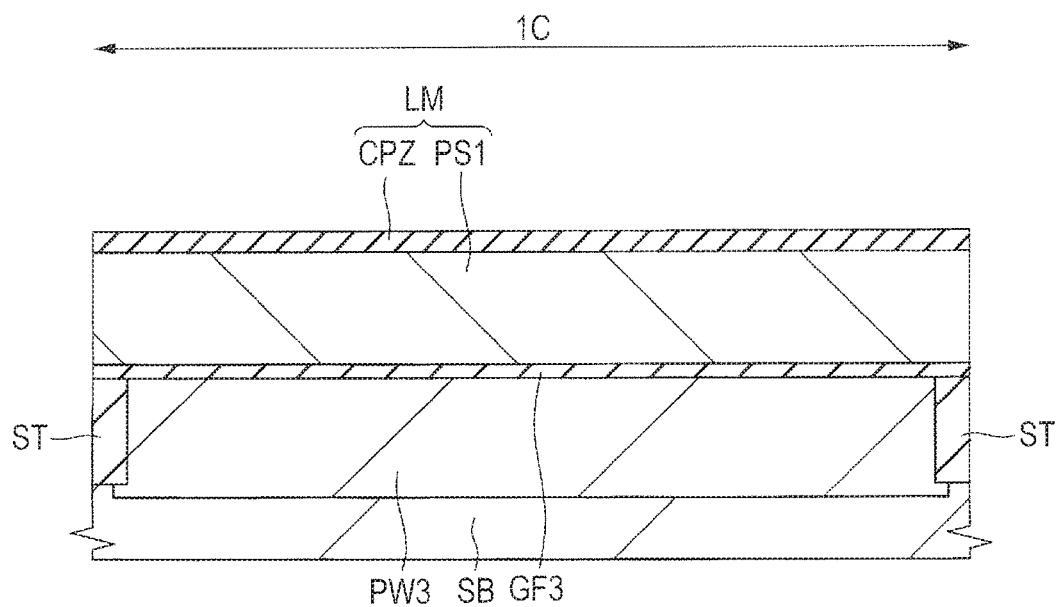
FIG. 8 is an essential part cross sectional view of the same semiconductor device as that of FIG. 7 during a manufacturing step.

Then, as shown in FIGS. 7 and 8, a lamination film of the silicon film PS1 and the insulation film CPZ is patterned using a photolithography technology and an etching technology. This results in the formation of a lamination body LM1 of the control gate electrode CG formed of the patterned silicon film PS1 and a cap insulation film CP1 formed of the patterned insulation film CPZ in the memory cell region 1A. At this step, in the low breakdown voltage MIS region 1B and the high breakdown voltage MIS region 1C, the lamination film of the silicon film PS1 and the insulation film CPZ is left as it is without being patterned. The lamination film of the silicon film PS1 and the insulation film CPZ left in the low breakdown voltage MIS region 1B and the high breakdown voltage MIS region 1C is assumed to be referred to as a lamination film LM.

In the memory cell region 1A, the insulation film GF1 left under the lamination body LM1 becomes the gate insulation film of the control transistor. Therefore, in the memory cell region 1A, the control gate electrode CG is formed over the semiconductor substrate SB (p type well PW1) via the insulation film GF1 as the gate insulation film, and the cap insulation film CP1 in almost the same planar configuration as that of the control gate electrode CG is formed over the control gate electrode CG. In the memory cell region 1A, other portions of the insulation film GF1 than the portion thereof covered with the control gate electrode CG can be removed by dry etching to be performed in the patterning step, or performing wet etching after the dry etching.

Then, if required, the surface layer part of the p type well PW1 in the memory cell region 1A is subjected to channel dope ion implantation.

Figure 9:
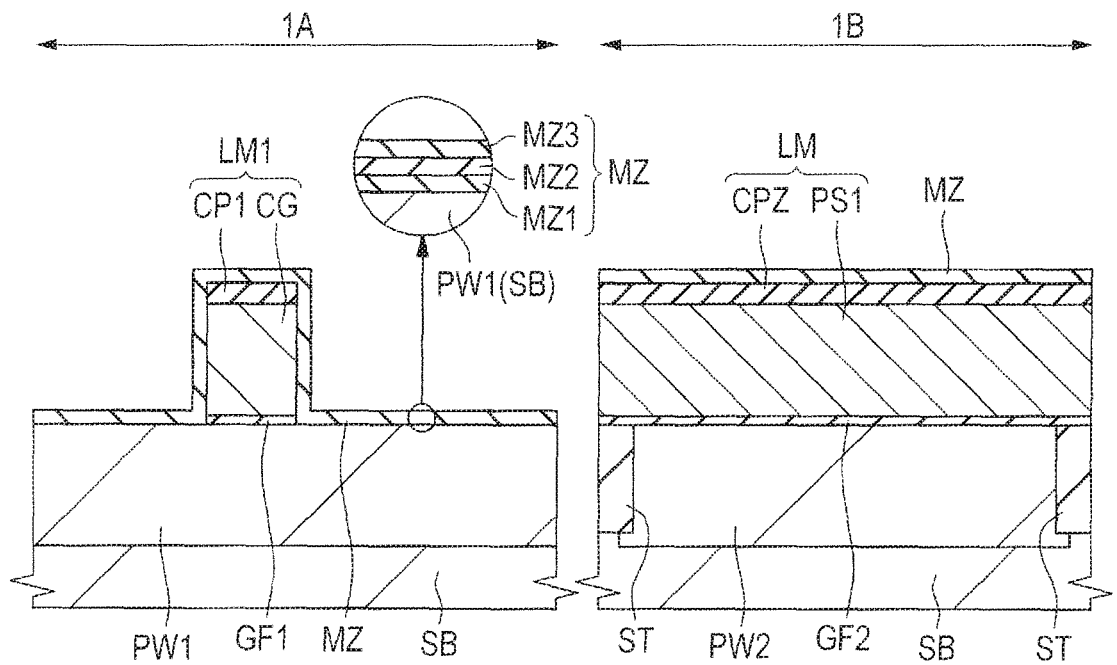
FIG. 9 is an essential part cross sectional view of the semiconductor device during a manufacturing step following FIG. 7.
Figure 10:
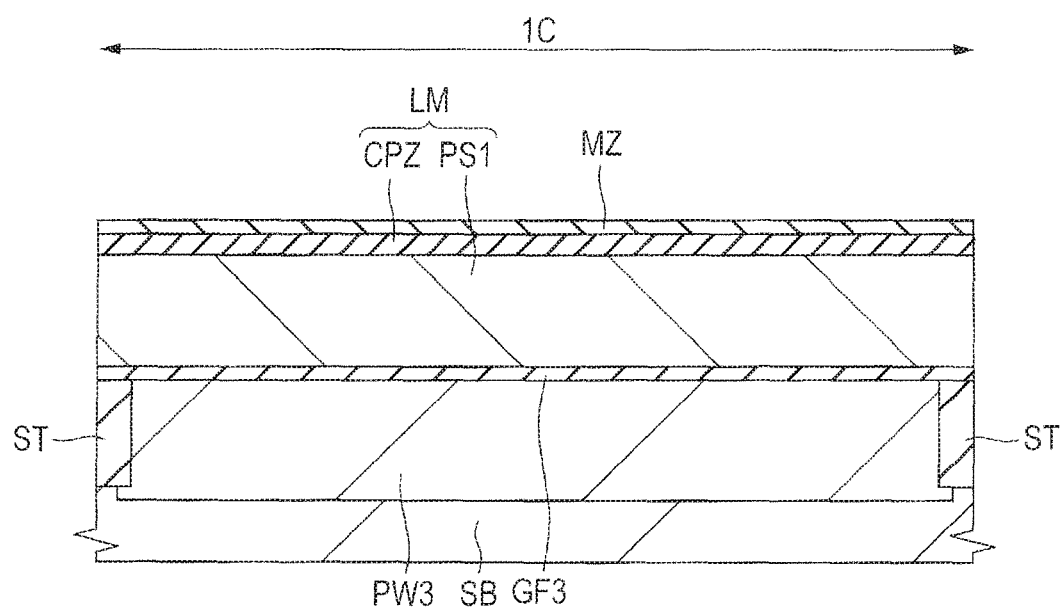
FIG. 10 is an essential part cross sectional view of the same semiconductor device as that of FIG. 9 during a manufacturing step.

Then, a washing treatment is performed, thereby to subject the main surface of the semiconductor substrate SB to a purification treatment. Then, as shown in FIGS. 9 and 10, entirely over the main surface of the semiconductor substrate SB, namely, over the surface of the semiconductor substrate SB, and over the top surface and the side surface of the lamination body LM1, an insulation film MZ for the gate insulation film of a memory transistor is formed. At this step, the insulation film MZ can also be formed over the top surface and the side surface of the lamination film LM. For this reason, the insulation film MZ is formed over the semiconductor substrate SB in such a manner as to cover the lamination body LM1 and the lamination film LM.

The insulation film MZ is an insulation film for the gate insulation film of a memory transistor, and is an insulation film having a charge accumulation part (charge accumulation layer) in the inside thereof. Incidentally, for ease of understanding of the drawings, in FIGS. 9 and 10, the insulation film MZ formed of the insulation film MZ1, the insulation film MZ2, and the insulation film MZ3 is simply shown as the insulation filmMZ. However, in actuality, as shown in the enlarged view of the region surrounded by a circle in FIG. 9, the insulation film MZ is formed of a lamination film of the insulation film MZ1, the insulation film MZ2 over the insulation film MZ1, and the insulation film MZ3 over the insulation film MZ2. Herein, the insulation film MZ1 is formed of a silicon oxide film (oxide film), the insulation film MZ2 is formed of a silicon nitride film (nitride film), and the insulation film MZ3 is formed of a silicon oxide film (oxide film).

For forming the insulation film MZ, for example, first, the insulation film MZ1 formed of a silicon oxide film is formed by a thermal oxidation method. Then, over the insulation film MZ1, the insulation film MZ2 formed of a silicon nitride film is deposited by a CVD method. Further, over the insulation film MZ2, the insulation film MZ3 formed of a silicon oxide film is formed by a CVD method or a thermal oxidation method, or both of the methods. In place of the silicon oxide film, a silicon oxynitride film can also be formed. The thickness of the insulation film MZ1 can be set at, for example, about 2 to 10 nm. The thickness of the insulation film MZ2 can be set at, for example, about 5 to 15 nm. The thickness of the insulation film MZ3 can be set at, for example, about 2 to 10 nm.

The insulation film MZ functions as the gate insulation film of the memory gate electrode MG to be formed later. Of the insulation film MZ, the insulation film MZ2 is an insulation film (a trapping insulation film) having a charge accumulation function. Namely, of the insulation film MZ, the insulation film MZ2 is an insulation film for accumulating electric charges, and can function as a charge accumulation part (charge accumulation layer). For this reason, the insulation film MZ can be regarded as an insulation film having a charge accumulation part (herein, the insulation film MZ2) in the inside thereof. Of the insulation film MZ, the insulation film MZ3 and the insulation film MZ1 situated over and under the insulation film MZ2 of a trapping insulation film can each function as a charge block layer for confining electric charges in the trapping insulation film. Respective bandgaps of the insulation film MZ1 and the insulation film MZ3 are larger than the bandgap of the insulation film MZ2 of a trapping insulation film.

Figure 11:
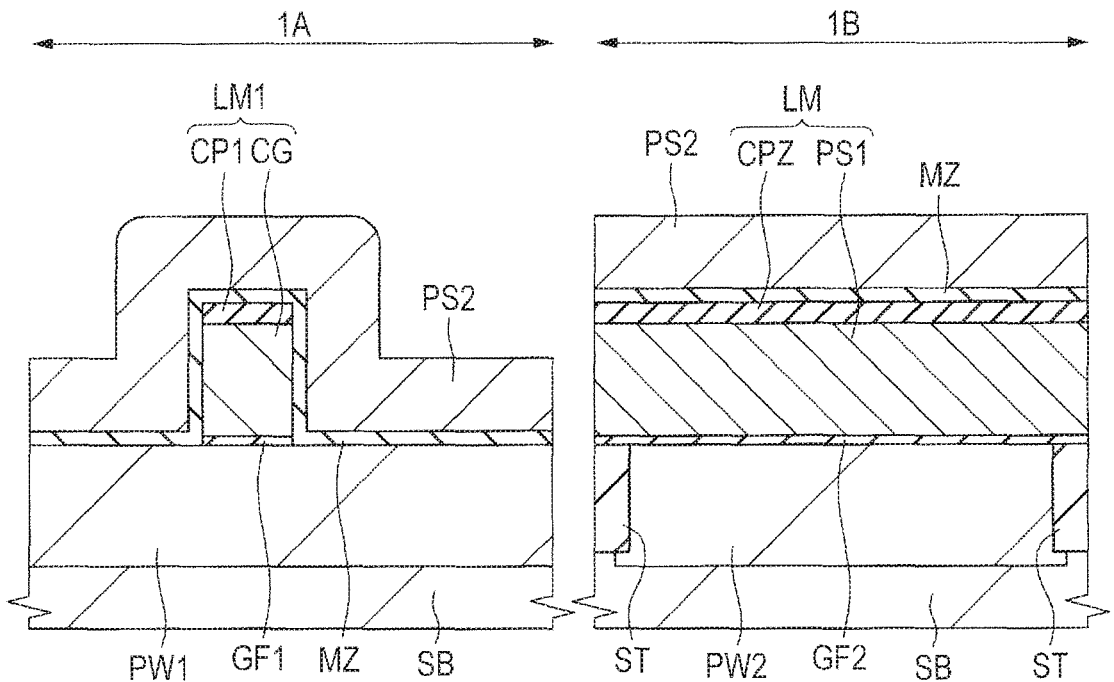
FIG. 11 is an essential part cross sectional view of the semiconductor device during a manufacturing step following FIG. 9.
Figure 12:
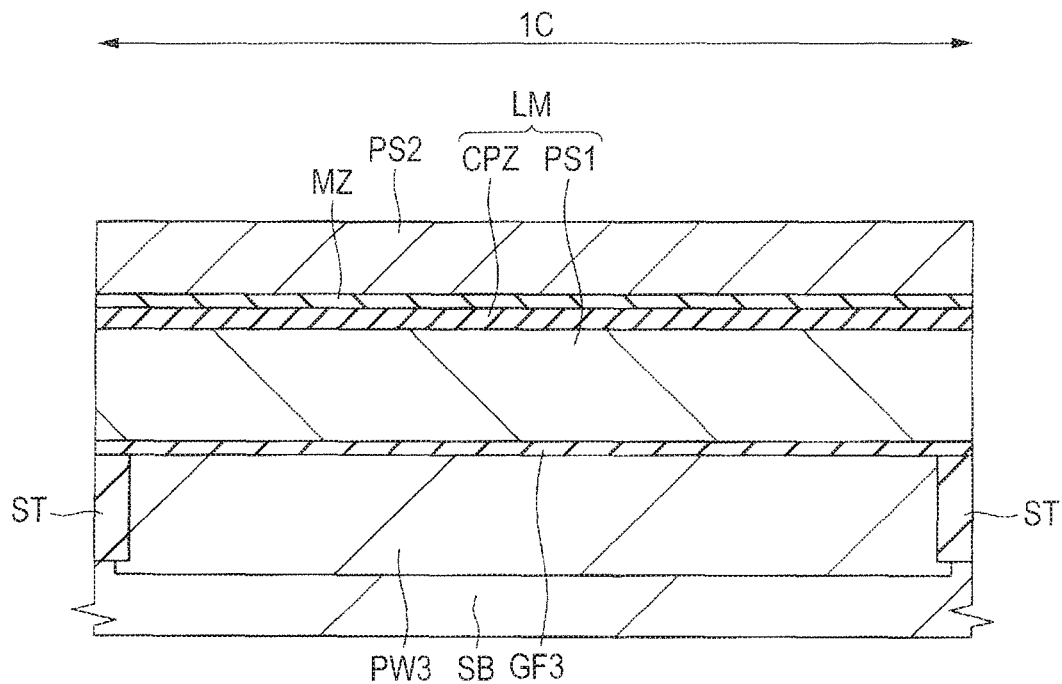
FIG. 12 is an essential part cross sectional view of the same semiconductor device as that of FIG. 11 during a manufacturing step.

Then, as shown in FIGS. 11 and 12, entirely over the main surface of the semiconductor substrate SB, namely, over the insulation film MZ, a silicon film PS2 as a conductive film for forming the memory gate electrode MG is formed in such a manner as to cover the lamination body LM1 in the memory cell region 1A, and to cover the lamination film LM in the low breakdown voltage MIS region 1B and the high breakdown voltage MIS region 1C.

The silicon film PS2 is formed of a polycrystalline silicon film, and can be formed using a CVD method, or the like. The deposited film thickness of the silicon film PS2 can be set at, for example, about 30 to 150 nm. The following procedure is also acceptable: for deposition, the silicon film PS2 is formed as an amorphous silicon film; then, the subsequent heat treatment changes the silicon film PS2 formed of an amorphous silicon film into the silicon film PS2 formed of a polycrystalline silicon film. The silicon film PS2 is doped with an n type impurity by ion implantation during deposition or after deposition to have a low resistivity.

Figure 13:
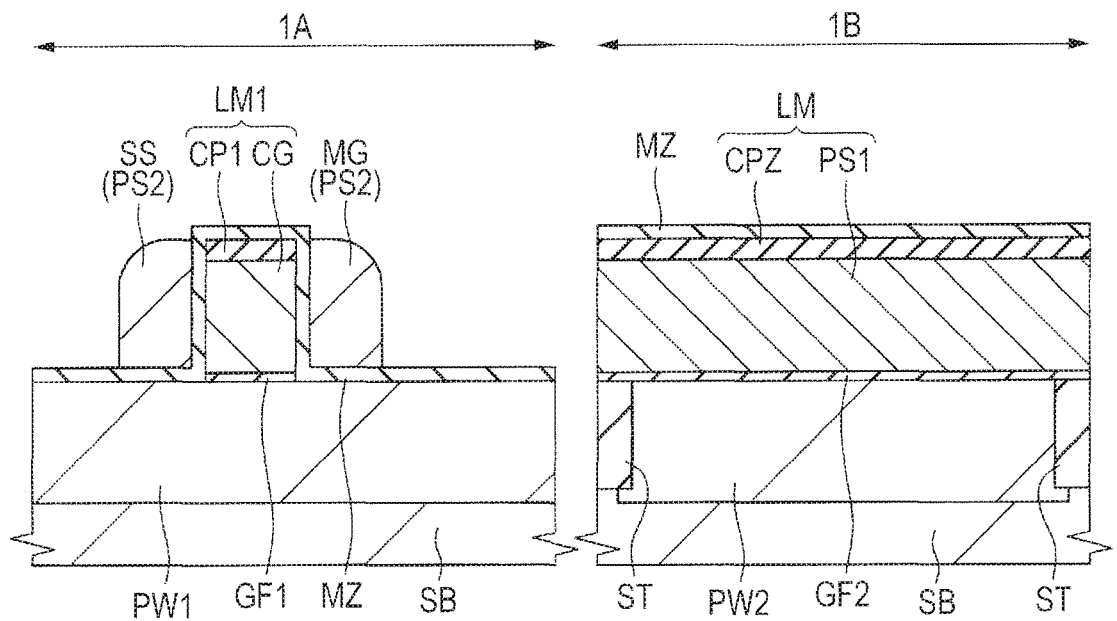
FIG. 13 is an essential part cross sectional view of the semiconductor device during a manufacturing step following FIG. 11.
Figure 14:
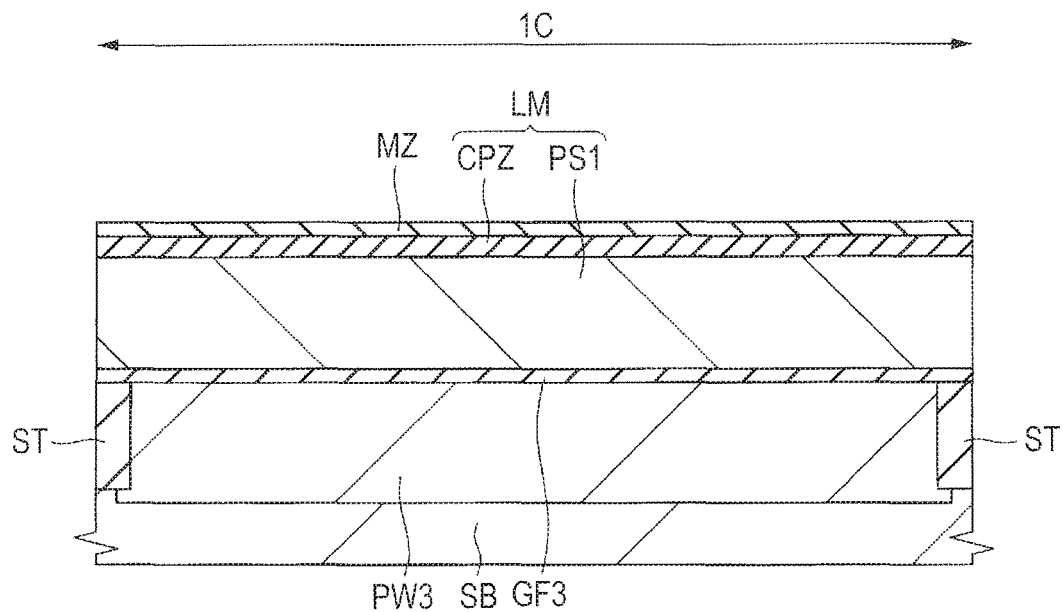
FIG. 14 is an essential part cross sectional view of the same semiconductor device as that of FIG. 13 during a manufacturing step.

Then, as shown in FIGS. 13 and 14, by an anisotropic etching technology, the silicon film PS2 is etched back (etched). In the etch back step of the silicon film PS2, the silicon film PS2 is anisotropically etched by the thickness as much as the deposited film thickness of the silicon film PS2. As a result, the silicon film PS2 is left in a sidewall spacer shape over the opposite side surfaces of the lamination body LM1 via the insulation film MZ, and the silicon film PS2 in other regions is removed. As a result, as shown in FIGS. 13 and 14, in the memory cell region 1A, the memory gate electrode MG is formed with the silicon film PS2 left in a sidewall spacer shape over one side surface of the lamination body LM1 via the insulation film MZ, and a silicon spacer SS is formed with the silicon film PS2 left in a sidewall shape over the other side surface of the lamination body LM1 via the insulation film MZ. The memory gate electrode MG is formed over the insulation film MZ via the insulation film MZ in such a manner as to be adjacent to the lamination body LM1 in the memory cell region 1A. The portions of the insulation film MZ in the regions not covered with the memory gate electrode MG and the silicon spacer SS are exposed.

Figure 15:
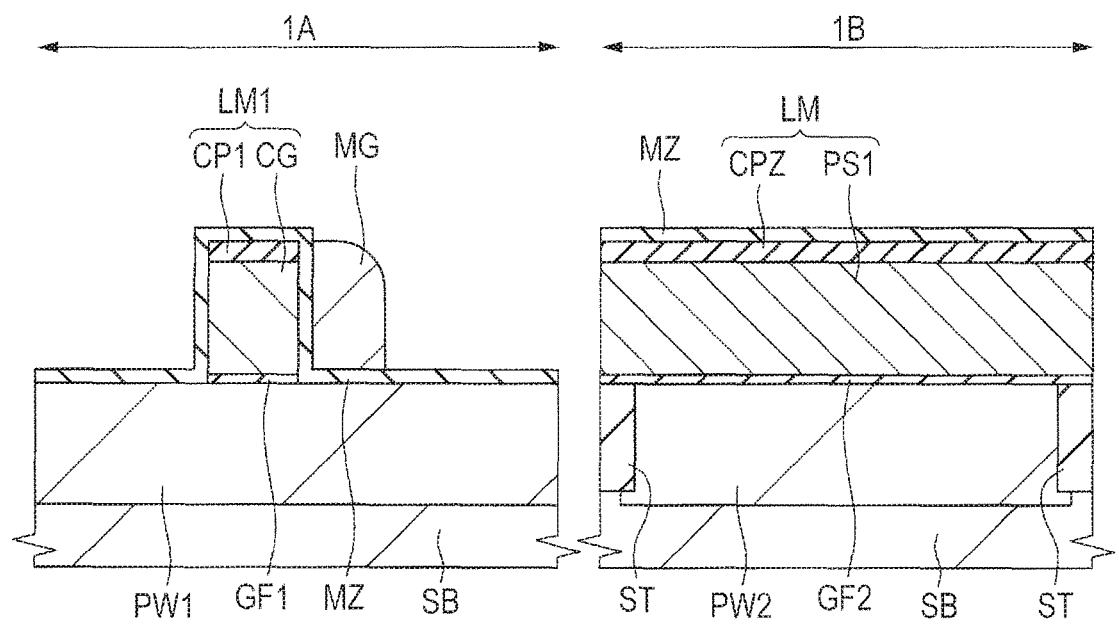
FIG. 15 is an essential part cross sectional view of the semiconductor device during a manufacturing step following FIG. 13.
Figure 16:
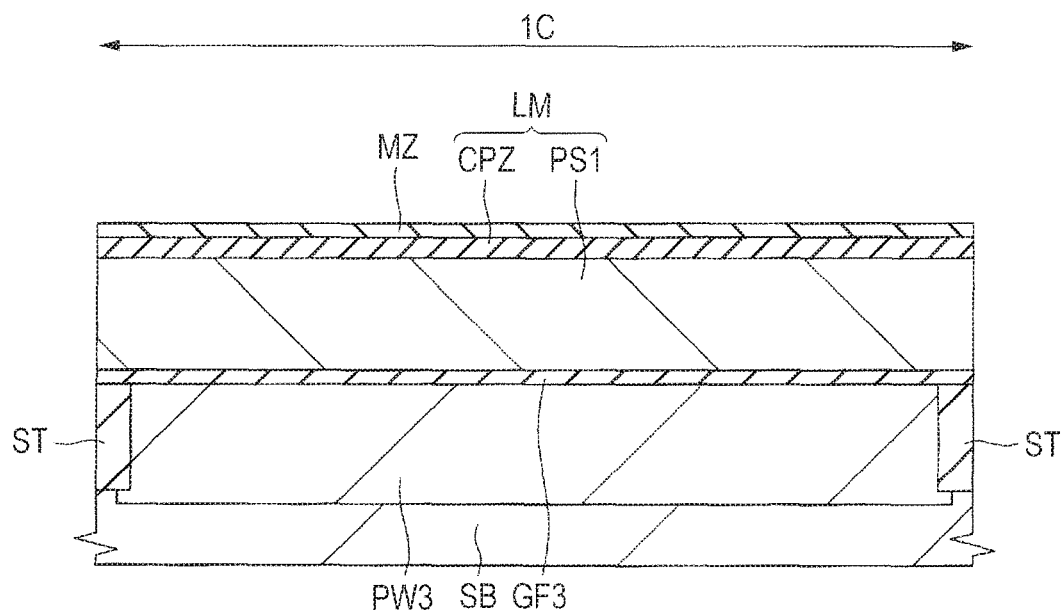
FIG. 16 is an essential part cross sectional view of the same semiconductor device as that of FIG. 15 during a manufacturing step.

Then, using a photolithography technology, such a photoresist pattern (not shown) as to cover the memory gate electrode MG, and to expose the silicon spacer SS is formed over the semiconductor substrate SB. Then, by dry etching using the photoresist pattern as an etching mask, the silicon spacer SS is removed. The memory gate electrode MG is left without being etched. Thereafter, the photoresist pattern is removed. FIGS. 15 and 16 each show this stage.

Figure 17:
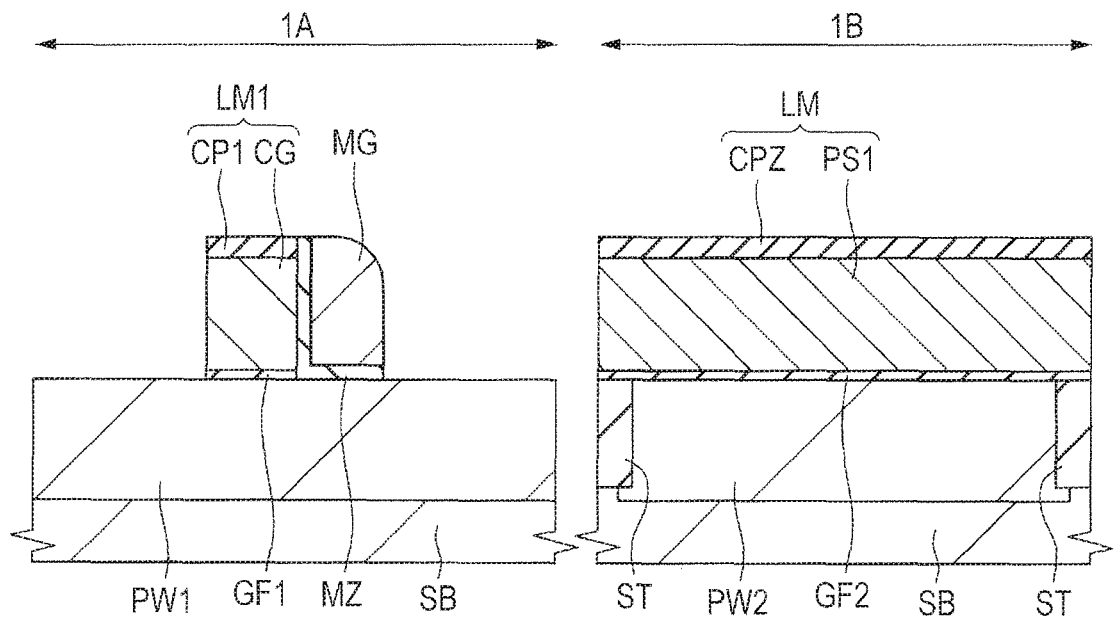
FIG. 17 is an essential part cross sectional view of the semiconductor device during a manufacturing step following FIG. 15.
Figure 18:
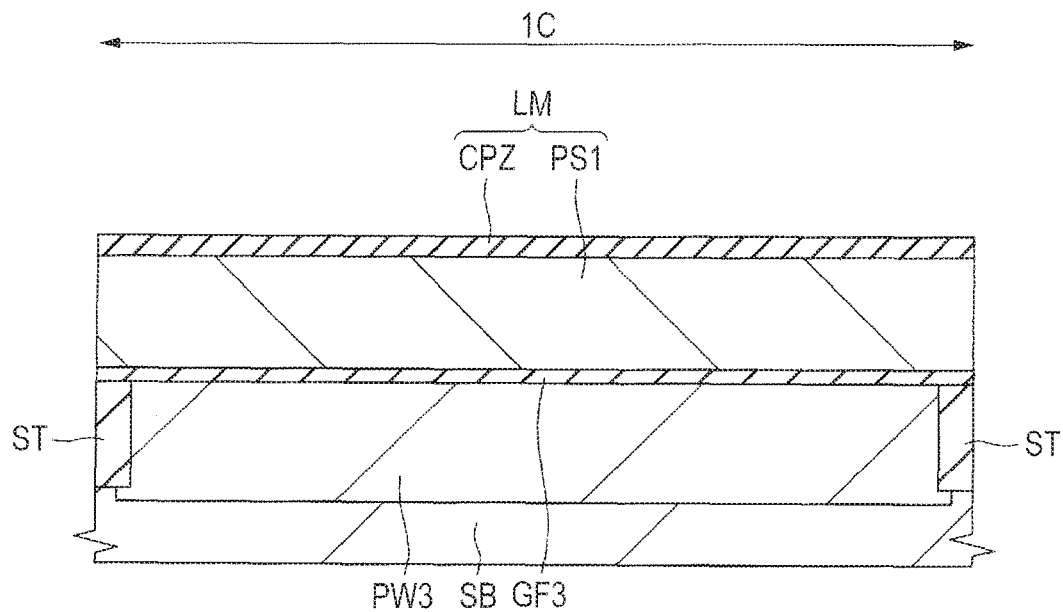
FIG. 18 is an essential part cross sectional view of the same semiconductor device as that of FIG. 17 during a manufacturing step.

Then, as shown in FIGS. 17 and 18, the portions of the insulation film MZ exposed without being covered with the memory gate electrode MG are removed by etching (e.g., wet etching). At this step, in the memory cell region 1A, the portion of the insulation film MZ situated under the memory gate electrode MG, and between the memory gate electrode MG and the lamination body LM1 is not removed, and is left, and the portions of the insulation film MZ in other regions are removed. As indicated also from FIG. 17, in the memory cell region 1A, the insulation film MZ extends continuously across both the regions of the region between the memory gate electrode MG and the semiconductor substrate SB (p type well PW1), and the region between the memory gate electrode MG and the lamination body LM1 (control gate electrode CG). Incidentally, although already described above, as shown in the enlarged view of the region surrounded by a circle in FIG. 9, the insulation film MZ includes a lamination film of the insulation film MZ1, the insulation film MZ2 over the insulation film MZ1, and the insulation film MZ3 over the insulation film MZ2.

In this manner, the memory gate electrode MG for a memory cell is formed over the semiconductor substrate SB (p type well PW1) via the insulation film MZ having a charge accumulation part in the inside thereof in such a manner as to be adjacent to the control gate electrode CG via the insulation film MZ.

Figure 19:
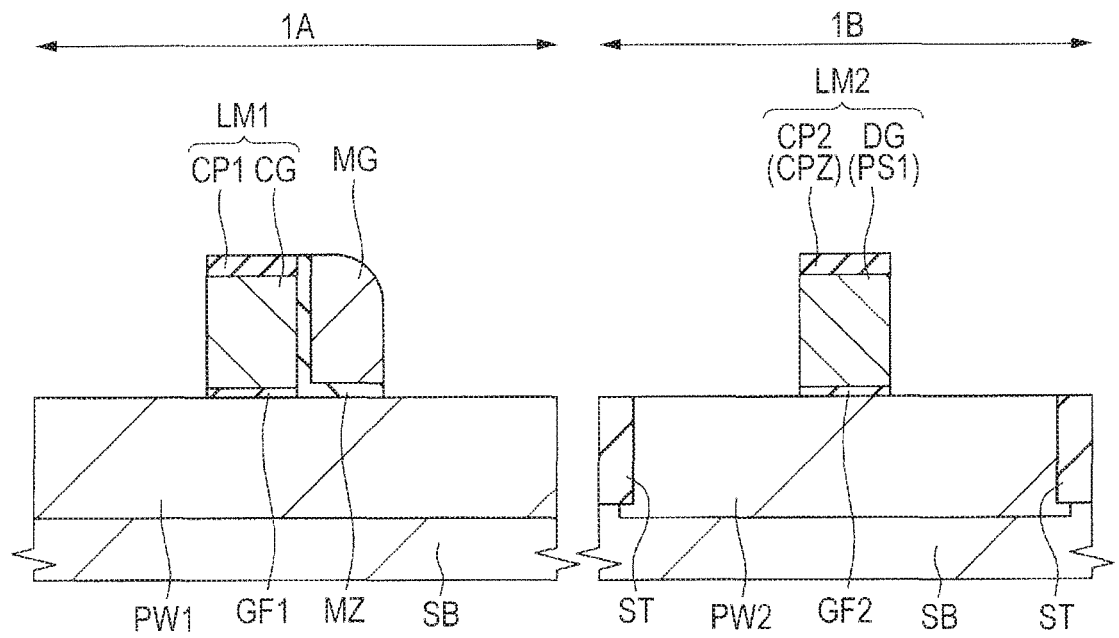
FIG. 19 is an essential part cross sectional view of the semiconductor device during a manufacturing step following FIG. 17.
Figure 20:
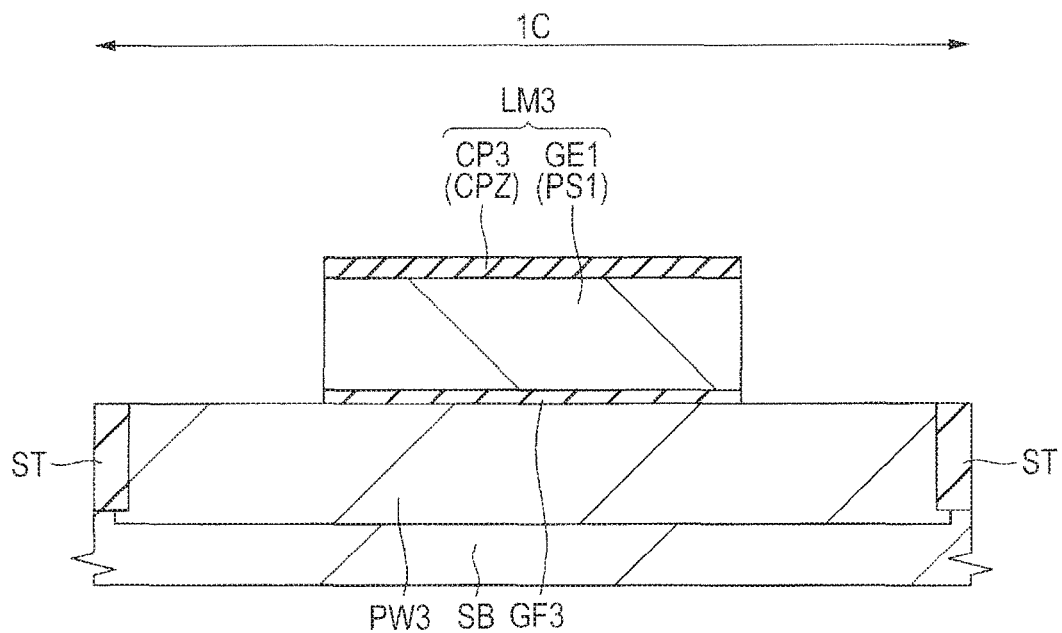
FIG. 20 is an essential part cross sectional view of the same semiconductor device as that of FIG. 19 during a manufacturing step.

Then, as shown in FIGS. 19 and 20, the lamination film LM is patterned using a photolithography technology and an etching technology. As a result, a lamination body LM2 formed of the patterned lamination film LM is formed in the low breakdown voltage MIS region 1B, and a lamination body LM3 formed of the patterned lamination film LM is formed in the high breakdown voltage MIS region 1C. During the patterning, the memory cell region 1A is covered with a photoresist pattern (not shown). For this reason, the memory gate electrode MG and the lamination body LM1 are not etched, and are left.

The lamination body LM2 includes the dummy gate electrode (pseudo gate electrode) DG, and the cap insulation film CP2 thereover. The lamination body LM3 includes the gate electrode GE1, and the cap insulation film CP3 thereover. The dummy gate electrode DG and the gate electrode GE1 each include the patterned silicon film PS1, and the cap insulation films CP2 and CP3 each include the patterned insulation film CPZ.

In the low breakdown voltage MIS region 1B, the insulation film GF2 is left under the lamination body LM2. In the high breakdown voltage MIS region 1C, the insulation film GF3 is left under the lamination body LM3. In the low breakdown voltage MIS region 1B and the high breakdown voltage MIS region 1C, the portions of the insulation films GF2 and GF3 except for the portions thereof covered with the dummy gate electrode DG and the gate electrode GE1 can be removed by performing dry etching performed in the patterning step, or wet etching after the dry etching. Therefore, in the low breakdown voltage MIS region 1B, the dummy gate electrode DG is formed over the semiconductor substrate SB (p type well PW2) via the insulation film GF2, and the cap insulation film CP2 in an almost the same planar configuration as that of the dummy gate electrode DG is formed over the dummy gate electrode DG. Whereas, in the high breakdown voltage MIS region 1C, the gate electrode GE1 is formed over the semiconductor substrate SB (p type well PW3) via the insulation film GF3, and the cap insulation film CP3 in an almost the same planar configuration as that of the gate electrode GE1 is formed over the gate electrode GE1.

The gate electrode GE1 is the gate electrode of the high breakdown voltage MISFET, and the gate length of the gate electrode GE1 is quite large. Specifically, the gate length of the gate electrode GE1 is larger than the gate length of the control gate electrode CG, and is, for example, 300 nm or more. The gate length of the memory gate electrode MG is often smaller than the gate length of the control gate electrode CG. For this reason, the gate length of the gate electrode GE1 is larger than the gate length of the memory gate electrode MG. Further, the gate length of the gate electrode GE1 for the high breakdown voltage MISFET is larger than that of a gate electrode GE2 for the low breakdown voltage MISFET described later. For this reason, the gate length of the gate electrode GE1 is larger than the gate length of the dummy gate electrode DG. Herein, the gate length of the dummy gate electrode DG corresponds to the dimension (gate length) of the dummy gate electrode DG as seen in the gate length direction of the gate electrode GE2 to be formed later. Whereas, the control gate electrode CG, the dummy gate electrode DG, and the gate electrode GE1 are formed of a common film (herein, the silicon film PS1). For this reason, respective thicknesses of the control gate electrode CG, the dummy gate electrode DG, and the gate electrode GE1 are equal to one another.

Figure 21:
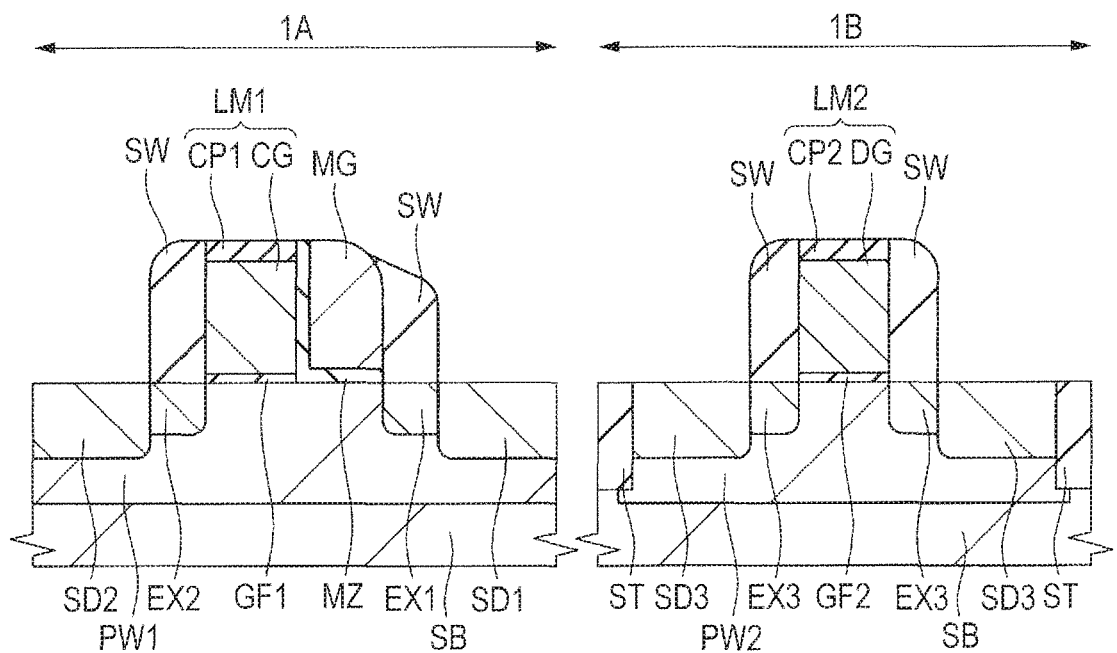
FIG. 21 is an essential part cross sectional view of the semiconductor device during a manufacturing step following FIG. 19.
Figure 22:
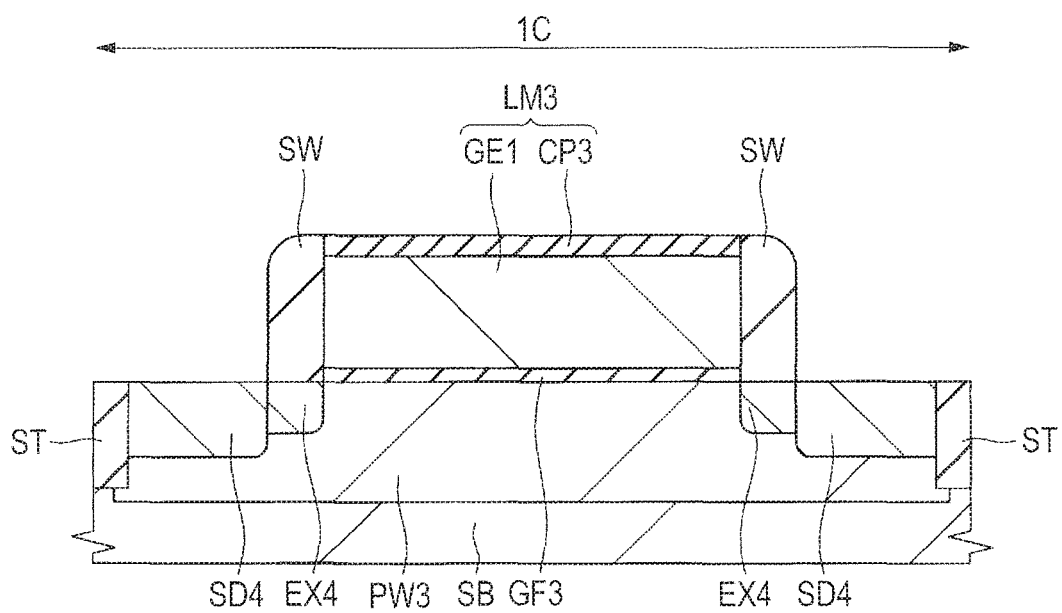
FIG. 22 is an essential part cross sectional view of the same semiconductor device as that of FIG. 21 during a manufacturing step.

Then, as shown in FIGS. 21 and 22, n type semiconductor regions (n type impurity diffusion layers, extension regions, or LDD regions) EX1, EX2, EX3, and EX4 are formed using an ion implantation method.

Specifically, an n type impurity such as arsenic (As) or phosphorus (P) is ion implanted into the semiconductor substrate SB (p type wells PW1, PW2, and PW3) using the memory gate electrode MG and the lamination bodies LM1, LM2, and LM3 as a mask (ion implantation inhibiting mask). As a result, the n⁻ type semiconductor regions EX1, EX2, EX3, and EX4 can be formed. At this step, in the memory cell region 1A, the n⁻ type semiconductor region EX1 is formed in self-alignment with the side surface of the memory gate electrode MG, and the n type semiconductor region EX2 is formed in self-alignment with the side surface of the lamination body LM1. Whereas, in the low breakdown voltage MIS region 1B, the n⁻ type semiconductor regions EX3 are formed in self-alignment with opposite side surfaces of the lamination body LM2. Further, in the high breakdown voltage MIS region 1C, the n⁻ type semiconductor regions EX4 are formed in self-alignment with the opposite side surfaces of the lamination body LM3.

Then, sidewall spacers (sidewall insulation films) SW formed of an insulation film (insulator) are formed over the side surfaces of the lamination body LM1 and the memory gate electrode MG, over the opposite side surfaces of the lamination body LM2, and over the opposite side surfaces of the lamination body LM3.

The sidewall spacer SW can be formed, for example, in the following manner. Namely, first, entirely over the main surface of the semiconductor substrate SB, an insulation film for forming the sidewall spacer SW is deposited in such a manner as to cover the memory gate electrode MG and the lamination bodies LM1, LM2, and LM3 using a CVD method, or the like. Then, the insulation film is anisotropically etched. As a result, the insulation film is selectively left over each side surface of the memory gate electrode MG and the lamination bodies LM1, LM2, and LM3, thereby to form the sidewall spacers SW. The sidewall spacers SW are formed over the side surface opposite to the side adjacent to the memory gate electrode MG via the insulation film MZ of the side surfaces of the lamination body, over the side surface opposite to the side thereof adjacent to the lamination body LM1 via the insulation film MZ of the side surfaces of the memory gate electrode MG, over the opposite side surfaces of the dummy gate electrode DG, and over the opposite side surfaces of the gate electrode GE1.

Then, the type semiconductor regions (n type impurity diffusion layers, or source/drain regions) SD1, SD2, SD3, and SD4 are formed using an ion implantation method.

Specifically, an n type impurity such as arsenic (As) or phosphorus (P) is ion implanted into the semiconductor substrate SB (p type wells PW1, PW2, and PW3) using the memory gate electrode MG, the lamination bodies LM1, LM2, and LM3, and the sidewall spacers SW over their respective side surfaces as a mask (ion implantation inhibiting mask). As a result, the n⁻ type semiconductor regions SD1, SD2, SD3, and SD4 can be formed.

At this step, in the memory cell region 1A, the n⁻ type semiconductor region SD1 is formed in self-alignment with the sidewall spacer SW over the side surface of the memory gate electrode MG, and the type semiconductor region SD2 is formed in self-alignment with the sidewall spacer SW over the side surface of the lamination body LM1. Further, in the low breakdown voltage MIS region 1B, the type semiconductor regions SD3 are formed in self-alignment with the sidewall spacers SW over the opposite side surfaces of the lamination body LM2. Whereas, in the high breakdown voltage MIS region 1C, the type semiconductor regions SD4 are formed in self-alignment with the sidewall spacers SW over the opposite side surfaces of the lamination body LM3. This results in the formation of a LDD (Lightly doped Drain) structure.

In this manner, as shown in FIGS. 21 and 22, the $n^-$ type semiconductor region EX1, and the type semiconductor region SD1 having a higher impurity density than that form an n type semiconductor region (corresponding to the semiconductor region MS of FIG. 55 described later) functioning as the source region of the memory transistor. Whereas, the $n^-$ type semiconductor region EX2, and the type semiconductor region SD2 having a higher impurity density than that form the n type semiconductor region (corresponding to the semiconductor region MD of FIG. 55 described later) functioning as the drain region of the control transistor. Further, the $n^-$ type semiconductor region EX3, and the type semiconductor region SD3 having a higher impurity density than that form an n type semiconductor region functioning as the source/drain region (the semiconductor region for source or drain) of the MISFET in the low breakdown voltage MIS region 1B. Further, the $n^-$ type semiconductor region EX4, and the type semiconductor region SD4 having a higher impurity density than that form an n type semiconductor region functioning as the source/drain region (the semiconductor region for source or drain) of the MISFET in the high breakdown voltage MIS region 1C.

Then, activating annealing is performed which is a heat treatment for activating the impurity doped into the semiconductor regions for source and drain (the $n^-$ type semiconductor regions EX1, EX2, EX3, and EX4, and the type semiconductor regions SD1, SD2, SD3, and SD4), and the like.

In this manner, in the memory cell region 1A, the memory gate electrode MG, the control gate electrode CG, and the source/drain regions of the memory cell of a nonvolatile memory are formed. In the high breakdown voltage MIS region 1C, the gate electrode GE1, and the source/drain regions of the MISFET are formed. In the low breakdown voltage MIS region 1B, the source/drain regions of the MISFET are formed. However, in the low breakdown voltage MIS region 1B, the gate electrode to be finally used (the gate electrode GE2 described later) has not yet been formed.

Figure 23:
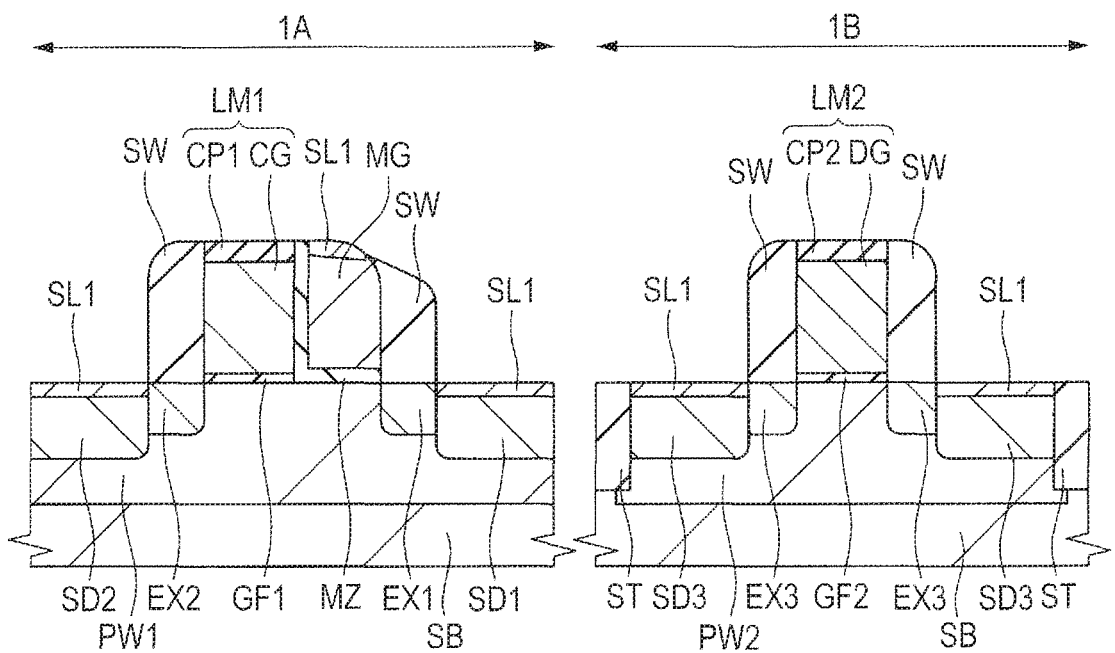
FIG. 23 is an essential part cross sectional view of the semiconductor device during a manufacturing step following FIG. 21.
Figure 24:
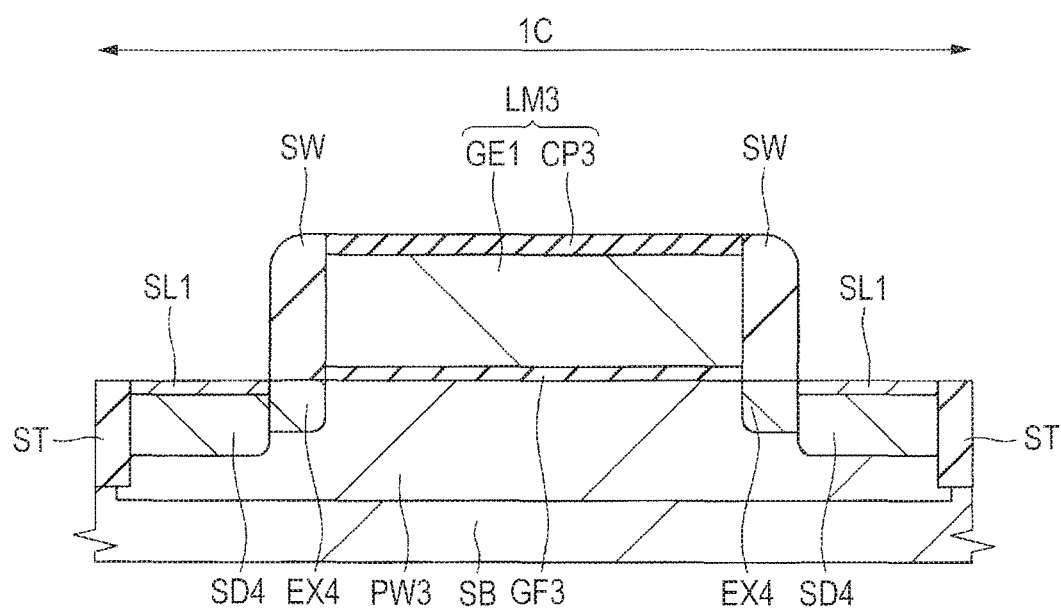
FIG. 24 is an essential part cross sectional view of the same semiconductor device as that of FIG. 23 during a manufacturing step.

Then, as shown in FIGS. 23 and 24, a so-called salicide (Salicide: Self Aligned Silicide) process is performed, thereby to form a metal silicide layer SL1 at each top (surface layer part) of the type semiconductor regions SD1, SD2, SD3, and SD4.

The metal silicide layer SL1 formation step can be performed, for example, in the following manner. Namely, first, entirely over the main surface of the semiconductor substrate SB, a metal film (e.g., a nickel film) for forming the metal silicide layer SL1 is formed in such a manner as to cover the memory gate electrode MG, the lamination bodies LM1, LM2, and LM3, and the sidewall spacers SW using a sputtering method, or the like. Then, a heat treatment is performed, so that each top (surface layer portion) of the $n^+$ type semiconductor regions SD1, SD2, SD3, and SD4 are allowed to react with the metal film. As a result, the metal silicide layers SL1 are formed at respective tops of the $n^+$ type semiconductor regions SD1, SD2, SD3, and SD4. The metal silicide layer SL1 is a nickel silicide layer, for example, when the metal film is a nickel film. Then, the unreacted (excess) portions of the metal film are removed. FIGS. 23 and 24 each show the cross sectional view at this stage. After removing the unreacted portions of the metal film, a second heat treatment may be performed. The metal silicide layer SL1 is also formed at the top of the memory gate electrode MG. Further, the presence of the cap insulation films CP1, CP2, and CP3 prevents the formation of the metal silicide layer SL1 at each top of the control gate electrode CG, the dummy gate electrode DG, and the gate electrode GE1.

Figure 25:
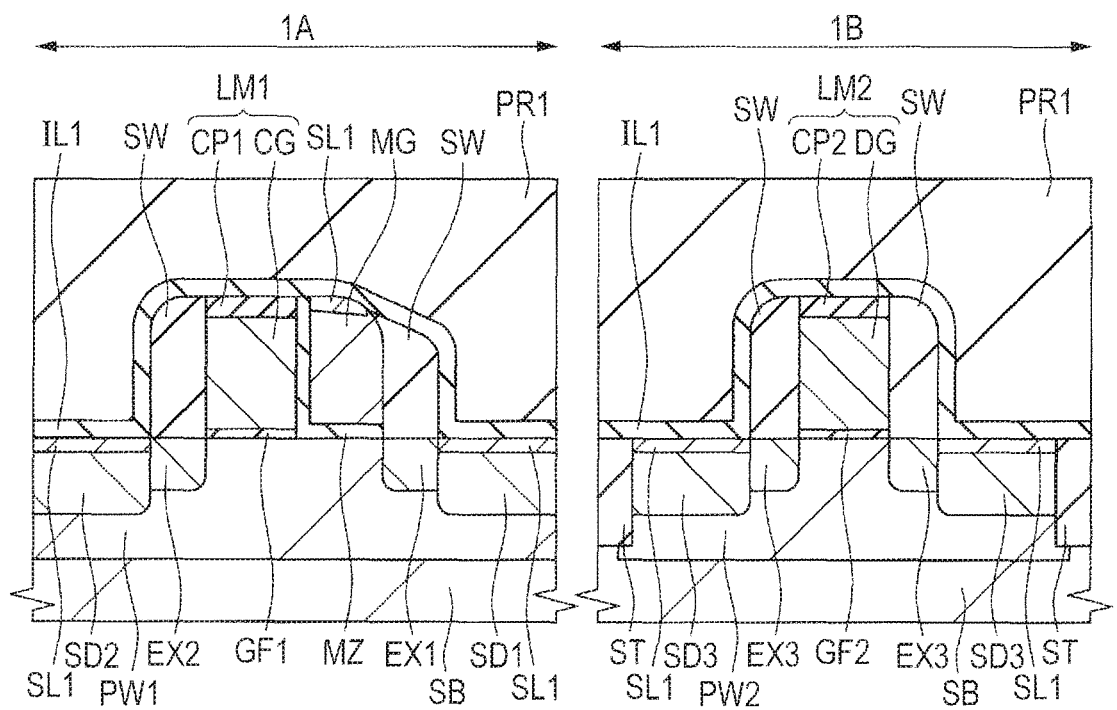
FIG. 25 is an essential part cross sectional view of the semiconductor device during a manufacturing step following FIG. 23.
Figure 26:
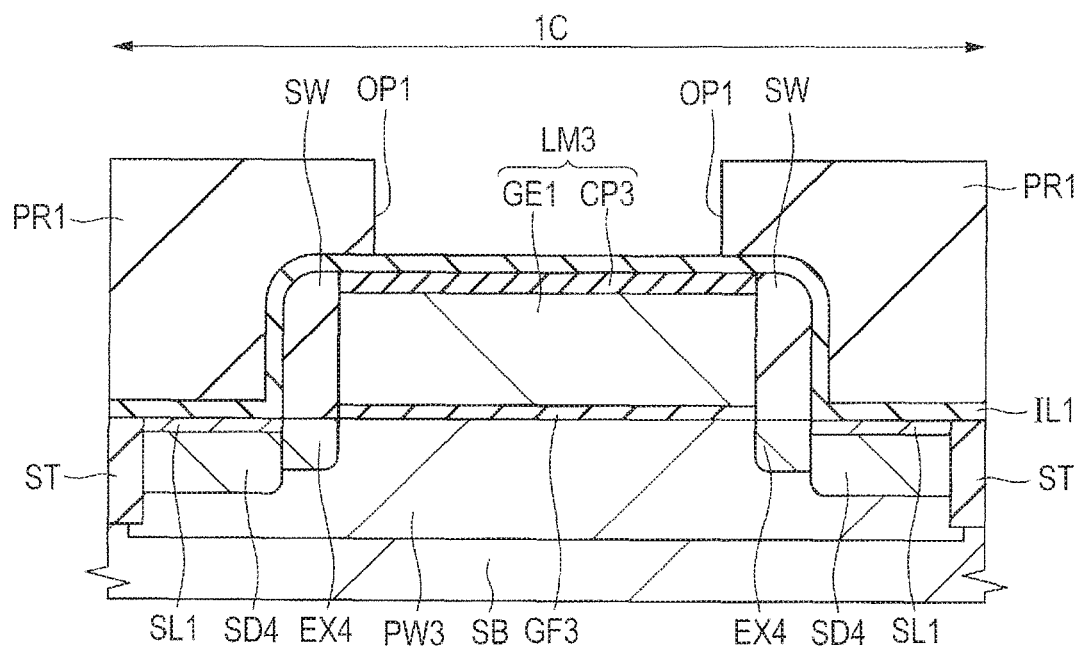
FIG. 26 is an essential part cross sectional view of the same semiconductor device as that of FIG. 25 during a manufacturing step.

Then, as shown in FIGS. 25 and 26, entirely over the main surface of the semiconductor substrate SB, the insulation film IL1 is formed in such a manner as to cover the memory gate electrode MG, the lamination bodies LM1, LM2, and LM3, and the sidewall spacers SW. The insulation film IL1 is formed of, for example, a silicon nitride film, and can be formed using a CVD method, or the like. The formation film thickness (deposited film thickness) of the insulation film IL1 can be set at, for example, about 10 to 30 nm.

Then, as shown in FIGS. 25 and 26, over the insulation film IL1, using a photolithography technology, a photoresist pattern (mask layer) PR1 is formed. The photoresist pattern PR1 has an opening OP1, and in a plan view, the opening OP1 is internally included in the lamination body LM3 (gate electrode GE1). The memory cell region 1A and the low breakdown voltage MIS region 1B are entirely covered with the photoresist pattern PR1.

Incidentally, the photolithography technology is a technology of forming a photoresist film entirely over the main surface of the semiconductor substrate by a coating method, or the like, then subjecting the photoresist film to light exposure and development for patterning, and thereby obtaining a desired photoresist pattern.

Figure 27:
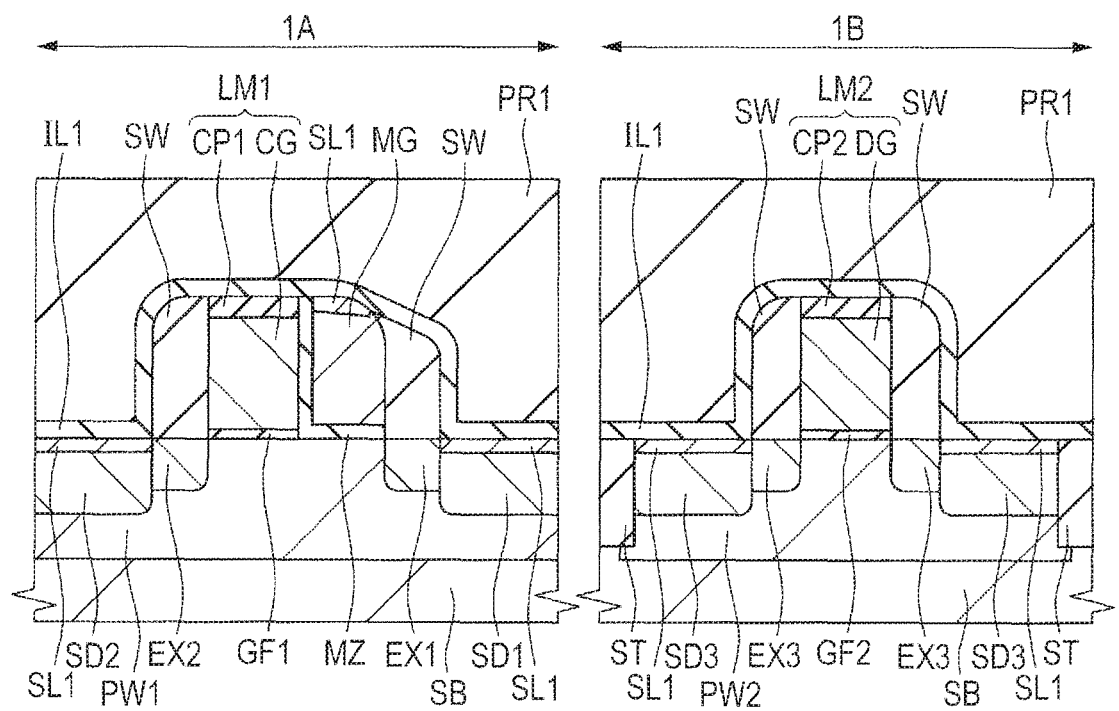
FIG. 27 is an essential part cross sectional view of the semiconductor device during a manufacturing step following FIG. 25.
Figure 28:
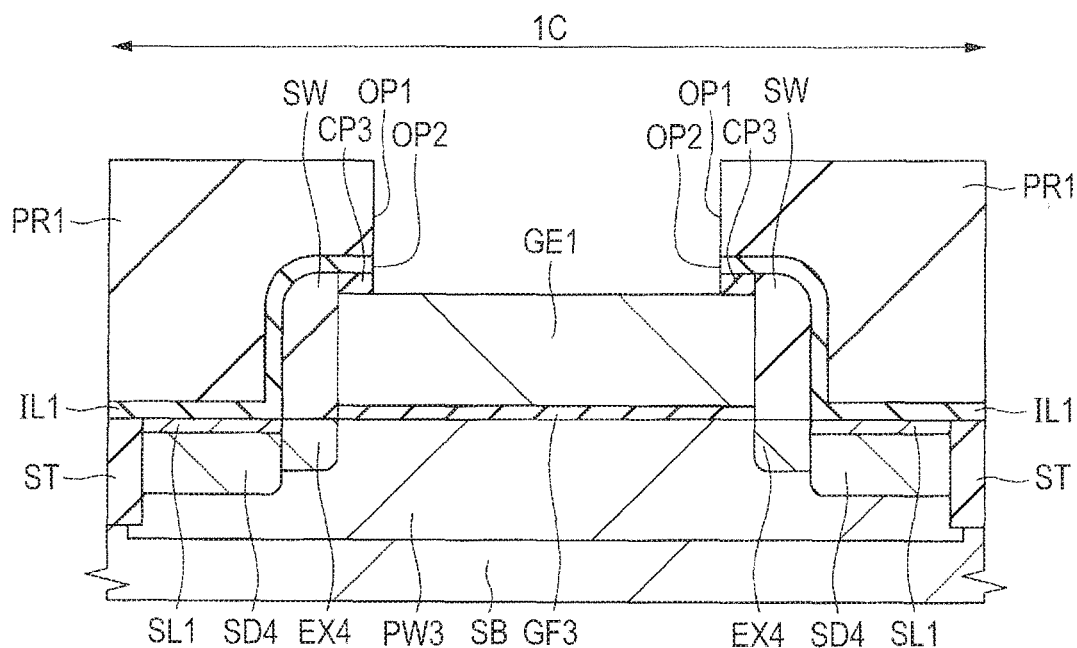
FIG. 28 is an essential part cross sectional view of the same semiconductor device as that of FIG. 27 during a manufacturing step.

Then, as shown in FIGS. 27 and 28, using the photoresist pattern PR1 as an etching mask, the insulation film IL1 and the cap insulation film CP3 are sequentially etched. As a result, the portions of the insulation film IL1 and the cap insulation film CP3 exposed from the opening OP1 in the photoresist pattern PR1 are removed. This step will be hereinafter referred to as "the etching step of FIGS. 27 and 28".

By performing the etching step of FIGS. 27 and 28, in the region overlapping the opening OP1 in the photoresist pattern PR1 in a plan view, the insulation film IL1 and the cap insulation film CP3 are etched and removed. As a result, the top surface of the gate electrode GE1 is exposed. On the other hand, in the region covered with the photoresist pattern PR1 (i.e., the region not overlapping the opening OP1 in the photoresist pattern PR1), the insulation film IL1 and the cap insulation film CP3 are not etched, and are left. For this reason, upon completion of the etching step of FIGS. 27 and 28, in the insulation film IL1 and the cap insulation film CP3, an opening OP2 having almost the same planar configuration as that of the opening OP1 is formed at a position overlapping the opening OP1 in a plan view.

The opening OP1 in the photoresist pattern PR1, and the opening OP2 formed in the insulation film IL1 and the cap insulation film CP3 are continuous to each other. The opening OP2 is formed in the lamination film (lamination structure) of the cap insulation film CP3, and the insulation film IL1 thereover, and penetrates through the insulation film IL1 and the cap insulation film CP3. Namely, the opening OP2 includes the opening in the insulation film IL1, and the opening in the cap insulation film CP3, and the opening in the insulation film IL1, and the opening in the cap insulation film CP3 forming the opening OP2 are continuously connected to each other. The opening OP1 in the photoresist pattern PR1 is internally included in the lamination body LM3 (gate electrode GE1) in a plan view. Accordingly, the opening OP2 formed in the insulation film IL1 and the cap insulation film CP3 is also internally included in the gate electrode GE1 in a plan view.

The insulation film IL1 and the cap insulation film CP3 are etched, thereby to form the opening OP2. Then, at the bottom of the opening OP2, (the top surface of) the gate electrode GE1 is exposed. In the etching step of FIGS. 27 and 28, the gate electrode GE1 can be allowed to function as as an etching stopper. Further, in the etching step of FIGS. 27 and 28, the insulation film IL1 in the memory cell region 1A and the low breakdown voltage MIS region 1B is covered with the photoresist pattern PR1, and hence is not etched.

Further, the insulation film IL1 and the cap insulation film CP3 can also be formed of different materials, but are more preferably formed of the same material (e.g., silicon nitride). When the insulation film IL1 and the cap insulation film CP3 are formed of the same material (e.g., silicon nitride), in the etching step of FIGS. 27 and 28, it becomes possible to continuously perform etching of the insulation film IL1, and etching of the cap insulation film CP3 without changing the etching conditions. This can shorten the time required for the etching step.

Further, when the insulation film IL1, and the cap insulation films CP1, CP2, and CP3 are formed of the same material (e.g., silicon nitride), in a polishing step of FIGS. 35 and 36 described later, an insulation film IL2 described later, the insulation film IL1, and the cap insulation films CP1, CP2, and CP3 become more likely to be polished. For this reason, the polishing step of FIGS. 35 and 36 described later becomes more likely to be performed.

Further, in the etching step of FIGS. 27 and 28, preferably, by anisotropic dry etching, the insulation film IL1 and the cap insulation film CP3 are etched, thereby to form the opening OP2 in the insulation film IL1 and the cap insulation film CP3. This can make the planar configuration of the opening OP2 formed in the insulation film IL1 and the cap insulation film CP3 almost the same as the planar configuration of the photoresist pattern PR1. This can suppress or prevent the fluctuations in planar configuration of the opening OP2.

As another aspect, when the cap insulation film CP3 is not formed, the opening OP2 is formed in the insulation film IL1, so that (the top surface of) the gate electrode GE1 is exposed at the bottom of the opening OP2 of the insulation film IL1.

Figure 29:
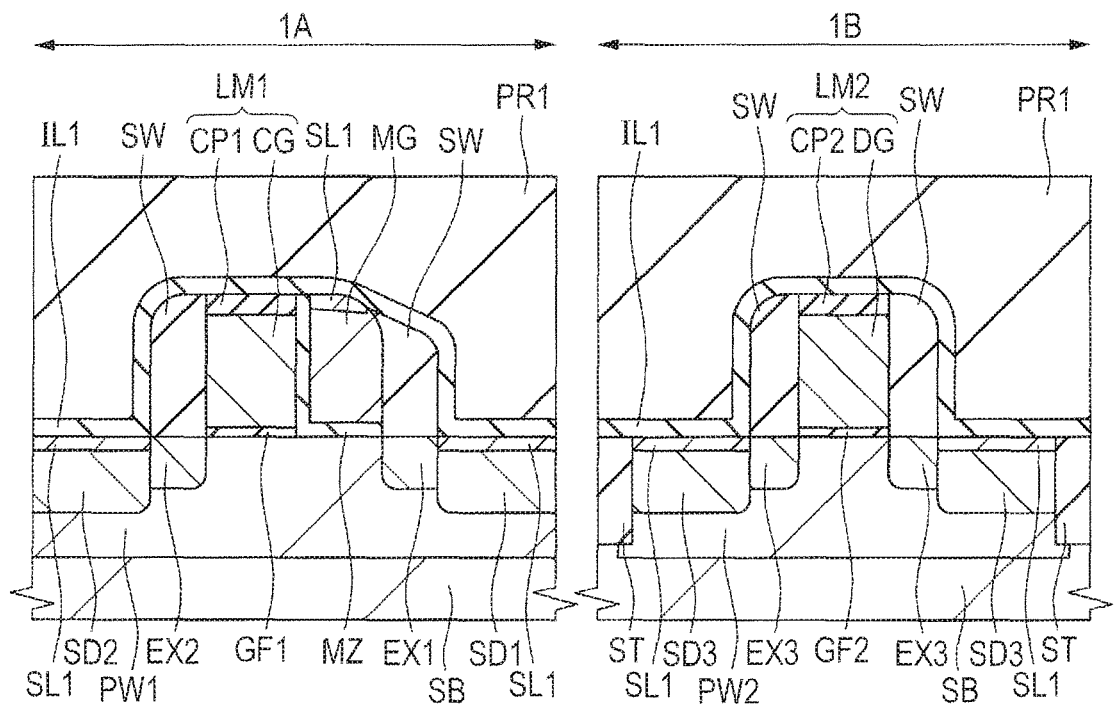
FIG. 29 is an essential part cross sectional view of the semiconductor device during a manufacturing step following FIG. 27.
Figure 30:
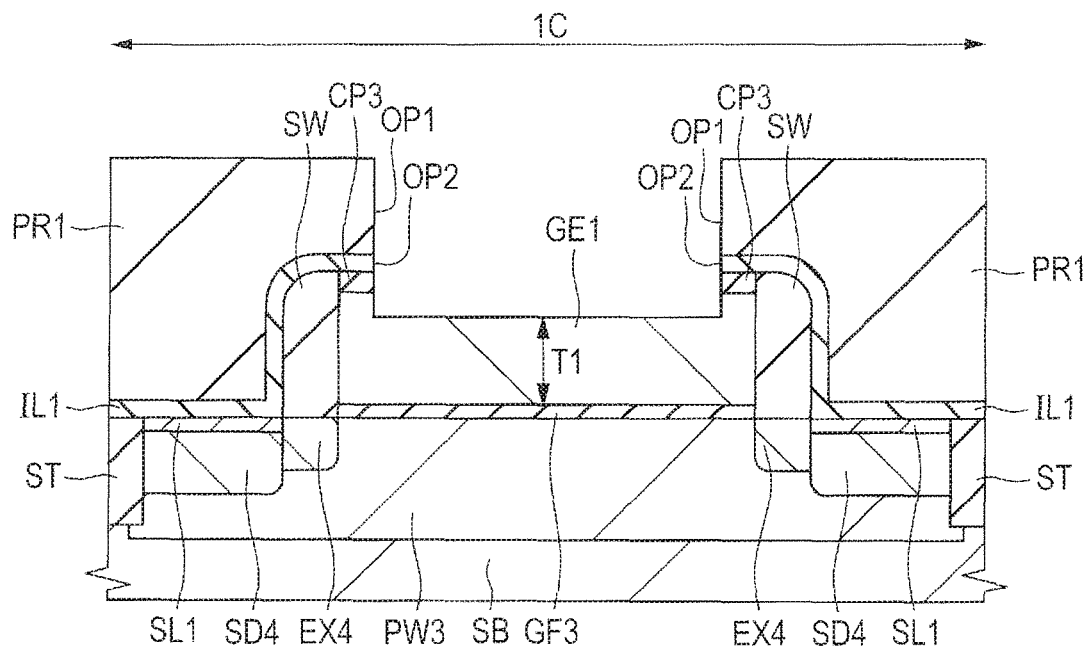
FIG. 30 is an essential part cross sectional view of the same semiconductor device as that of FIG. 29 during a manufacturing step.

Then, as shown in FIGS. 29 and 30, using the photoresist pattern PR1 as an etching mask (hard mask), the gate electrode GE1 exposed at the bottom of the opening OP2 is etched, thereby to reduce the height (height position) of the portion of the gate electrode GE1 exposed at the bottom of the opening OP2. This step will be hereinafter referred to as "the etching step of FIGS. 29 and 30".

Namely, in the etching step of FIGS. 29 and 30, with the photoresist pattern PR1 as an etching mask, the gate electrode GE1 is subjected to an etching treatment. As a result, the top surface of the portion of the gate electrode GE1 exposed from the opening OP2 is caused to retreat (descend) in the direction perpendicular to the main surface of the semiconductor substrate SB. In the etching step of FIGS. 29 and 30, the portion of the gate electrode GE1 covered with the photoresist pattern PR1, namely, the portion of the gate electrode GE1 covered with the insulation film IL1 and the cap insulation film CP3 is not etched, and is left as it is. Namely, the portion of the gate electrode GE1 not overlapping the opening OP2 in a plan view is not etched, and is left as it is.

Further, in the etching step of FIGS. 29 and 30, not the thickness of the gate electrode GE1 is totally etched, but, the thickness is partially etched. For this reason, even when the etching step is performed, the insulation film GF3 under the gate electrode GE1 is not exposed. At the stage upon completion of the etching step of FIGS. 29 and 30, at the bottom of the opening OP2, a part of the thickness of the gate electrode GE1 is left. Namely, in the etching step of FIGS. 29 and 30, in the region overlapping the opening OP2 in a plan view, the top (the top layer part) of the gate electrode GE1 is etched, and removed, but the lower part (the lower layer part) of the gate electrode GE1 is not etched, and is left.

For this reason, upon completion of the etching step of FIGS. 29 and 30, the height position of the top surface of the portion of the gate electrode GE1 exposed from the opening OP2 is lower than the height position of the top surface of the portion of the gate electrode GE1 covered with the insulation film IL1 and the cap insulation film CP3. Namely, before performing the etching step of FIGS. 29 and 30, the top surface of the gate electrode GE1 was roughly flat. However, upon performing the etching step of FIGS. 29 and 30, the portion of the top surface of the gate electrode GE1 becomes depressed in the region overlapping the opening OP2 in a plan view.

Further, as compared with before performing the etching step of FIGS. 29 and 30, when the etching step of FIGS. 29 and 30 is performed, in the region overlapping the opening OP2 in a plan view, the thickness of the gate electrode GE1 is smaller. For this reason, the etching step of FIGS. 29 and 30 can be regarded as the step of etching the gate electrode GE1 exposed from the opening OP2, and reducing the height of the top surface of the portion of the opening gate electrode GE1 exposed from the opening OP2, and can also be regarded as the step of etching the gate electrode GE1 exposed from the opening OP2, and reducing the thickness of the portion of the gate electrode GE1 exposed from the opening OP2.

In the etching step of FIGS. 29 and 30, preferably, etching is performed under conditions under which the insulation film IL1 and the cap insulation film CP3 are less likely to be etched than the gate electrode GE1. Namely, preferably, etching is performed under the conditions under which the etching speed (etching rate) of the insulation film IL1 and the cap insulation film CP3 is lower than the etching speed (etching rate) of the gate electrode GE1.

Further, in the etching step of FIGS. 29 and 30, preferably, the gate electrode GE1 exposed from the opening OP2 is etched by anisotropic dry etching. This can precisely etch, and reduce the height of the gate electrode GE1 in the region overlapping the opening OP2 in a plan view. As a result, it is possible to suppress or prevent the etching of the unintended region in the gate electrode GE1.

Further, the cap insulation film CP1, the control gate electrode CG, and the memory gate electrode MG in the memory cell region 1A, and the cap insulation film CP2 and the dummy control gate electrode DG in the low breakdown voltage MIS region 1B are covered with the photoresist pattern PR1 and the insulation film IL1, and hence are not etched, and are left as they are in the etching step of FIGS. 29 and 30.

Figure 31:
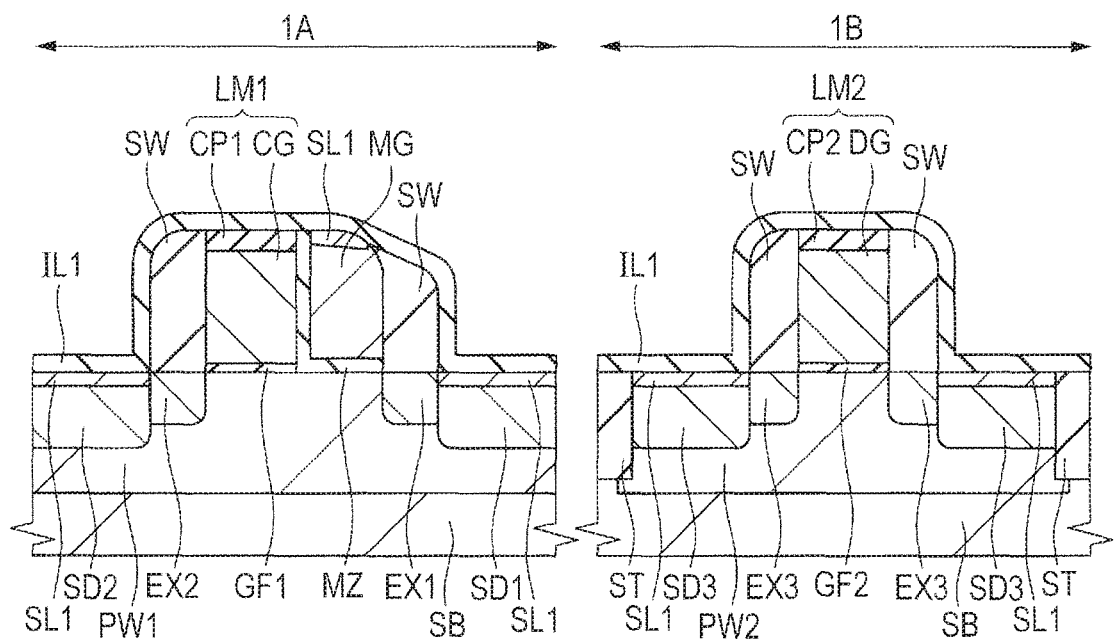
FIG. 31 is an essential part cross sectional view of the semiconductor device during a manufacturing step following FIG. 29.
Figure 32:
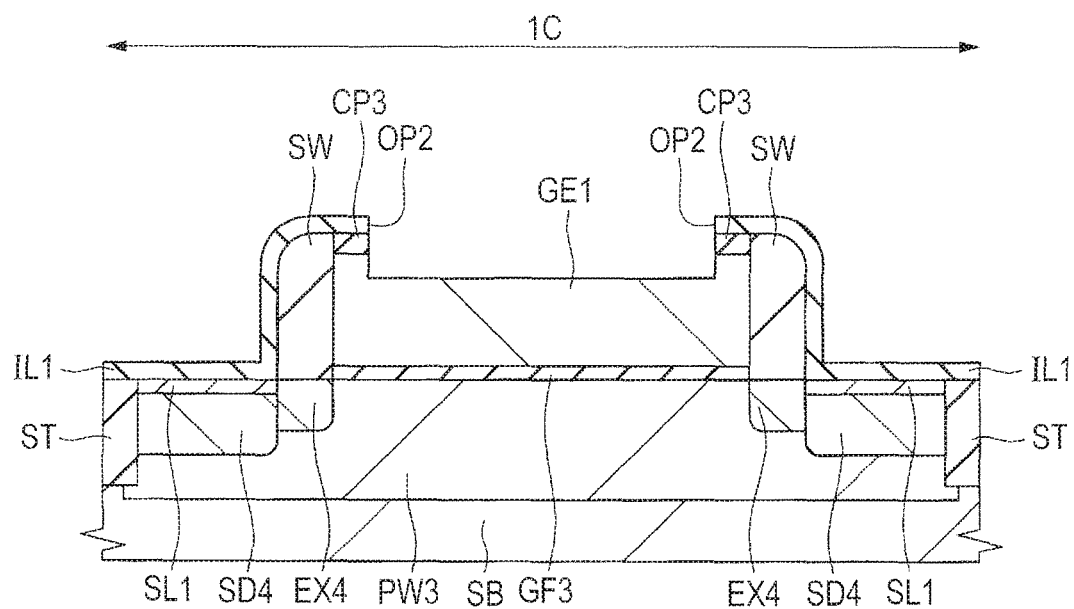
FIG. 32 is an essential part cross sectional view of the same semiconductor device as that of FIG. 31 during a manufacturing step.

After the etching step of FIGS. 29 and 30, as shown in FIGS. 31 and 32, the photoresist pattern PR1 is removed by asking, or the like.

Further, herein, a description has been given to the following case. By etching using the photoresist pattern PR1 as an etching mask, the opening OP2 is formed in the insulation film IL1 and the cap insulation film CP3. Then, without removing the photoresist pattern PR1, in the etching step of FIGS. 29 and 30, using the photoresist pattern PR1 as an etching mask, the exposed portion of the gate electrode GE1 is etched. As another aspect, there can be the following case. As shown in FIGS. 27 and 28, by etching using the photoresist pattern PR1 as an etching mask, the opening OP2 is formed in the insulation film IL1 and the cap insulation film CP3. Then, after removing the photoresist pattern PR1, in the etching step of FIGS. 29 and 30, the exposed portion of the gate electrode GE1 is etched. In this case, the etching step of FIGS. 29 and 30 is performed without the photoresist pattern PR1, so that the insulation film IL1 and the cap insulation film CP3 can function as an etching mask (hard mask). Upon completion of the etching step of FIGS. 29 and 30, the structure of FIGS. 31 and 32 is obtained.

Figure 33:
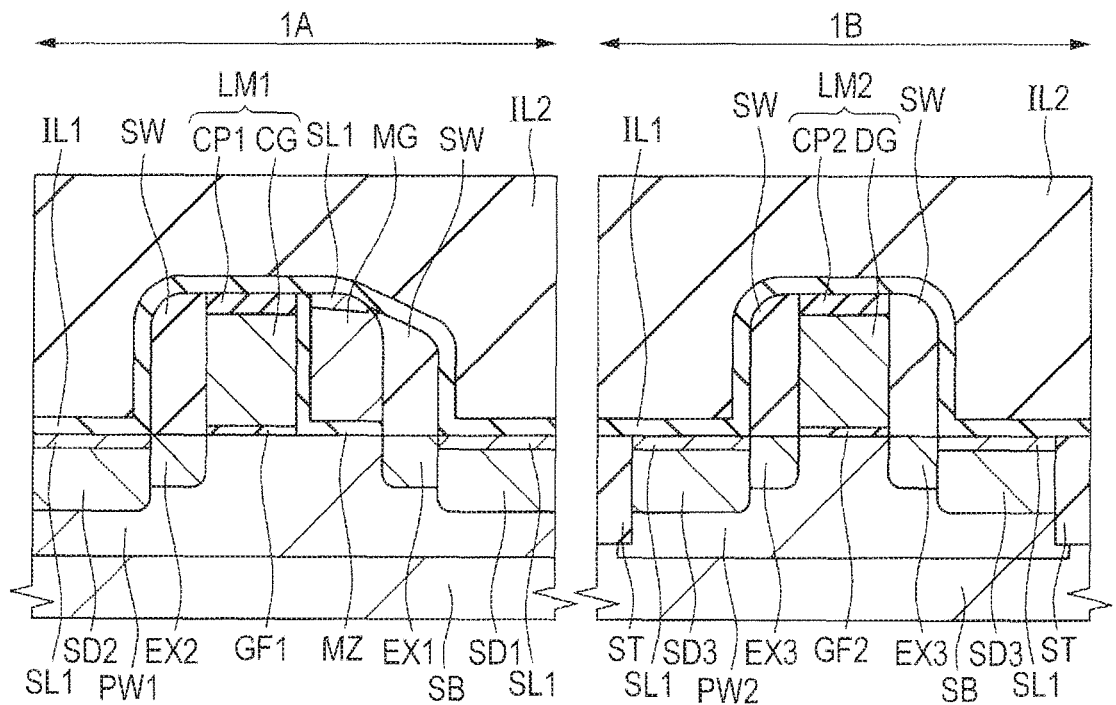
FIG. 33 is an essential part cross sectional view of the semiconductor device during a manufacturing step following FIG. 31.
Figure 34:
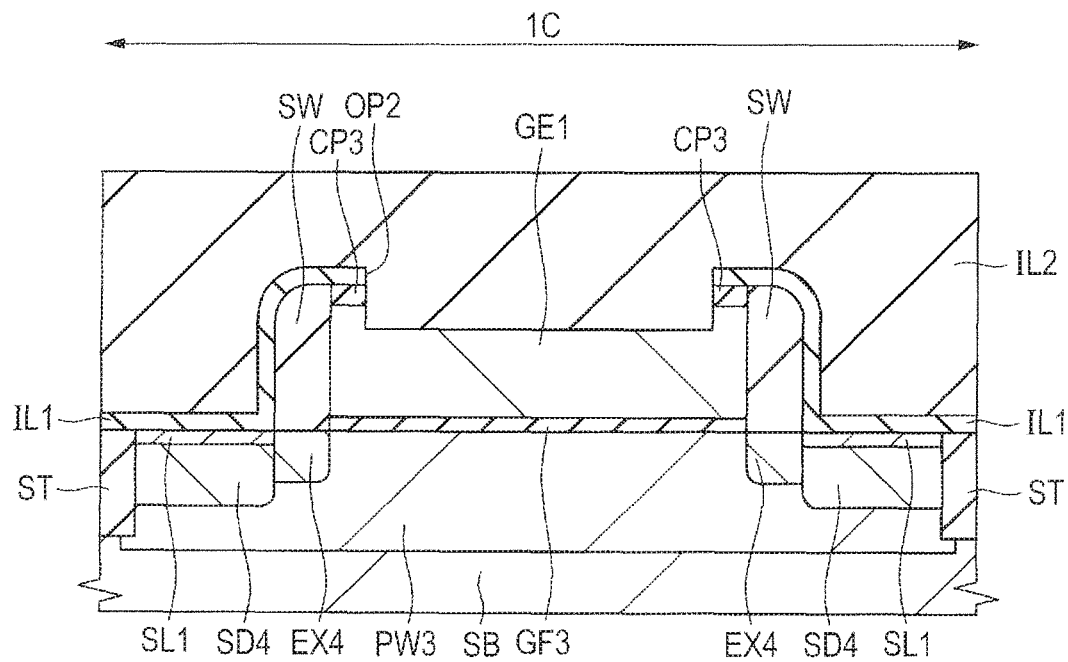
FIG. 34 is an essential part cross sectional view of the same semiconductor device as that of FIG. 33 during a manufacturing step.

Then, as shown in FIGS. 33 and 34, entirely over the main surface of the semiconductor substrate SB, namely, over the insulation film IL1 including over the gate electrode GE1 exposed from the opening OP2, the insulation film IL2 is formed.

The insulation film IL2 is formed of a different material from that for the insulation film IL1, is formed of, for example, a silicon oxide film, and can be formed using a CVD method, or the like. The formation film thickness (deposited film thickness) of the insulation film IL2 in FIGS. 33 and 34 is larger than the formation film thickness (deposited film thickness) of the insulation film IL1 in FIGS. 25 and 26, and can be set at, for example, about 140 to 700 nm.

Figure 35:
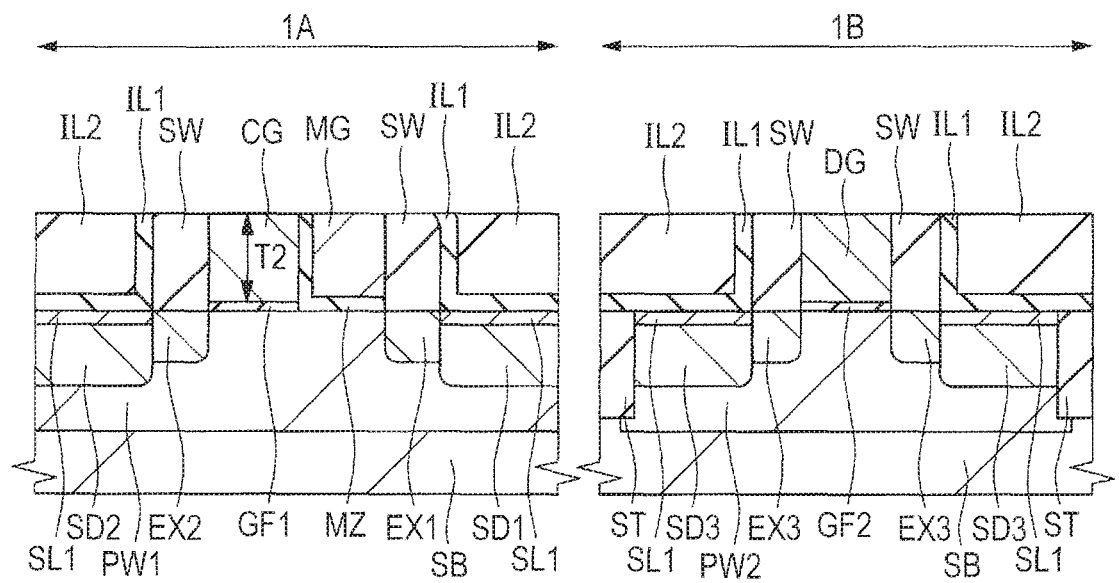
FIG. 35 is an essential part cross sectional view of the semiconductor device during a manufacturing step following FIG. 33.
Figure 36:
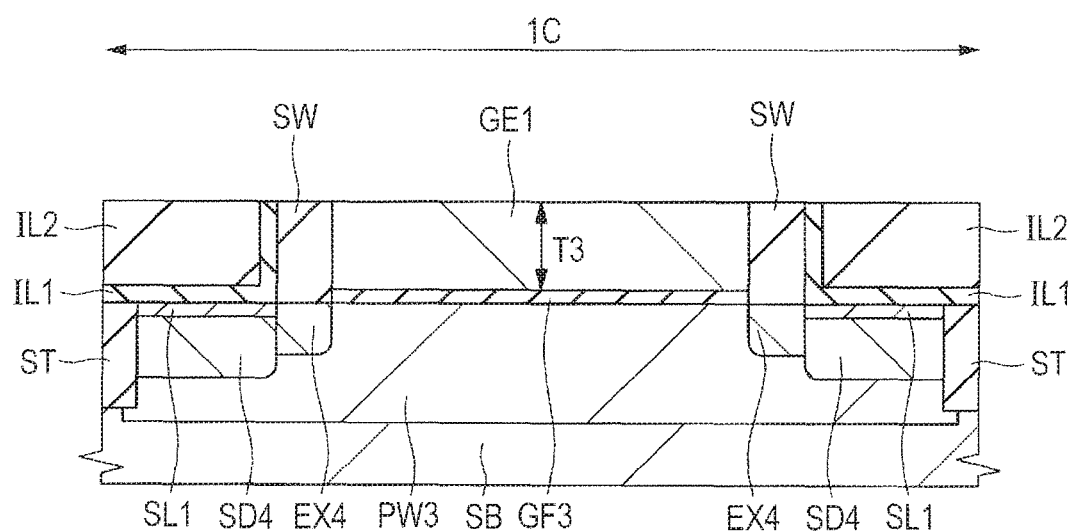
FIG. 36 is an essential part cross sectional view of the same semiconductor device as that of FIG. 35 during a manufacturing step.

Then, as shown in FIGS. 35 and 36, the top surface of the insulation film IL2 is polished using a CMP (Chemical Mechanical Polishing) method, or the like. This step will be hereinafter referred to as "the polishing step of FIGS. 35 and 36". By the polishing step of FIGS. 35 and 36, respective top surfaces of the memory gate electrode MG, the control gate electrode CG, the dummy gate electrode DG, and the gate electrode GE1 are exposed.

In the polishing step of FIGS. 35 and 36, the insulation film IL1 over the memory gate electrode MG, and over the cap insulation films CP1, CP2, and CP3 is also polished, and removed. Further, the cap insulation films CP1, CP2, and CP3 are also polished and removed. Still further, the top of each sidewall spacer SW can also be polished. When the metal silicide layer SL1 has been formed at the top of the memory gate electrode MG, in the polishing step of FIGS. 35 and 36, the metal silicide layer SL1 at the top of the memory gate electrode MG is also polished, and removed.

Figure 37:
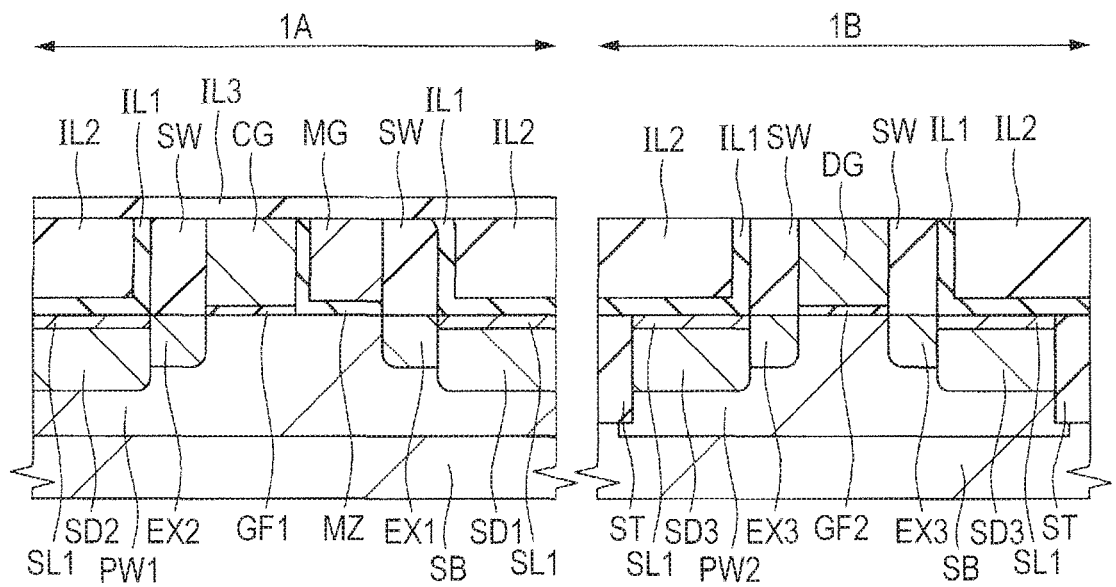
FIG. 37 is an essential part cross sectional view of the semiconductor device during a manufacturing step following FIG. 35.
Figure 38:
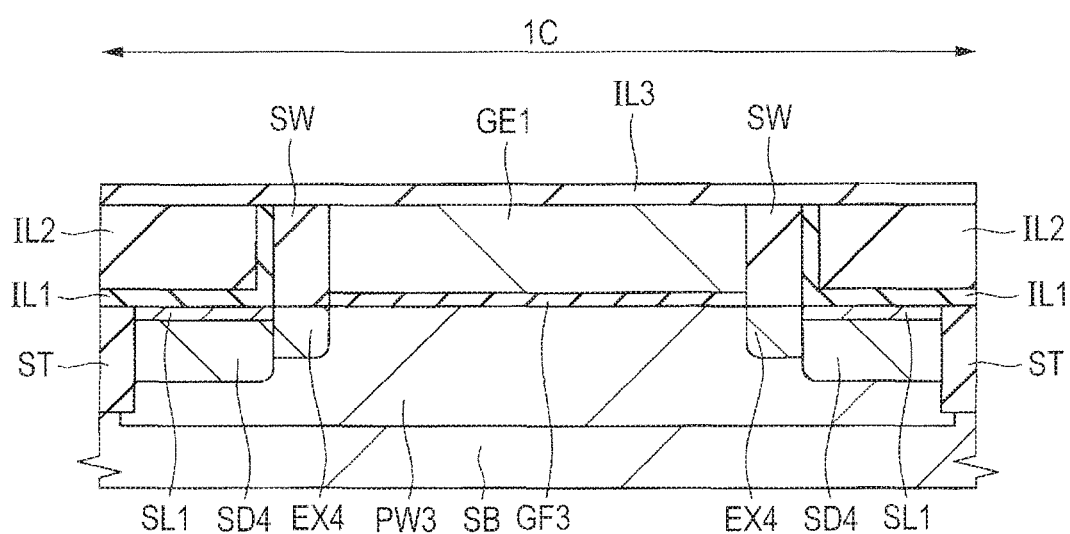
FIG. 38 is an essential part cross sectional view of the same semiconductor device as that of FIG. 37 during a manufacturing step.

Then, as shown in FIGS. 37 and 38, over the insulation film IL2, an insulation film IL3 covering the memory cell region 1A and the high breakdown voltage MIS region 1C, and exposing the low breakdown voltage MIS region 1B is formed. In other words, an insulation film IL3 covering the control gate electrode CG, the memory gate electrode MG, and the gate electrode GE1, and exposing the dummy gate electrode DG is formed.

The insulation film IL3 can be formed by deposition by a CVD method, and patterning by a photolithography method and an etching method. Due to the formation of the insulation film IL3, the control gate electrode CG, the memory gate electrode MG, and the gate electrode GE1 are covered with the insulation film IL3, and hence are not exposed. On the other hand, the top surface of the dummy gate electrode DG is not covered with the insulation film IL3, and is exposed.

Figure 39:
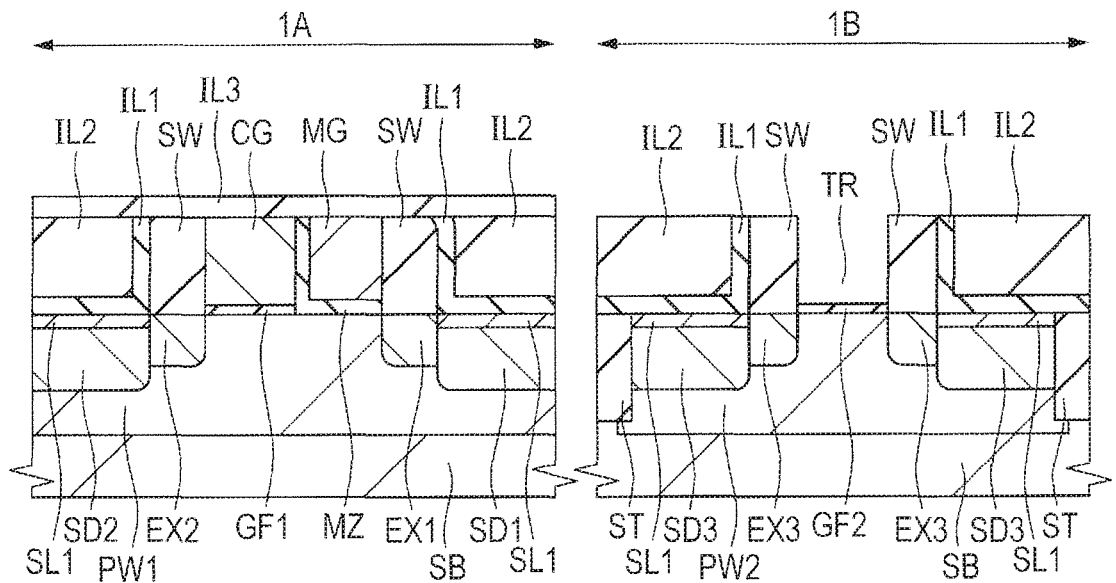
FIG. 39 is an essential part cross sectional view of the semiconductor device during a manufacturing step following FIG. 37.
Figure 40:
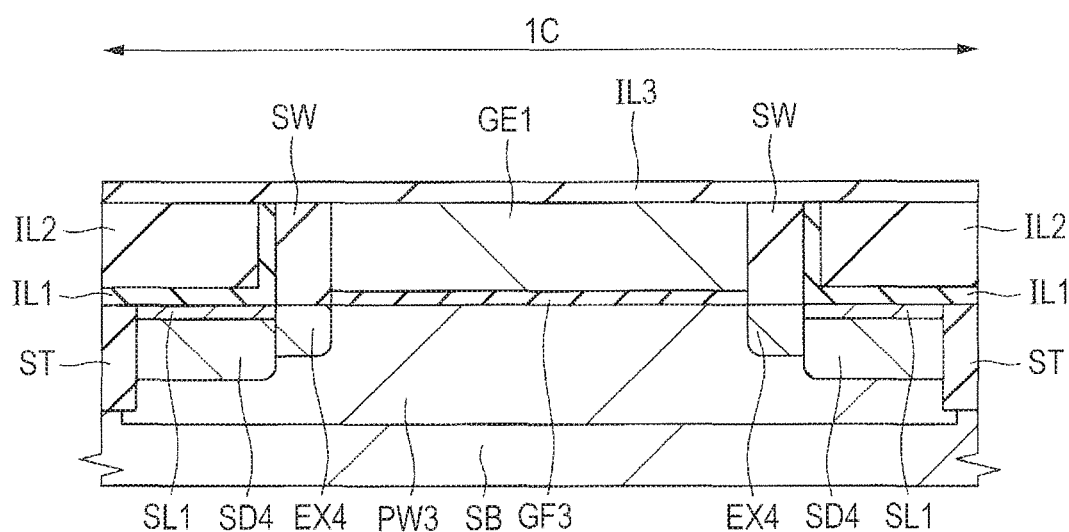
FIG. 40 is an essential part cross sectional view of the same semiconductor device as that of FIG. 39 during a manufacturing step.

Then, as shown in FIGS. 39 and 40, the dummy gate electrode DG is selectively etched, and removed. This step will be hereinafter referred to as "the etching step of FIGS. 39 and 40".

In the etching step of FIGS. 39 and 40, preferably, etching is performed under the conditions under which the insulation films IL1, IL2, IL3, and GF2, and the sidewall spacers SW are less likely to be etched than the dummy gate electrode DG. Namely, preferably, etching is performed under the conditions under which each etching speed (etching rate) of the insulation films IL1, IL2, IL3, and GF2, and the sidewall spacers SW is lower than the etching speed (etching rate) of the dummy gate electrode DG. The dummy gate electrode DG is formed of silicon. For this reason, in the etching step of FIGS. 39 and 40, it is easy to ensure a high etching selectivity of the dummy gate electrode DG. Even when the etching step of FIGS. 39 and 40 is performed, the control gate electrode CG, the memory gate electrode MG, and the gate electrode GE1 are covered with the insulation film IL3, and hence are not etched, and are left as they are.

Removal of the dummy gate electrode DG results in the formation of a trench (concave part or pit part) TR. The trench TR is the region from which the dummy gate electrode DG has been removed, and corresponds to the region where the dummy gate electrode DG has been present until the removal of the dummy gate electrode DG. The bottom surface of the trench TR is formed of the top surface of the insulation film GF2. The side surface of the trench TR is formed of the sidewall spacer SW (the sidewall spacer SW formed over the side surface of the dummy gate electrode DG).

Figure 41:
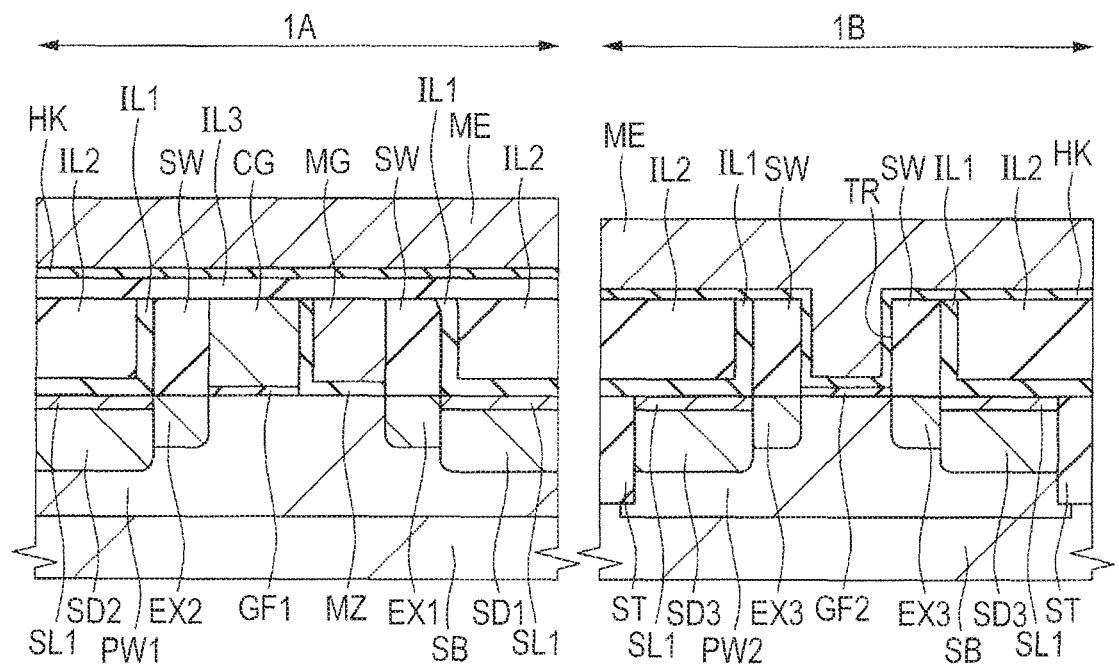
FIG. 41 is an essential part cross sectional view of the semiconductor device during a manufacturing step following FIG. 39.
Figure 42:
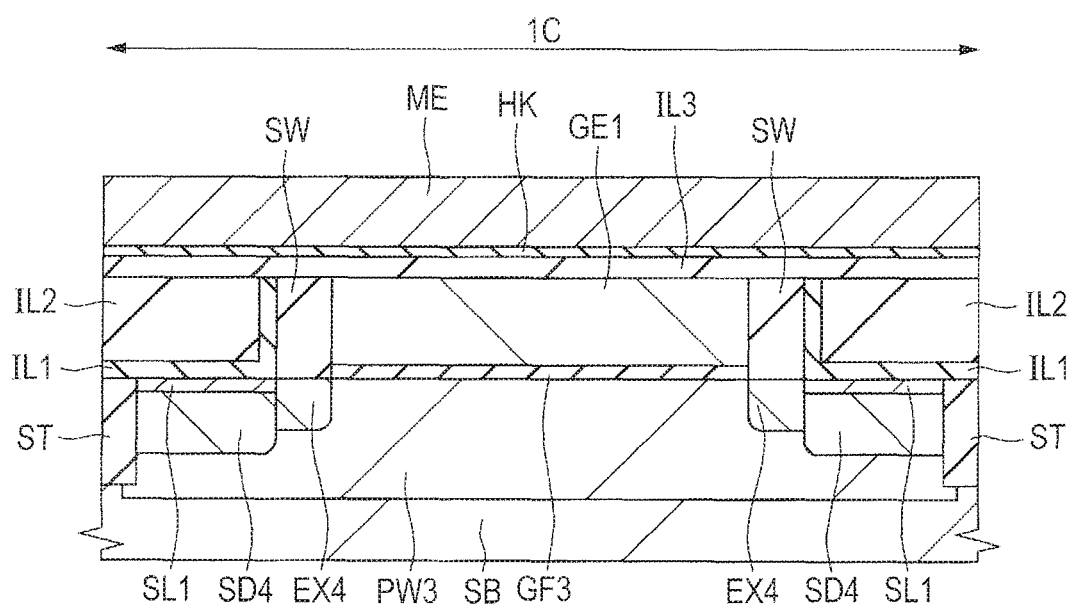
FIG. 42 is an essential part cross sectional view of the same semiconductor device as that of FIG. 41 during a manufacturing step.

Then, as shown in FIGS. 41 and 42, over the semiconductor substrate SB, namely, over the insulation films IL2 and IL3 including the inner surface (bottom surface and side surface) of the trench TR, an insulation film HK is formed as an insulation film for a high dielectric constant gate insulation film. The insulation film HK is formed of a high dielectric constant insulation film. Then, as shown in FIGS. 41 and 42, over the semiconductor substrate SB, namely, over the insulation film HK, a metal film ME is formed as a conductive film for a gate electrode in such a manner as to fill the inside of the trench TR. The metal film ME is formed over the insulation film HK including the inside of the trench TR. However, as another aspect, when the formation of the insulation film HK is omitted, the metal film ME is formed over the insulation films IL2 and IL3 including the inside of the trench TR.

In the trench TR, the insulation film HK is formed over the bottom surface and the sidewall (side surface) of the trench TR. However, the trench TR is not fully filled with the insulation film HK. The formation of the metal film ME results in the state in which the trench TR is fully filled with the insulation film HK and the metal film ME.

The insulation film HK is an insulating material film having a higher dielectric constant (specific dielectric constant) than that of silicon nitride, a so-called High-k film (high dielectric constant film). Incidentally, in the present application, the term "High-k film", "high dielectric constant film", "high dielectric constant insulation film", or "high dielectric constant gate insulation film" herein referred to denotes a film having a higher dielectric constant (specific dielectric constant) than that of silicon nitride.

As the insulation film HK, there can be used a metal oxide film such as a hafnium oxide film, a zirconium oxide film, an aluminum oxide film, a tantalum oxide film, or a lanthanum oxide film. Further, the metal oxide film can also further contain one or both of nitrogen (N) and silicon (Si). The insulation film HK can be formed by, for example, an ALD (Atomic layer Deposition) method or a CVD method. When a high dielectric constant film (herein, the insulation film HK) is used for the gate insulation film, the physical film thickness of the gate insulation film can be increased more than in the case using a silicon oxide film. This can provide an advantage of being capable of reducing the leakage current.

As the metal film ME, there can be used, for example, a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbonitride (TaCN) film, a titanium (Ti) film, a tantalum (Ta) film, a titanium, aluminum (TiAl) film, or an aluminum (Al) film. The metal film ME is a conductive film showing metal conduction, is not limited to a pure metal film, or an alloy film, but may also be a metal compound film showing metal conduction. Alternatively, the metal film ME may be a lamination film. In that case, the bottom layer of the lamination film is set to be a metal film (conductive film showing metal conduction). Still alternatively, the lamination film may also be set to be a lamination film of a plurality of metal films. As one preferable example of the metal film ME, the metal film ME may be a lamination film of a titanium nitride (TiN)film, and an aluminum (Al) film over the titanium nitride film. The metal film ME can be formed using a sputtering method, a CVD method, or the like.

Figure 43:
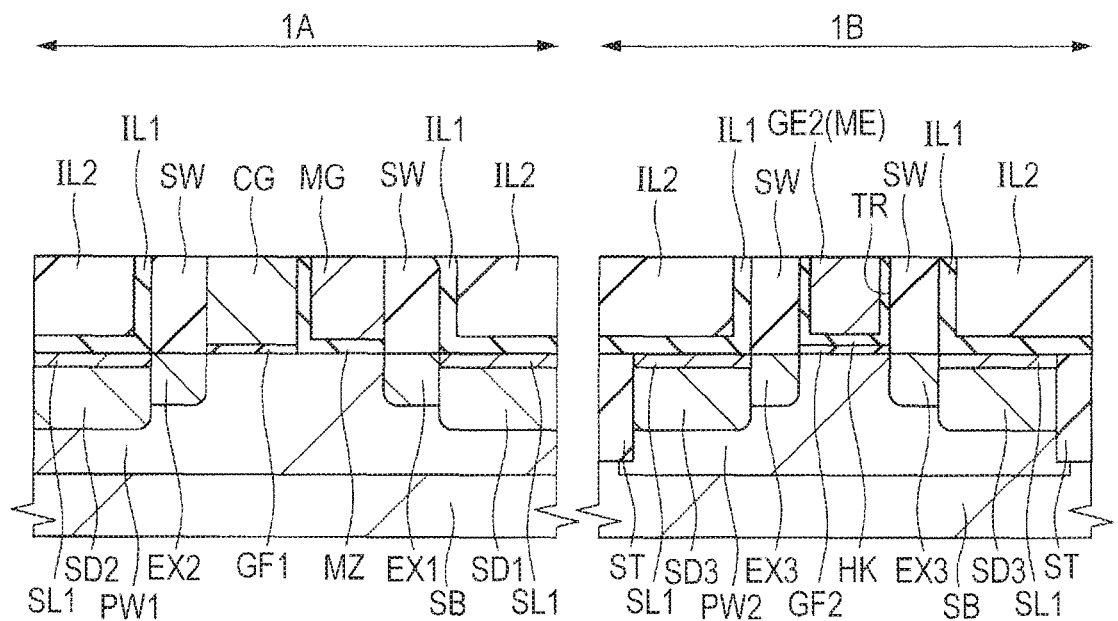
FIG. 43 is an essential part cross sectional view of the semiconductor device during a manufacturing step following FIG. 41.
Figure 44:
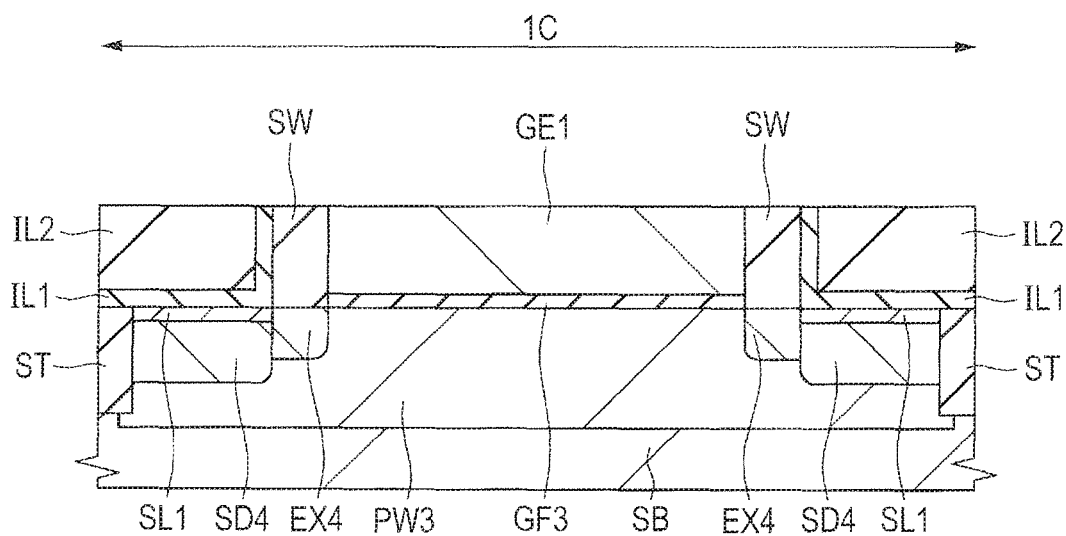
FIG. 44 is an essential part cross sectional view of the same semiconductor device as that of FIG. 43 during a manufacturing step.

Then, as shown in FIGS. 43 and 44, the unnecessary portions of the metal film ME and the insulation film HK outside the trench TR are removed by a CMP method or the like. As a result, the insulation film HK and the metal film ME are embedded in the trench TR. Namely, in this step, the portions of the metal film ME and the insulation film HK outside the trench TR are removed, so that the insulation film HK and the metal film ME are left in the trench TR. This results in a state in which the metal film ME is embedded in the trench TR via the insulation film HK.

In this manner, in the trench TR of the region from which the dummy gate electrode DG has been removed, the gate electrode GE2 of the metal gate electrode is formed via the insulation film HK of a high dielectric constant film. The metal film ME embedded in the trench TR becomes the gate electrode GE2 of a low breakdown voltage MISFET, and the insulation film HK embedded in the trench TR functions as the gate insulation film of the MISFET. The gate electrode GE2 is a metal gate electrode Further, in the present embodiment, the dummy gate electrode DG is removed, and is replaced with the gate electrode GE2. The gate electrode GE2 is used as the gate electrode of the MISFET in the low breakdown voltage MIS region 1B. For this reason, the dummy gate electrode DG can be regarded as a replacement gate electrode or a substitute gate electrode. The gate electrode GE2 can be regarded as the gate electrode forming the MISFET.

Further, in the present embodiment, the gate electrode GE2 is formed using the metal film ME. For this reason, the gate electrode GE2 can be set as a metal gate electrode. By setting the gate electrode GE2 as a metal gate electrode, it is possible to obtain an advantage of allowing the suppression of the depletion phenomenon of the gate electrode GE2, and the elimination of the parasitic capacitance. Further, it is also possible to obtain an advantage of enabling the size reduction of the transistor element (the reduction of the film thickness of the gate insulation film).

In the low breakdown voltage MIS region 1B, the insulation film HK is formed over the bottom surface and the sidewall of the trench TR. The gate electrode GE2 is adjacent to the insulation film HK at the bottom surface and the side surface thereof. The insulation film GF2 and the insulation film HK are interposed between the gate electrode GE2 and the semiconductor substrate SB (p type well PW2). The insulation film HK is interposed between the gate electrode GE2 and each sidewall spacer SW. The insulation films GF2 and HK immediately under the gate electrode GE2 function as the gate insulation film of the MISFET. However, the insulation film HK is a high dielectric constant film, and hence functions as a high dielectric constant gate insulation film.

Further, by the polishing step and the subsequent etching step of the metal film ME and the insulation film HK, the insulation film IL3 is removed. As a result, respective top surfaces of the control gate electrode CG, the memory gate electrode MG, the gate electrode GE1, and the gate electrode GE2 are exposed.

Figure 45:
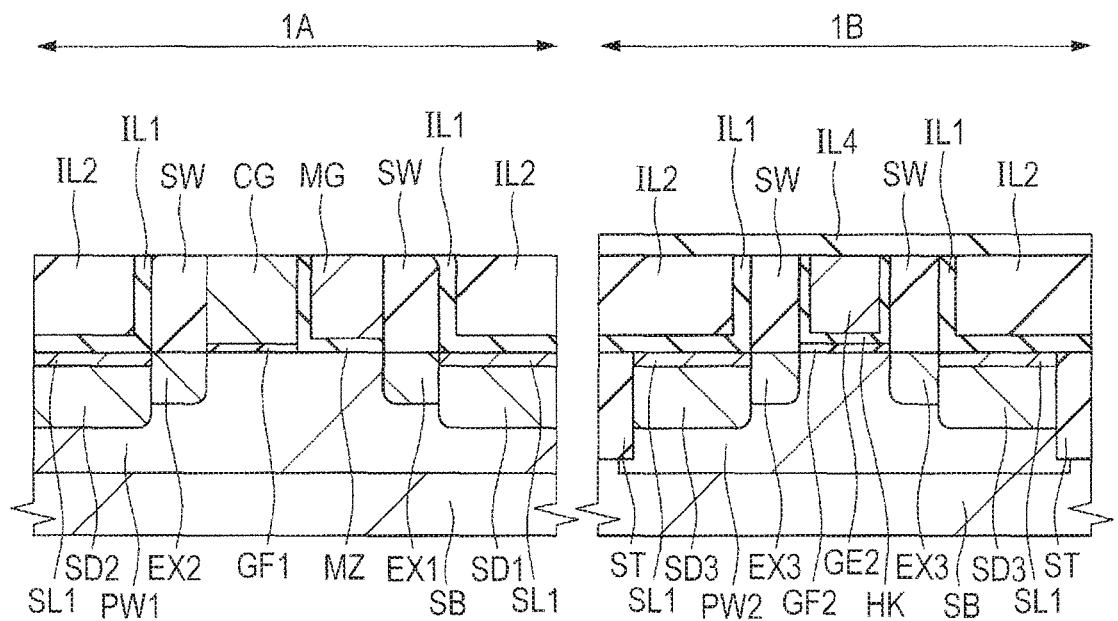
FIG. 45 is an essential part cross sectional view of the semiconductor device during a manufacturing step following FIG. 43.
Figure 46:
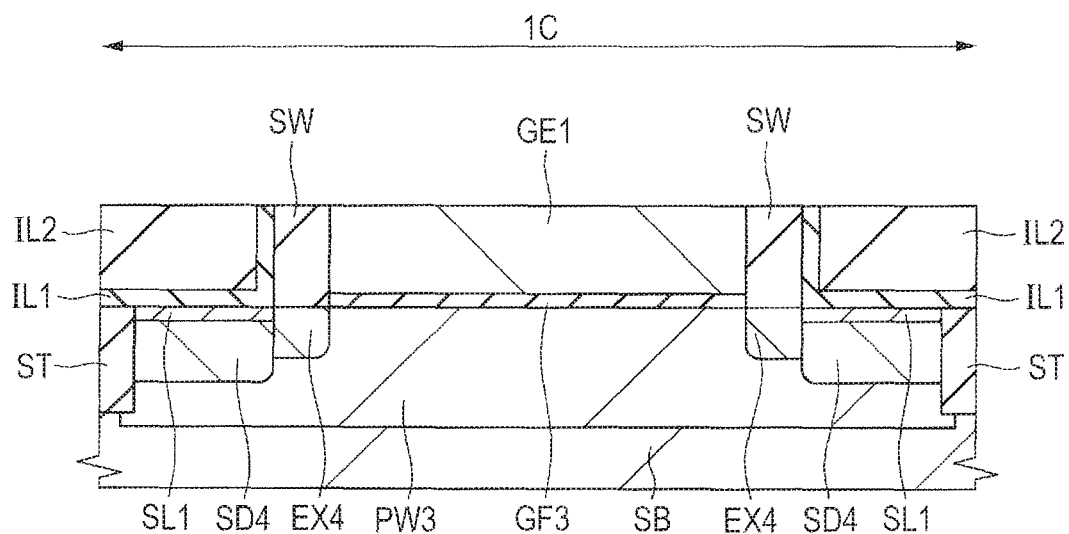
FIG. 46 is an essential part cross sectional view of the same semiconductor device as that of FIG. 45 during a manufacturing step.

Then, as shown in FIGS. 45 and 46, over the insulation film IL2, an insulation film IL4 covering the low breakdown voltage MIS region 1B, and exposing the memory cell region 1A and the high breakdown voltage MIS region 1C is formed. The insulation film IL4 can be formed by deposition by a CVD method, and patterning by a photolithography method and an etching method. The formation of the insulation film IL4 results in the following state: the gate electrode GE2 is covered with the insulation film IL4, and hence, is not exposed, on the other hand, respective top surfaces of the control gate electrode CG, the memory gate electrode MG, and the gate electrode GE1 are not covered with the insulation film IL4, and are exposed.

Figure 47:
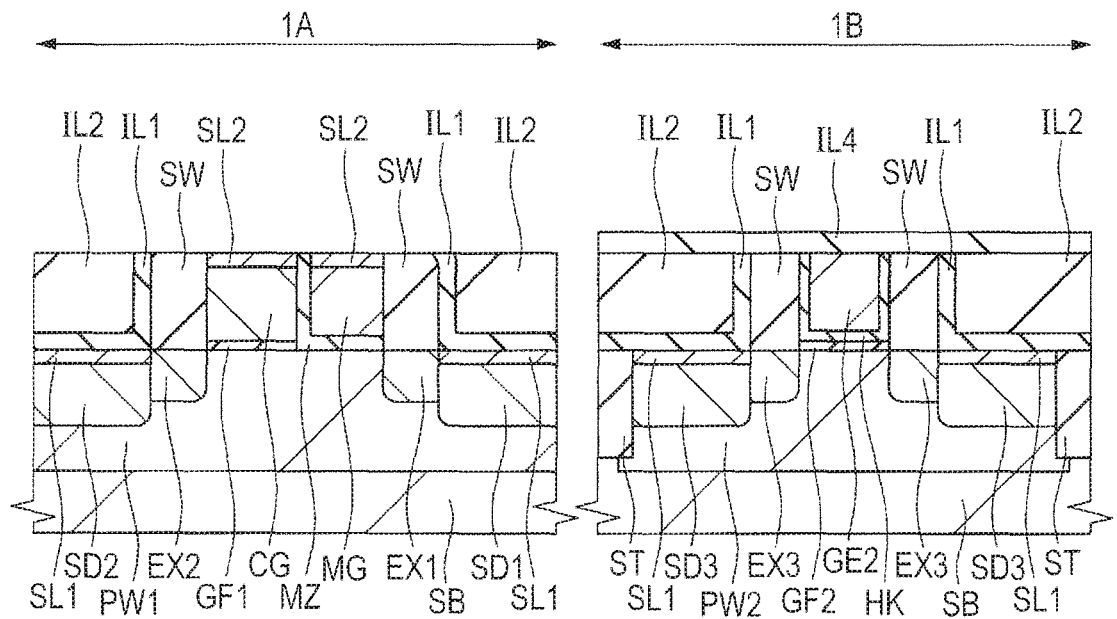
FIG. 47 is an essential part cross sectional view of the semiconductor device during a manufacturing step following FIG. 45.
Figure 48:
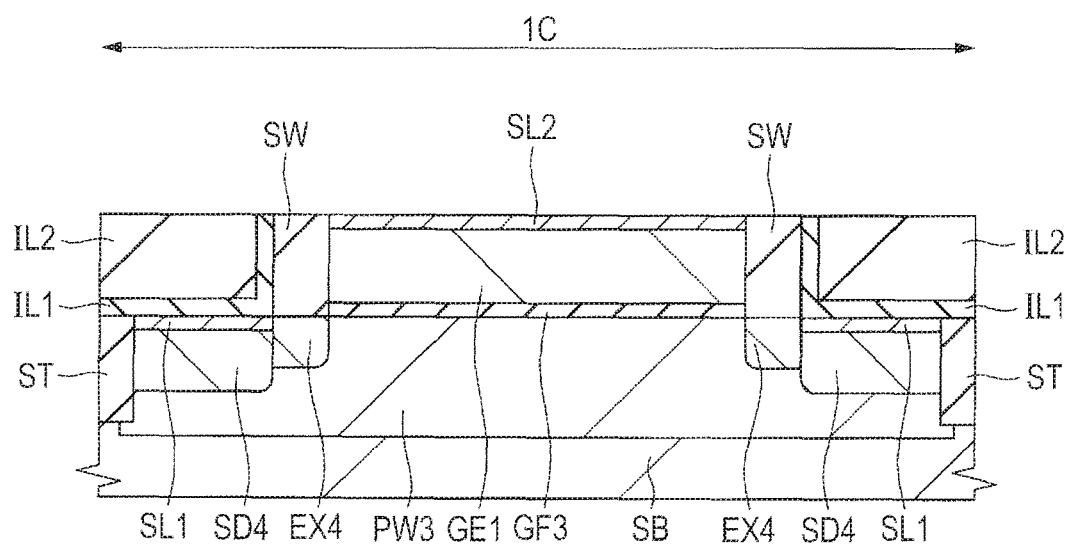
FIG. 48 is an essential part cross sectional view of the same semiconductor device as that of FIG. 47 during a manufacturing step.

Then, as shown in FIGS. 47 and 48, a metal silicide layer SL2 is formed at each top of the control gate electrode CG, the memory gate electrode MG, and the gate electrode GE1 using a salicide technology.

The metal silicide layer SL2 can be specifically formed in the following manner. Namely, over the insulation film IL2 and the insulation film IL4 including over each top surface of the control gate electrode CG, the memory gate electrode MG, and the gate electrode GE1, a metal film for forming the metal silicide layer SL2 is formed. The metal film is formed of, for example, a nickel (Ni) film. Then, the semiconductor substrate SB is subjected to a heat treatment. As a result, each top of the control gate electrode CG, the memory gate electrode MG, and the gate electrode GE1 is allowed to react with the metal film, resulting in the formation of the metal silicide layer SL2. Thereafter, the unreacted portions of the metal film (metal film for forming the metal silicide layer SL2) are removed. FIGS. 47 and 48 each show the cross sectional view at this stage. After removal of the unreacted portions of the metal film, a second heat treatment may be performed. Further, in the present embodiment, a description has been given to the case where the metal silicide layer SL2 is formed at each top of the control gate electrode CG, the memory gate electrode MG, and the gate electrode GE1. However, as another aspect, the metal silicide layer SL2 may not be formed.

Figure 49:
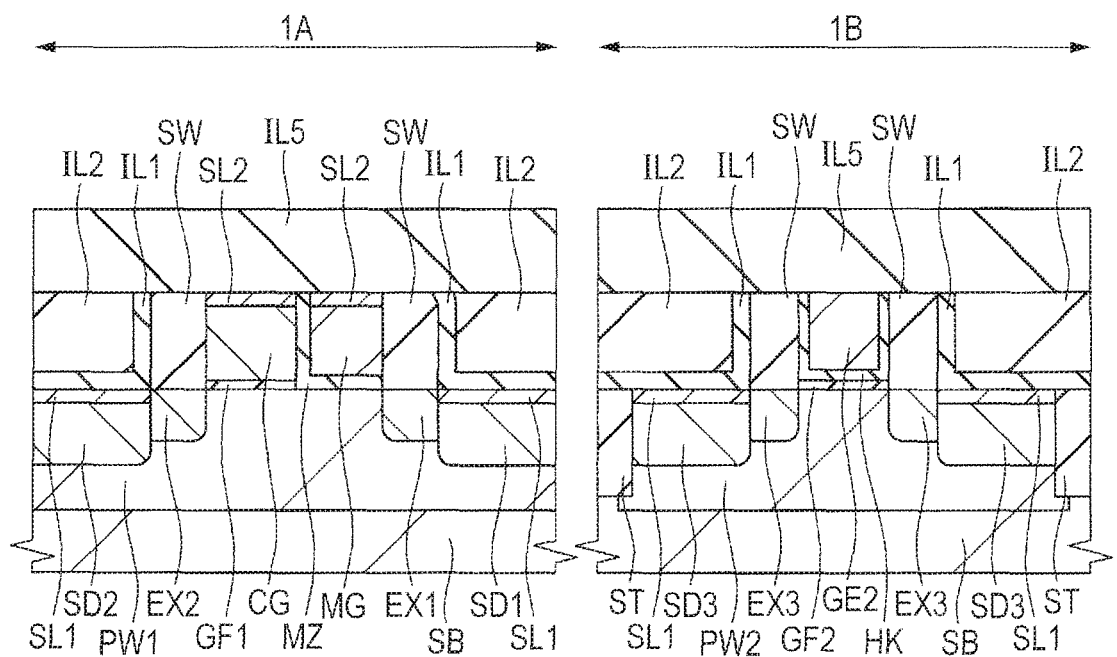
FIG. 49 is an essential part cross sectional view of the semiconductor device during a manufacturing step following FIG. 47.
Figure 50:
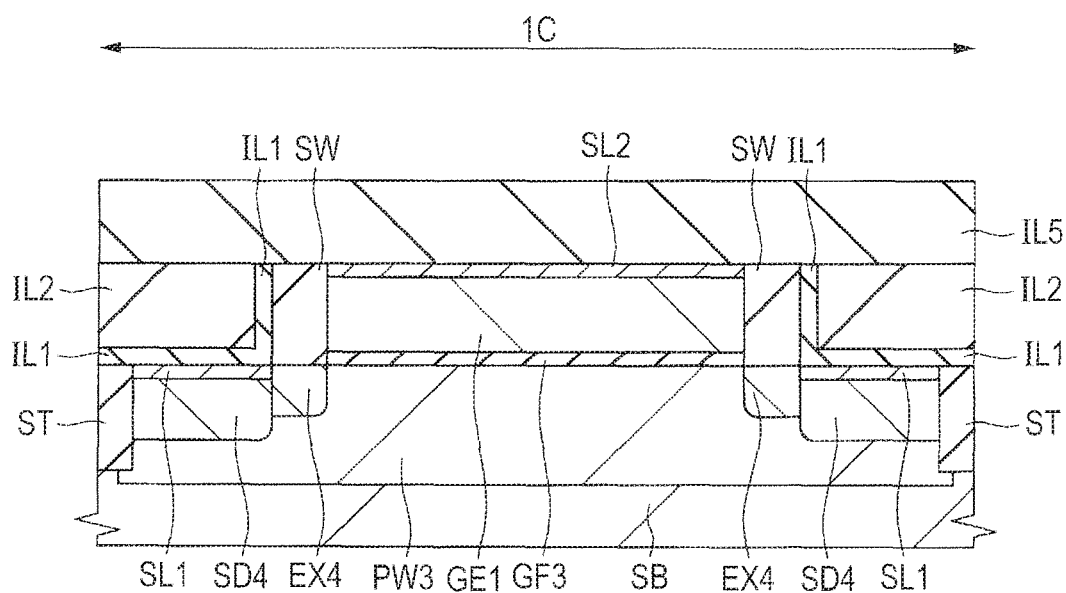
FIG. 50 is an essential part cross sectional view of the same semiconductor device as that of FIG. 49 during a manufacturing step.

Then, as shown in FIGS. 49 and 50, entirely over the main surface of the semiconductor substrate SB, an insulation film (interlayer insulation film) IL5 is formed. Incidentally, FIGS. 49 and 50 each show the case where after removing the insulation film IL4 by etching or the like, an insulation film IL5 is formed over the insulation film IL2. However, as another aspect, without removing the insulation film IL4, the insulation film IL5 can be formed. As the insulation film IL5, for example, an insulation film mainly including silicon oxide can be used. After the formation of the insulation film IL5, the top surface of the insulation film IL5 is polished by a CMP method. By this or other procedures, the flatness of the top surface of the insulation film IL5 can be enhanced.

Figure 51:
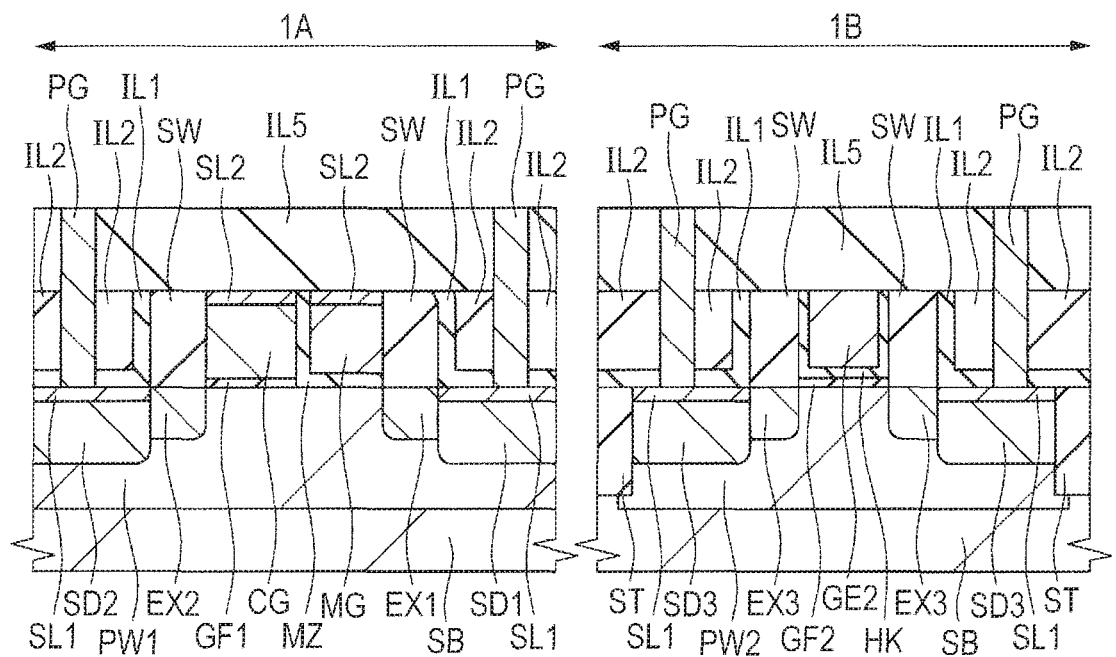
FIG. 51 is an essential part cross sectional view of the semiconductor device during a manufacturing step following FIG. 49.
Figure 52:
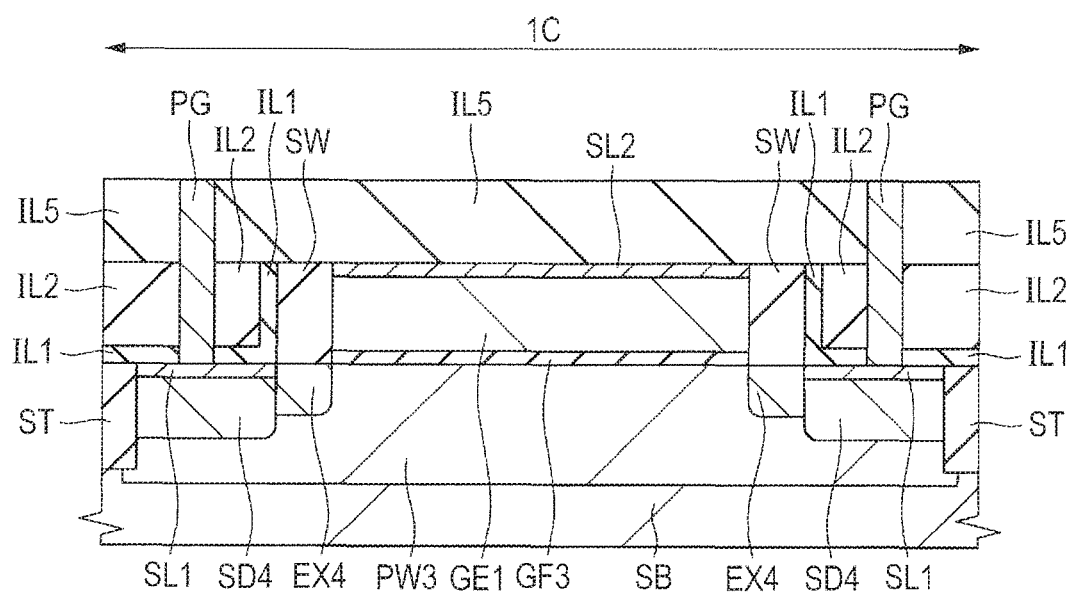
FIG. 52 is an essential part cross sectional view of the same semiconductor device as that of FIG. 51 during a manufacturing step.

Then, using a photoresist pattern (not shown) formed over the insulation film IL5 using a photolithography method as an etching mask, the insulation films IL5, IL2, and IL1 are dry etched. As a result, contact holes are formed in the insulation films IL5, IL2, and IL1. Incidentally, for forming the contact holes, first, the insulation films IL5 and IL2 are dry etched, thereby to form contact holes in the insulation films IL5 and IL2. In addition, the insulation film IL1 is allowed to function as an etching stopper. Thereafter, the insulation film IL1 exposed at the bottom of the contact hole is etched. As a result, a contact hole penetrating through the insulation films IL5, IL2, and IL1 can be formed. The insulation film IL1 is allowed to function as an etching stopper. This can suppress or prevent excessive digging of the contact hole. Then, in the contact hole, as shown in FIGS. 51 and 52, a conductive plug PG formed of tungsten (W) or the like is formed as a coupling conductor part. For example, over the insulation film IL5 including the inside of the contact hole, a barrier conductor film and a tungsten film are sequentially formed. Then, the unnecessary portions of the tungsten film and the barrier conductor film outside the contact hole are removed by a CMP method, an etch back method, or the like. As a result, a plug PG can be formed.

Figure 53:
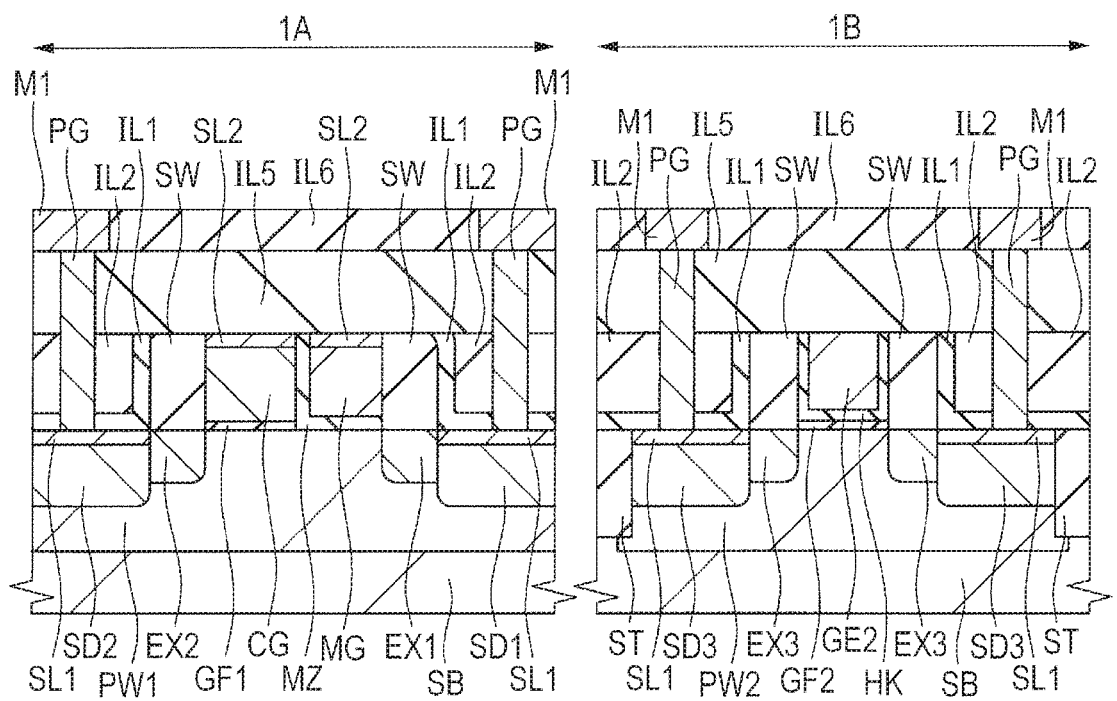
FIG. 53 is an essential part cross sectional view of the semiconductor device during a manufacturing step following FIG. 51.

Then, as shown in FIGS. 53 and 54, an insulation film IL6 is formed over the insulation film IL5 including the plug PG embedded therein. Then, a wire trench is formed in a prescribed region of the insulation film IL6. Then, a wire M1 is embedded in the wire trench using a single damascene technology. The wire M1 is, for example, a copper wire (buried copper wire) including copper as a main component. The wire M1 is electrically coupled with the n$^+$ type semiconductor regions SD1, SD2, SD3, and SD4, the control gate electrode CG, the memory gate electrode MG, the gate electrode GE1, the gate electrode GE2, or the like via the plug PG.

Thereafter, by a dual damascene method, or the like, second, and subsequent-layer wires are formed, but a description thereon is herein omitted. Further, the wire M1 and upper-layer wires are not limited to damascene wires, and can also be formed by patterning a wiring conductor film. For example, a tungsten wire or an aluminum wire is also acceptable.

In the manner up to this point, the semiconductor device of the present embodiment is manufactured.

Regarding a Structure of a Semiconductor Device

Then, the configuration of a memory cell of a nonvolatile memory in the semiconductor device of the present embodiment will be described by reference to FIG. 55.

Figure 55:
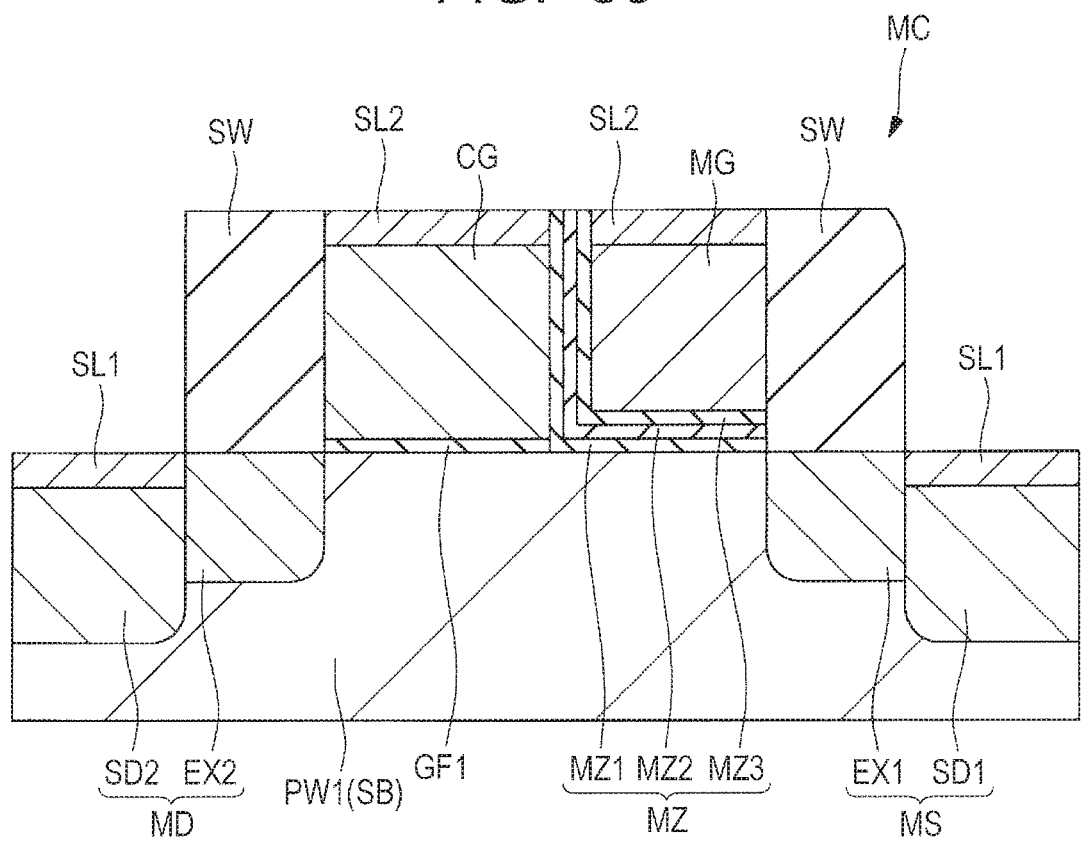
FIG. 55 is an essential part cross sectional view of a semiconductor device of one embodiment.

FIG. 55 is an essential part cross sectional view of the semiconductor device of the present embodiment, where the essential part cross sectional view of the memory cell region 1A is shown. Incidentally, in FIG. 55, for simplification of the drawing, of the structure of FIG. 54, the insulation films IL1 to IL6, the plug PG, and the wire M1 are not shown.

As shown in FIG. 55, in the semiconductor substrate SB, a memory cell MC of a nonvolatile memory formed of a memory transistor and a control transistor is formed. In actuality, in the semiconductor substrate SB, a plurality of memory cells MC are formed in an array. Respective memory cell regions are electrically isolated from other regions by the element isolation region (which corresponds to the element isolation region ST, but is not shown in FIG. 55).

As shown in FIG. 55, the memory cell MC of the nonvolatile memory in the semiconductor device of the present embodiment is a split gate type memory cell, and includes two MISFETs of a control transistor having a control gate electrode CG, and a memory transistor having a memory gate electrode MG coupled with each other.

Herein, a MISFET including the gate insulation film including a charge accumulation part (charge accumulation layer), and the memory gate electrode MG is referred to as a memory transistor. Whereas, a MISFET including a gate insulation film and the control gate electrode CG is referred to as a control transistor. Therefore, the memory gate electrode MG is the gate electrode of the memory transistor, and the control gate electrode CG is the gate electrode of the control transistor. The control gate electrode CG and the memory gate electrode MG are the gate electrodes forming the memory cell of the nonvolatile memory.

Incidentally, the control transistor is a transistor for memory cell selection, and hence can also be regarded as a selection transistor. For this reason, the control gate electrode CG can also be regarded as a selection gate electrode. The memory transistor is a transistor for storage.

Below, a configuration of the memory cell MC will be specifically described.

As shown in FIG. 55, the memory cell MC of the nonvolatile memory has n type semiconductor regions MS and MD for source and drain formed in the p type well PW1 of the semiconductor substrate SB, a control gate electrode CG formed over the semiconductor substrate SB (p type well PW1), and a memory gate electrode MG formed over the semiconductor substrate SB (p type well PW1), and adjacent to the control gate electrode CG. Then, the memory cell MC of the nonvolatile memory further has an insulation film (gate insulation film) GF1 formed between the control gate electrode CG and the semiconductor substrate SB (p type well PW1), and an insulation film MZ formed between the memory gate electrode MG and the semiconductor substrate SB (p type well PW1).

The control gate electrode CG and the memory gate electrode MG extend and are arranged side by side along the main surface of the semiconductor substrate SB with the insulation film MZ interposed between their opposing side surfaces. The direction of extension of the control gate electrode CG and the memory gate electrode MG is the direction perpendicular to the paper plane of FIG. 55 and FIGS. 1 to 54. Incidentally, the direction of extension of the dummy gate electrode DG, the gate electrode GE1, and the gate electrode GE2 is also the direction perpendicular to the paper plane of FIGS. 1 to 54.

The control gate electrode CG and the memory gate electrode MG are formed over the semiconductor substrate SB (p type well PW1) between the semiconductor region MD and the semiconductor region MS via the insulation film GF1 or the insulation film MZ. The memory gate electrode MG is situated on the semiconductor region MS side, and the control gate electrode CG is situated on the semiconductor region MD side. However, the control gate electrode CG and the memory gate electrode MG are formed over the semiconductor substrate SB via the insulation film GF1 and the insulation film MZ, respectively.

The control gate electrode CG and the memory gate electrode MG are adjacent to each other with the insulation film MZ interposed therebetween. The insulation film MZ extends across both the regions of the region between the memory gate electrode MG and the semiconductor substrate SB (p type well PW1), and the region between the memory gate electrode MG and the control gate electrode CG.

The insulation film GF1 formed between the control gate electrode CG and the semiconductor substrate SB (p type well PW1), namely, the insulation film GF1 under the control gate electrode CG functions as the gate insulation film of the control transistor. Further, the insulation film MZ between the memory gate electrode MG and the semiconductor substrate SB (p type well PW1), namely, the insulation film MZ under the memory gate electrode MG functions as the gate insulation film (gate insulation film having a charge accumulation part in the inside thereof) of the memory transistor. Incidentally, the insulation film MZ between the memory gate electrode MG and the semiconductor substrate SB (p type well PW1) functions as the gate insulation film of the memory transistor. The insulation film MZ between the memory gate electrode MG and the control gate electrode CG functions as the insulation film for establishing an insulation (electrical isolation) between the memory gate electrode MG and the control gate electrode CG.

Of the insulation film MZ, the insulation film MZ2 is an insulation film for accumulating electric charges, and functions as a charge accumulation layer (charge accumulation part). For this reason, the insulation film MZ can be regarded as an insulation film having a charge accumulation part (herein, the insulation film MZ2) in the inside thereof. The insulation film MZ3 and the insulation film MZ1 situated over and under the insulation film MZ2, respectively, can function as a charge block layer or a charge confining layer.

The semiconductor region MS and the semiconductor region MD are each a semiconductor region for source or drain. Namely, the semiconductor region MS is a semiconductor region functioning as one of the source region or the drain region, and the semiconductor region MD is a semiconductor region functioning as the other of the source region or the drain region. Herein, the semiconductor region MS is a semiconductor region functioning as the source region, and the semiconductor region MD is a semiconductor region functioning as the drain region. The semiconductor regions MS and MD are each formed of a semiconductor region doped with an n type impurity, and each have a LDD structure. Namely, the semiconductor region MS for the source has an n type semiconductor region EX1 (extension region), and an n$^+$ type semiconductor region SD1 (source region) having a higher impurity density than that of the n$^-$ type semiconductor region EX1. Whereas, the semiconductor region MD for the drain has an n$^-$ type semiconductor region EX2 (extension region), and an n$^+$ type semiconductor region SD2 (drain region) having a higher impurity density than that of the n$^-$ type semiconductor region EX2. The semiconductor region MS is formed at the semiconductor substrate SB at a position adjacent to the memory gate electrode MG in the gate length direction. Whereas, the semiconductor region MD is formed at the semiconductor substrate SB at a position adjacent to the control gate electrode CG in the gate length direction.

Over the sidewalls of the memory gate electrode MG and the control gate electrode CG on the sides thereof not adjacent to each other, sidewall spacers SW formed of an insulator (insulation film) are formed, respectively. The low-density n$^-$ type semiconductor region EX1 is formed under the sidewall spacer SW over the sidewall of the memory gate electrode MG. The high-density n$^+$ type semiconductor region SD1 is formed outside (on the side distant from the channel region) of the low-density n$^-$ type semiconductor region EX1. The low-density n$^-$ type semiconductor region EX2 is formed under the sidewall spacer SW over the sidewall of the control gate electrode CG. The high-density n$^-$ type semiconductor region SD2 is formed outside (on the side distant from the channel region) of the low-density n$^-$ type semiconductor region EX2. The channel region of the memory transistor is formed under the insulation film MZ under the memory gate electrode MG. Whereas, the channel region of the control transistor is formed under the insulation film GF1 under the control gate electrode CG.

At each top of the n$^+$ type semiconductor regions SD1 and SD2, a metal silicide layer SL1 is formed by a salicide technology, or the like. At the top of the memory gate electrode MG, and the top of the control gate electrode CG, metal silicide layers SL2 are formed by a salicide technology, or the like.

Regarding the operation of a nonvolatile memory

Then, the operation example of a nonvolatile memory will be described by reference to FIG. 56.

FIG. 56 is a table showing one example of the application conditions of voltages to respective sites of a selection memory cell at the times of "write", "erase", and "read" of the present embodiment. The table of FIG. 56 describes the voltage Vmg to be applied to the memory gate electrode MG, the voltage Vs to be applied to the source region (semiconductor region MS), the voltage Vcg to be applied to the control gate electrode CG, and the voltage Vd to be applied to the drain region (semiconductor region MD) of the memory cell MC selected at respective times of "write", "erase", and "read". Incidentally, those shown in the table of FIG. 56 are preferable examples of the application conditions of voltages, and are not exclusive, and may be variously changed, if required. Further, in the present embodiment, implantation of electrons into the insulation film MZ2 of the charge accumulation part in the insulation film MZ of the memory transistor is defined as "write", and implantation of holes thereinto is defined as "erase".

Incidentally, in the table of FIG. 56, the row A corresponds to the case where the write method is a SSI method, and the erase method is a BTBT method; the row B corresponds to the case where the write method is a SSI method, and the erase method is a FN method; the row C corresponds to the case where the write method is a FN method, and the erase method is a BTBT method; and the row D corresponds to the case where the write method is a FN method, and the erase method is a FN method.

The write methods include a write method in which write is performed by hot electron implantation by source side implantation referred to as a so-called SSI (Source Side Injection) method, and a write method in which write is performed by FN (Fowler Nordheim) tunneling referred to as a so-called FN method.

For write of the SSI method, for example, the voltages as shown in "Write operation voltage" of the row A or the row B of the table of FIG. 56 are applied to respective sites of the selection memory cell to perform write; thus, electrons are implanted into the insulation film MZ2 in the insulation film MZ of the selection memory cell, thereby to perform write. At this step, hot electrons are generated in the channel region under the region between the memory gate electrode MG and the control gate electrode CG (between the source and the drain). Thus, hot electrons are implanted into the insulation film MZ2 of the charge accumulation part in the insulation film MZ under the memory gate electrode MG. The implanted hot electrons are trapped by the trap level in the insulation film MZ2. As a result, the threshold voltage of the memory transistor increases. Namely, the memory transistor is rendered in a write state.

For write of the FN method, for example, the voltages as shown in "Write operation voltage" of the row C or the row D of the table of FIG. 56 are applied to respective sites of the selection memory cell to perform write; thus, in the selection memory cell, electrons are tunneled from the memory gate electrode MG, and implanted into the insulation film MZ2 in the insulation film MZ, thereby to perform write. At this step, electrons are tunneled from the memory gate electrode MG through the insulation film MZ3 by the FN tunneling effect, are implanted into the insulation film MZ, and are trapped by the trap level in the insulation film MZ. As a result, the threshold voltage of the memory transistor increases. Namely, the memory transistor is rendered in a write state.

The erase methods include an erase method in which erase is performed by hot hole implantation due to BTBT (Band-To-Band Tunneling phenomenon) referred to as a so-called BTBT method, and an erase method in which erase is performed by FN tunneling referred to as a so-called FN method.

For erase of the BTBT method, holes generated by BTBT are implanted into the insulation film MZ2 in the insulation film MZ from the semiconductor substrate SB side, thereby to perform erase. For example, the voltages as shown in "Erase operation voltage" of the row A or the row C of the table of FIG. 56 are applied to respective sites of the selection memory cell to perform erase. As a result, holes are generated by a BTBT phenomenon, and are accelerated under an electric field. Thus, holes are implanted into the insulation film MZ2 in the insulation film MZ of the selection memory cell. This reduces the threshold voltage of the memory transistor. Namely, the memory transistor is rendered in an erase state.

For erase of the FN method, for example, the voltages as shown in "Erase operation voltage" of the row B or the row D of the table of FIG. 56 are applied to respective sites of the selection memory cell to perform erase; thus, in the selection memory cell, holes are tunneled from the memory gate electrode MG, and implanted into the insulation film MZ2 in the insulation film MZ, thereby to perform erase. At this step, holes are tunneled from the memory gate electrode MG through the insulation film MZ3 by the FN tunneling effect, are implanted into the insulation film MZ, and are trapped by the trap level in the insulation film MZ2. This reduces the threshold voltage of the memory transistor. Namely, the memory transistor is rendered in an erase state.

At the time of read, for example, the voltages as shown in "Read operation voltage" in the row A, the row B, the row C, or the row D of the table of FIG. 56 are applied to respective sites of the selection memory cell to perform read. The voltage Vmg to be applied to the memory gate electrode MG at the time of read is set at a value between the threshold voltage of the memory transistor in a write state and the threshold voltage thereof in an erase state. As a result, it is possible to discriminate the write state and the erase state.

Regarding the Details of Study

The present inventors have conducted a study on a semiconductor device in which the memory cell of a nonvolatile memory, and the MISFET for a peripheral circuit are formed at the same semiconductor substrate.

When a metal gate electrode is applied to the gate electrode in the MISFET for a peripheral circuit, it is possible to obtain an advantage of allowing the suppression of the depletion phenomenon of the gate electrode, and elimination of the parasitic capacitance. Further, it is also possible to obtain an advantage of allowing the improvement of the short channel effect when the gate length of the gate electrode is reduced. Furthermore, selection of respective materials for the metal gate electrode and the high dielectric constant gate insulation film enables the adjustment of the threshold voltage of the MISFET.

However, from the viewpoint of the reliability, a silicon gate electrode with a longer-term use performance is more likely to be ensured in reliability than a metal gate electrode. For this reason, a study has been conducted on the application of a silicon gate electrode to the memory gate electrode and the control gate electrode forming a nonvolatile memory demanded to have a high level of reliability. Further, a study has been conducted on the application of a silicon gate electrode to the gate electrode for a MISET (e.g., high breakdown voltage MISFET) demanded to have a high level of reliability also in the MISFET for a peripheral circuit.

For this reason, the present inventors have conducted a study on a semiconductor device in which the memory cell of a nonvolatile memory having a silicon gate electrode, the MISFET (low breakdown voltage MISFET) for a peripheral circuit having a metal gate electrode, and the MISFET (high breakdown voltage MISFET) for a peripheral circuit including a silicon gate electrode are formed at the same semiconductor substrate. In other words, a study has been conducted on the following: a silicon gate electrode is applied to the control gate electrode CG and the memory gate electrode MG forming the memory cell of the nonvolatile memory; a silicon gate electrode is applied to the gate electrode GE1 for a high breakdown voltage MISFET; and a metal gate electrode is applied to the gate electrode GE2 for a low breakdown voltage MISFET.

For manufacturing such a semiconductor device, the gate electrode (the gate electrode GE2) to which a metal gate electrode is applied may be formed by a so-called gate-last process, and the gate electrode (the control gate electrode CG, the memory gate electrode MG, and the gate electrode GE1) to which a metal gate electrode is not applied may be formed by a so-called gate-first process. With the gate-first process, the gate electrode for sue in the completed product is formed, and then, semiconductor regions for source/drain are formed. On the other hand, with the gate-last process, a dummy gate electrode is once formed. Then, semiconductor regions for source/drain are formed. Thereafter, the dummy gate electrode is removed. In the removal region, an actual gate electrode for use in the completed product is formed. Namely, the gate-last process includes a step of removing the dummy gate electrode, and replacing the dummy gate electrode with a gate electrode for actual use. For this reason, when the control gate electrode CG, the memory gate electrode MG, and the gate electrode GE1 to which a metal gate electrode is not applied are formed by the gate-first process, and the the gate electrode GE2 to which a metal gate electrode is applied is formed by the gate-last process, the dummy gate electrode (the dummy gate electrode DG) is required to be removed, and to be replaced with a gate electrode (the gate electrode GE2) for actual use.

In order to replace the dummy gate electrode DG with the gate electrode GE2, after the formation of an interlayer insulation film, the interlayer insulation film is required to be polished, thereby to expose the dummy gate electrode DG. At this step, the control gate electrode CG, the memory gate electrode MG, and the gate electrode GE1 formed by the gate-first process are also exposed. A study by the present inventors indicated that a defective condition may be caused in the polishing step of the interlayer insulation film. This will be hereinafter described by reference to FIGS. 57 to 60.

FIGS. 57 to 60 are each an essential part cross sectional view of a semiconductor device of Study Example studied by the the present inventors during a manufacturing step.

Figure 57:
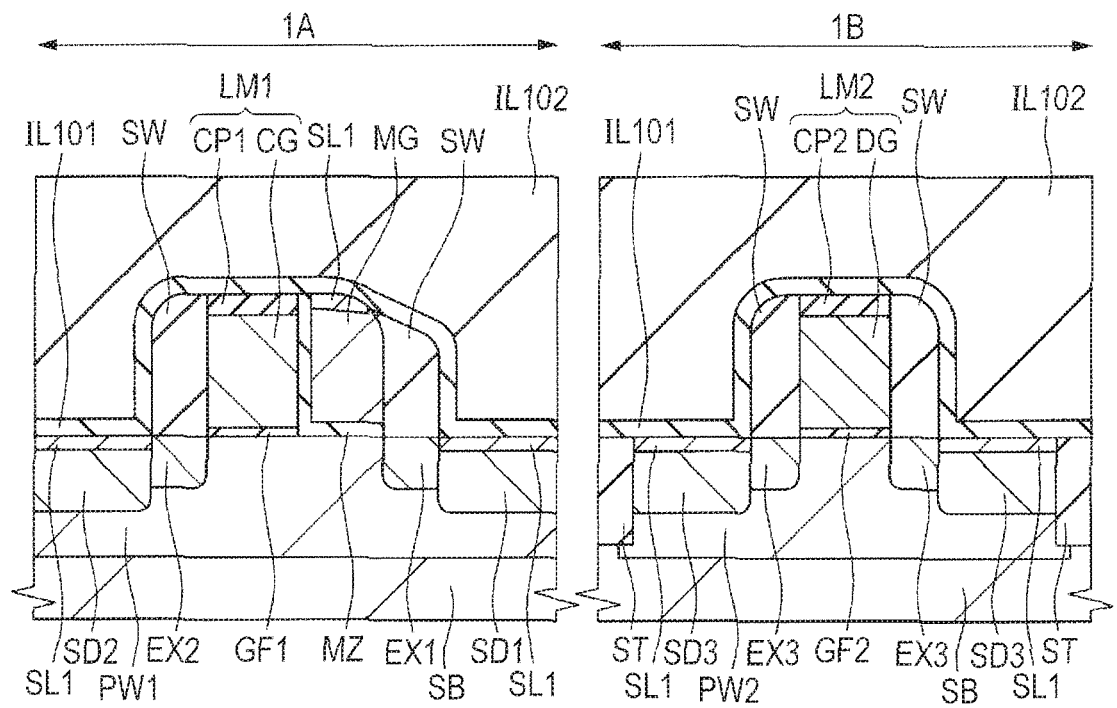
FIG. 57 is an essential part cross sectional view of a semiconductor device of Study Example during a manufacturing step.
Figure 58:
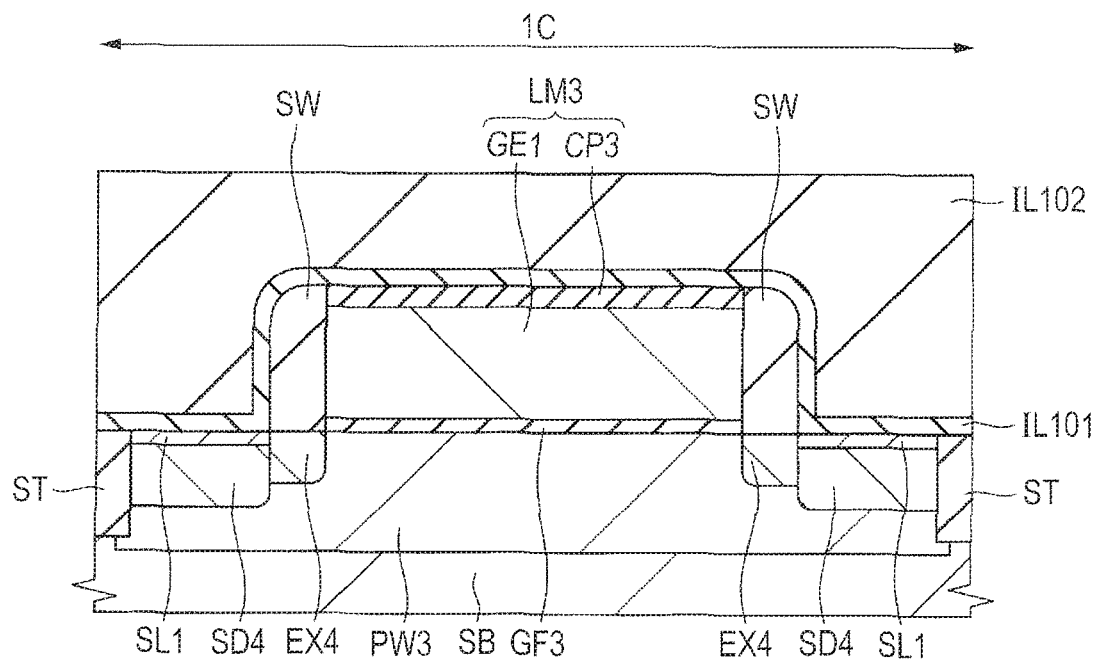
FIG. 58 is an essential part cross sectional view of the same semiconductor device as that of FIG. 57 during a manufacturing step.

Also in the manufacturing steps of the semiconductor device of Study Example, the steps up to the metal silicide layer SL1 formation step are performed in the same manner as in the present embodiment, resulting in the structure of FIGS. 23 and 24. Then, as shown in FIGS. 57 and 58, entirely over the main surface of the semiconductor substrate SB, an insulation film IL101 and an insulation film IL102 are sequentially formed in such a manner as to cover the memory gate electrode MG, the lamination bodies LM1, LM2, and LM3, and the sidewall spacers SW. The insulation film IL101 corresponds to the insulation film IL1, and is formed of, for example, a silicon nitride film. The insulation film IL102 corresponds to the insulation film IL2, is thicker than the insulation film IL101, and is formed of, for example, a silicon oxide film. Incidentally, in the case of the manufacturing steps of Study Example, the steps of FIGS. 25 to 30 in the present embodiment are not performed. After obtaining the structure of FIGS. 23 and 24, as shown in FIGS. 57 and 58, a lamination film formed of the insulation film IL101 and the insulation film IL102 is formed. Namely, in the case of the manufacturing steps of Study Example, the photoresist pattern PR1 formation step, the etching step of FIGS. 27 and 28, and the etching step of FIGS. 29 and 30 are not performed.

Figure 59:
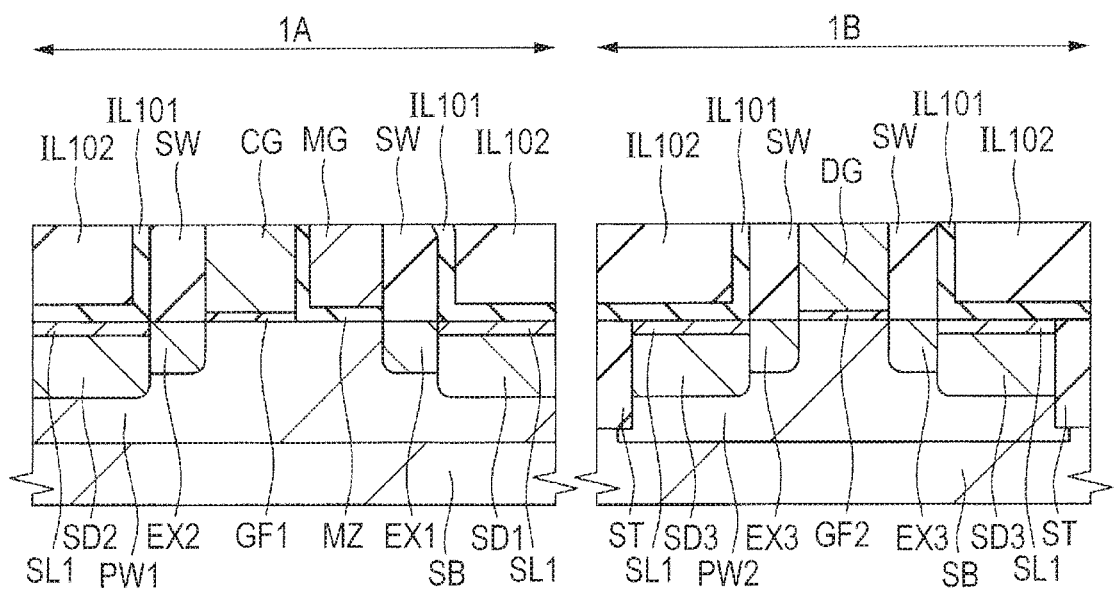
FIG. 59 is an essential part cross sectional view of the semiconductor device during a manufacturing step following FIG. 57.
Figure 60:
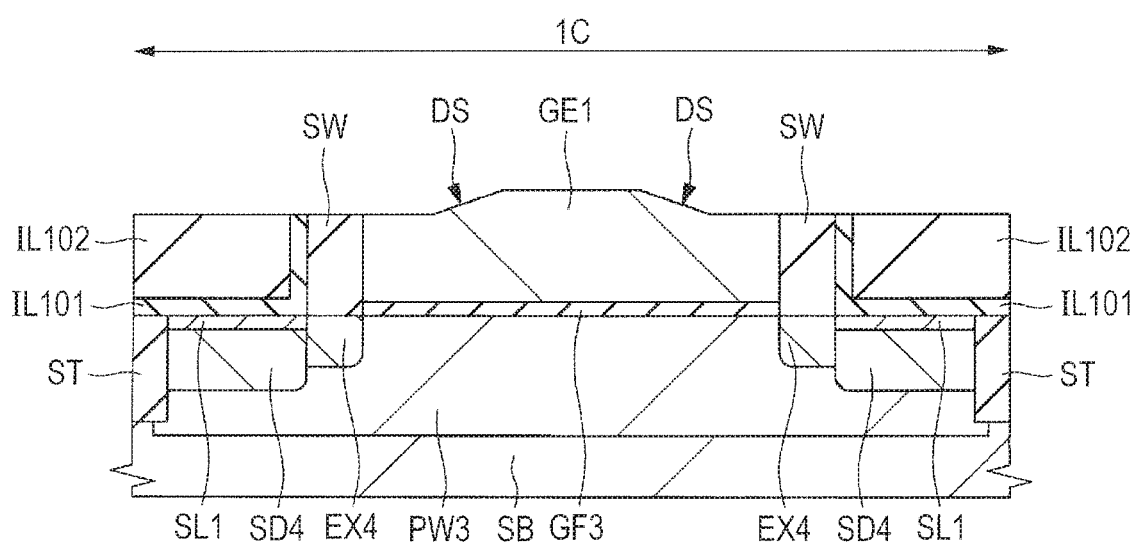
FIG. 60 is an essential part cross sectional view of the same semiconductor device as that of FIG. 59 during a manufacturing step.

Then, in the manufacturing steps of the semiconductor device of Study Example, as shown in FIGS. 59 and 60, the top surface of the insulation film IL102 is polished using a CMP method. The step will be hereinafter referred to as "the polishing step of FIGS. 59 and 60". The the polishing step of FIGS. 59 and 60 exposes each top surface of the memory gate electrode MG, the control gate electrode CG, the dummy gate electrode DG, and the gate electrode GE1.

With the polishing step of FIGS. 59 and 60, each insulation film IL101 over the memory gate electrode MG, and over the cap insulation films CP1, CP2, and CP3 is also polished, and is removed. Further, the cap insulation films CP1, CP2, and CP3 are also polished, and are removed. Furthermore, the top of each sidewall spacer SW can also be polished. When the metal silicide layer SL1 is formed at the top of the memory gate electrode MG, the polishing step of FIGS. 59 and 60 also polishes and removes the metal silicide layer SL1 at the top of the memory gate electrode MG.

Thereafter, also in the manufacturing steps of the semiconductor device of Study Example, the steps as described by reference to FIGS. 37 to 54 are performed, but herein are not shown and are not described.

With the polishing step of FIGS. 59 and 60, the insulation films IL102 and IL101 are mainly polished. In addition, the cap insulation films CP1, CP2, and CP3 are also polished, and further, the memory gate electrode MG, the control gate electrode CG, the dummy gate electrode DG, and the gate electrode GE1 are also polished. Namely, when at the stage upon completion of the polishing step of FIGS. 59 and 60, each top surface of the memory gate electrode MG, the control gate electrode CG, the dummy gate electrode DG, and the gate electrode GE1 is tried to be exposed, in the polishing step of FIGS. 59 and 60, the memory gate electrode MG, the control gate electrode CG, the dummy gate electrode DG, and the gate electrode GE1 are also polished to a certain extent.

Further, when the occupancy rate of the gate electrode varies among the memory cell region 1A, the low breakdown voltage MIS region 1B, and the high breakdown voltage MIS region 1C, the polishing time required for the gate electrode to be exposed differs among the memory cell region 1A, the low breakdown voltage MIS region 1B, and the high breakdown voltage MIS region 1C. Namely, the polishing time required for the gate electrode to be exposed differs between the region with a large occupancy rate of the gate electrode and the region with a small occupancy rate thereof. Herein, the occupancy rate of gate electrode corresponds to the rate of the area of the gate electrode occupying the whole area in a plan view. For this reason, when, in the polishing step of FIGS. 59 and 60, the top surfaces of the gate electrodes (CG, MG, GE1, and DG) are tried to be exposed in all the regions of the memory cell region 1A, the low breakdown voltage MIS region 1B, and the high breakdown voltage MIS region 1C, the polishing time is required to be set excessively to a certain degree. This results in that the control gate electrode CG, the dummy gate electrode DG, and the gate electrode GE1 are also polished to a certain degree.

Whereas, when the metal silicide layer SL1 is formed at the top of the memory gate electrode MG, in the polishing step of FIGS. 59 and 60, the metal silicide layer SL1 at the top of the memory gate electrode MG is also required to be polished, and removed. For this reason, the polishing time is required to be set so that the metal silicide layer SL1 at the top of the memory gate electrode MG is removed with reliability. Accordingly, when the metal silicide layer SL1 at the top of the memory gate electrode MG is tried to be removed with reliability in the polishing step of FIGS. 59 and 60, the control gate electrode CG, the dummy gate electrode DG, and the gate electrode GE1 are polished to a certain degree.

Therefore, in the polishing step of FIGS. 59 and 60, the control gate electrode CG, the memory gate electrode MG, the dummy gate electrode DG, and the gate electrode GE1 are also polished to a certain degree. For example, in the polishing step of FIGS. 59 and 60, each polishing amount (polishing thickness) of the control gate electrode CG, the memory gate electrode MG, the dummy gate electrode DG, and the gate electrode GE1 is set at, for example, about 20 nm, thereby to design the polishing time.

However, in the polishing step of FIGS. 59 and 60, it is the insulation films (the insulation films IL102 and IL101, the cap insulation films CP1, CP2, and CP3, and the sidewall spacers SW) that are mainly polished. Accordingly, a polishing solution (polishing slurry) appropriate to polish the insulation films is used. This results in the use of a polishing solution such that the polishing rate of the silicon film (the control gate electrode CG, the memory gate electrode MG, the dummy gate electrode DG, and the gate electrode GE1) is lower than that of the insulation films (the insulation films IL102 and IL101, the cap insulation films CP1, CP2, and CP3, and the sidewall spacers SW) in the polishing step of FIGS. 59 and 60.

For this reason, upon performing the polishing step of FIGS. 59 and 60, for the gate electrode GE1 with a larger gate length, of the control gate electrode CG, the memory gate electrode MG, the dummy gate electrode DG, and the gate electrode GE1, the flatness of the top surface may be reduced, thereby to cause a step difference DS in the top surface. This is due to the larger gate length of the gate electrode GE1.

Herein, the gate electrode GE1 is a high breakdown voltage MISFET, and the gate length of the gate electrode GE1 is considerably large. Specifically, the gate length of the gate electrode GE1 is larger than the gate length of the control gate electrode CG, and is, for example, 300 nm or more.

In the polishing step of FIGS. 59 and 60, the vicinity of the corner part of each gate electrode (CG, MG, DG, or GE1) tends to be cut away. Namely, with the polishing step, the corner part of the to-be-polished object tends to be cut away. For this reason, even when a polishing solution with a low polishing rate of a silicon film is used in the polishing step of FIGS. 59 and 60, the vicinity of the corner part of each gate electrode (CG, MG, DG, or GE1) tends to be cut away following cutting away of the surrounding insulation film. However, the portion of the top surface of each gate electrode (CG, MG, DG, or GE1) at a position distant from the corner part (end) becomes less likely to be cut away than the vicinity of the corner part (end).

For this reason, in the gate electrode GE1 with a large gate length, the vicinity of the corner part (i.e., the vicinity of the end of the top surface) tends to be cut away, and the portion at a position distant from the corner part (i.e., the vicinity of the center of the top surface) is less likely to be cut away. Reflecting this fact, the polishing step of FIGS. 59 and 60 is performed. Then, the flatness of the top surface of the gate electrode GE1 is reduced, resulting in the formation of a step difference DS. Namely, at the stage upon completion of the polishing step of FIGS. 59 and 60, as shown in FIG. 60, the top surface of the gate electrode GE1 is more raised at the central part (the central part in the gate length direction) than at the end (the end in the gate length direction).

On the other hand, each gate length of the control gate electrode CG, the memory gate electrode MG, and the dummy gate electrode DG is not so large as the gate length of the gate electrode GE1. For this reason, for the gate electrodes with a small gate length (the control gate electrode CG, the memory gate electrode MG, and the dummy gate electrode DG), the central part (the central part in the gate length direction) of the top surface of the gate electrode is not distant from the corner part so much. Accordingly, in the polishing step of FIGS. 59 and 60, the entire top surface of the gate electrode is almost uniformly cut away. For this reason, at the stage upon completion of the polishing step of FIGS. 59 and 60, as shown in FIG. 59, for the control gate electrode CG, the memory gate electrode MG, and the dummy gate electrode DG with a small gate length, the flatness of the top surface is relatively higher, which prevents the formation of a step difference in the top surface. This also applies to the polishing step of FIGS. 35 and 36.

Therefore, in the case of Study Example, the polishing step of FIGS. 59 and 60 is performed, thereby to expose respective top surfaces of the control gate electrode CG, the memory gate electrode MG, the dummy gate electrode DG, and the gate electrode GE1. Then, respective top surfaces of the control gate electrode CG, the memory gate electrode MG, and the dummy gate electrode DG with a small gate length becomes nearly flat, but the top surface of the gate electrode GE1 with a large gate length is reduced in flatness, resulting in the formation of the step difference DS.

The formation of the step difference DS in the top surface of the gate electrode GE1 with a large gate length may cause various defective conditions in the subsequent steps. As a result, the reliability of the semiconductor device is degraded. Alternatively, the manufacturing yield of semiconductor devices is reduced. Still alternatively, the control of the manufacturing steps of the semiconductor devices becomes more difficult. For example, when the step difference DS is present in the top surface of the gate electrode GE1, a step difference reflecting the presence of the step difference DS is also formed in the top surface of the insulation film IL3. This may cause generation of a polishing residue of the metal film ME upon polishing the metal film ME.

For this reason, in order to improve the reliability and the manufacturing yield of the semiconductor device, the following is desired: when the interlayer insulation film is polished, thereby to expose each top surface of the control gate electrode CG, the memory gate electrode MG, the dummy gate electrode DG, and the gate electrode GE1, the flatness of the top surface of the gate electrode GE1 with a large gate length is enhanced, which prevents the formation of a kind of the step difference DS in the top surface of the gate electrode GE1.

Regarding Main Features and Effects

A semiconductor device of the present embodiment includes the memory cell of the nonvolatile memory formed in a memory cell region 1A, a low breakdown voltage MISFET (second MISFET) formed in a low breakdown voltage MIS region 1B, and a high breakdown voltage MISFET (first MISFET) formed in a high breakdown voltage MIS region 1C.

The manufacturing steps of the semiconductor device of the present embodiment have steps (FIGS. 3 to 20) of forming a control gate electrode CG (first gate electrode) via an insulation film GF1, forming a memory gate electrode MG (second gate electrode) via an insulation film MZ, forming a gate electrode GE1 (third gate electrode) via an insulation film GF3, and forming a dummy gate electrode DG via an insulation film GF2 over a semiconductor substrate SB. Herein, the insulation film MZ is an insulation film having a charge accumulation part in the inside thereof, and the gate electrode GE1 is a gate electrode for the high breakdown voltage MISFET (first MISFET). The gate length of the gate electrode GE1 is larger than the gate length of the control gate electrode CG. The manufacturing steps of the semiconductor device further have a step of forming an insulation film IL1 (fifth insulation film) in such a manner as to cover the control gate electrode CG, the memory gate electrode MG, the gate electrode GE1, and the dummy gate electrode DG (FIGS. 25 and 26). The manufacturing steps of the semiconductor device further have a step of forming an opening OP2 exposing a part the gate electrode GE1 in the insulation film IL1 (FIGS. 27 and 28), and a step of etching the gate electrode GE1 exposed from the opening OP2, and reducing the height of the top surface of the portion of the gate electrode GE1 exposed from the opening OP2 (FIGS. 29 and 30). The manufacturing steps of the semiconductor device furthermore have a step of forming an insulation film IL2 (sixth insulation film) over the insulation film IL1 in such a manner as to cover the portion of the gate electrode GE1 exposed from the opening OP2 (FIGS. 33 and 34), and a step of polishing the insulation film IL2 and the insulation film IL1, and thereby exposing the control gate electrode CG, the memory gate electrode MG, the gate electrode GE1, and the dummy gate electrode DG (FIGS. 35 and 36). The manufacturing steps of the semiconductor device still further have a step of removing the dummy gate electrode DG (FIGS. 37 to 40), and a step of forming a gate electrode GE2 (fourth gate electrode) in a trench TR of the region from which the dummy gate electrode DG has been removed (FIGS. 41 to 44). Herein, the gate electrode GE2 is the gate electrode for the low breakdown voltage MISFET (second MISFET).

One of the main features of the present embodiment is the following. Namely, after forming the insulation film IL1, and before forming the insulation film IL2, the step of forming the opening OP2 exposing a part of the gate electrode GE1 in the insulation film IL1 (the etching step of FIGS. 27 and 28), and the step of etching the gate electrode GE1 exposed from the opening OP2, and reducing the height of the top surface of the portion of the gate electrode GE1 exposed from the opening OP2 (the etching step of FIGS. 29 and 30) are performed. Another of the main features of the present embodiment is that the gate length of the gate electrode GE1 is larger than the gate length of the control gate electrode CG.

In the present embodiment, the insulation film IL1 and the insulation film IL2 are formed in such a manner as to cover the control gate electrode CG, the memory gate electrode MG, the gate electrode GE1, and the dummy gate electrode DG. The insulation films IL2 and IL1 are polished with the polishing step of FIGS. 35 and 36, thereby to expose the control gate electrode CG, the memory gate electrode MG, the gate electrode GE1, and the dummy gate electrode DG. This point is similar to that of the Study Example. However, in the present embodiment, after forming the insulation film IL1, and before forming the insulation film IL2, the etching step of FIGS. 27 and 28, and the etching step of FIGS. 29 and 30 are performed. As a result, it is possible to enhance the flatness of the top surface of the gate electrode GE1 at the stage upon completion of the polishing step of FIGS. 35 and 36. The reason for this will be described below.

In the present embodiment, the insulation film IL1 is formed in such a manner as to cover the control gate electrode CG, the memory gate electrode MG, the gate electrode GE1, and the dummy gate electrode DG. Then, by the etching step of FIGS. 27 and 28, the opening OP2 exposing a part of the gate electrode GE1 is formed in the insulation film IL1. Then, by the etching step of FIGS. 29 and 30, the gate electrode GE1 exposed from the opening OP2 is etched, thereby to reduce the height of the top surface of the portion of the gate electrode GE1 exposed from the opening OP2. Thereafter, the insulation film IL2 is formed. However, at this stage, the height position of the top surface of the gate electrode GE1 differs between the Study Example (FIGS. 57 and 58) and the present embodiment (FIGS. 33 and 34). Namely, the height position of the top surface of the portion of the gate electrode GE1 exposed from the opening OP2 in FIG. 34 is lower than the height position of the top surface of the gate electrode GE1 in FIG. 58. For this reason, the polishing step of FIGS. 35 and 36 of the present embodiment can reduce the polishing area of the gate electrode GE1 more than the polishing step of FIGS. 59 and 60 of the Study Example. For this reason, the flatness of the top surface of the gate electrode GE1 can be enhanced more, and it becomes easier to prevent the formation of the step difference DS as shown in FIG. 60 at the top surface of the gate electrode GE1 at the stage upon completion of the the polishing step of FIGS. 35 and 36 of the present embodiment than at the stage upon completion of the polishing step of FIGS. 59 and 60 of the Study Example.

Further, in the present embodiment, by the etching step of FIGS. 29 and 30, the height of the top surface of the portion of the gate electrode GE1 exposed from the opening OP2 is reduced. As a result, a step difference is formed at a position of the top surface of the gate electrode GE1 overlapping the outer periphery (sidewall) of the opening OP2 in a plan view. Therefore, the corner part is formed at a position overlapping the outer periphery (sidewall) of the opening OP2 in a plan view. In other words, the etching step of FIGS. 27 and 28 and the etching step of FIGS. 29 and 30 are performed. This produces not only an effect of reducing the polishing area itself of the gate electrode GE1 in the polishing step of FIGS. 35 and 36, but also the effect of forcedly forming the corner part (increasing the corner part) at the top surface of the gate electrode GE1.

As described above, with the polishing step, the corner part of the to-be-polished object tends to be cut away. For this reason, even when, in the polishing step of FIGS. 35 and 36, a polishing solution with a low polishing rate of a silicon film is used, the vicinity of the corner part of the top surface of the gate electrode GE1 tends to be cut away following cutting away of the surrounding insulation film. In the present embodiment, the etching step of FIGS. 27 and 28 and the etching step of FIGS. 29 and 30 are performed. This results in the forced formation of (increase in) the corner part at the top surface of the gate electrode GE1. This causes a difficulty in formation of the site of the top surface of the gate electrode GE1 which becomes less likely to be cut away because of being distant from the corner part in the polishing step of FIGS. 35 and 36. For this reason, at the stage upon completion of the polishing step of FIGS. 35 and 36, the flatness of the top surface of the gate electrode GE1 can be enhanced. This can suppress or prevent the formation of the step difference DS as shown in FIG. 60 at the top surface of the gate electrode GE1.

In other words, in the case of the Study Example, in the polishing step of FIGS. 59 and 60, the large-area flat top surface of the gate electrode GE1 is required to be polished. As a result, at the top surface of the gate electrode GE1, the gate electrode GE1 tends to be cut away in the vicinity of the corner part, but the gate electrode GE1 is hardly cut away at a position distant from the corner part (i.e., the central part of the top surface of the gate electrode GE1). This results in the formation of the step difference DS as shown in FIG. 60 at the top surface of the gate electrode GE1 at the stage upon completion of the polishing step of FIGS. 59 and 60.

In contrast, in the present embodiment, by performing the etching step of FIGS. 27 and 28 and the etching step of FIGS. 29 and 30, it is possible to reduce the polishing area of the gate electrode GE1 in the polishing step of FIGS. 35 and 36. Further, it is possible to increase the corner part at the top surface of the gate electrode GE1. Accordingly, a site of the top surface of the gate electrode GE1 which is less likely to be polished is hard to be generated. For this reason, at the stage upon completion of the polishing step of FIGS. 35 and 36, the flatness of the top surface of the gate electrode GE1 can be enhanced. This can suppress or prevent the formation of the step difference DS as shown in FIG. 60 at the top surface of the gate electrode GE1.

Further, for the control gate electrode CG, the memory gate electrode MG, and the dummy gate electrode DG with a small gate length, as in the case of the polishing step of FIGS. 59 and 60, also in the polishing step of FIGS. 35 and 36, the entire top surface of the gate electrode is almost uniformly cut away. For this reason, at the stage upon completion of the polishing step of FIGS. 35 and 36, as shown in FIG. 35, for the control gate electrode CG, the memory gate electrode MG, and the dummy gate electrode DG with a small gate length, the flatness of the top surface is relatively higher, which prevents the formation of the step difference at the top surface.

For this reason, in the present embodiment, not only for the control gate electrode CG, the memory gate electrode MG, and the dummy gate electrode DG with a small gate length, but also for the gate electrode GE1 with a large gate length, at the stage upon completion of the polishing step of FIGS. 35 and 36, the flatness of the top surface of the gate electrode can be enhanced. Accordingly, the steps after the polishing step of FIGS. 35 and 36 becomes more likely to be performed. Therefore, the reliability of the semiconductor device can be improved. Further, the manufacturing yield of the semiconductor device can be improved. Still further, the control of the manufacturing steps of the semiconductor device becomes easy.

Further, the manufacturing steps of the present embodiment are effective not only for the case where the gate length of the dummy gate electrode DG is small, but also for the case where the gate length of the dummy gate electrode DG is large. This is due to the following: when the gate length of the dummy gate electrode DG is large, at the stage upon completion of the polishing step of FIGS. 35 and 36, a step difference as the step difference DS can be formed at the top surface of the dummy gate electrode DG. However, subsequently, the dummy gate electrode DG is removed. This is accordingly less likely to lead to defective conditions. In other words, at the stage upon completion of the polishing step of FIGS. 35 and 36, a step difference should be prevented from being formed at the top surface of the gate electrode GE1. However, the formation of a step difference at the top surface of the dummy gate electrode DG can be allowed to a certain extent. For this reason, the manufacturing method of the present embodiment is effective not only for the case where the gate length of the dummy gate electrode DG is smaller than the gate length of the gate electrode GE1, but also for the case where the gate length of the dummy gate electrode DG is equal to, or larger than the gate length of the gate electrode GE1.

In accordance with the technical idea of the present embodiment, the present inventors have found the following: when the gate length of the gate electrode GE1 is larger than the gate length of the control gate electrode CG, the step difference DS may be formed at the top surface of the gate electrode GE1 upon polishing the interlayer insulation film, and thereby exposing the top surface of the gate electrode GE1. In order to resolve such a concern, in the etching step of FIGS. 29 and 30, the gate electrode GE1 is previously etched. In other words, of the control gate electrode CG and the gate electrode GE1, the gate electrode GE1 with a larger gate length is targeted for etching in the etching step of FIGS. 29 and 30, and the control gate electrode CG with a smaller gate length is not targeted for etching in the etching step of FIGS. 29 and 30. As a result, for both of the control gate electrode CG with a smaller gate length, and the gate electrode GE1 with a large gate length, the flatness of the top surface of the gate electrode (CG or GE1) can be enhanced at the stage upon completion of the polishing step of FIGS. 35 and 36.

Further, the present embodiment is preferably applied to the case where the gate length of the gate electrode GE1 is larger than each of the gate length of the control gate electrode CG and the gate length of the memory gate electrode MG. Namely, of the control gate electrode CG, the memory gate electrode MG, and the gate electrode GE1, the gate electrode GE1 with the largest gate length is targeted for etching in the etching step of FIGS. 29 and 30, and the control gate electrode CG and the memory gate electrode MG with a smaller gate length than that of the gate electrode GE1 are not targeted for etching in the etching step of FIGS. 29 and 30. As a result, for both of the control gate electrode CG and the memory gate electrode MG with a smaller gate length, and the gate electrode GE1 with a larger gate length, the flatness of the top surface of the gate electrode (CG, MG, or GE1) can be enhanced at the stage upon completion of the polishing step of FIGS. 35 and 36.

Further, the effect of the application of the present embodiment to the case where the gate length of the gate electrode GE1 is 300 nm or more is very large. Namely, in the case of the Study Example, when the gate length of the gate electrode GE1 is large, the interlayer insulation films (IL102 and IL101) are polished, thereby to expose the top surface of the gate electrode GE1. At this step, the step difference DS may be formed at the top surface of the gate electrode GE1. Particularly, when the gate length of the gate electrode GE1 is 300 nm or more, the step difference DS becomes more likely to be formed at the top surface of the gate electrode GE1. In contrast, in the present embodiment, even when the gate length of the gate electrode GE1 is 300 nm or more, by previously etching the gate electrode GE1 in the etching step of FIGS. 29 and 30, it is possible to suppress or prevent the formation of an equivalent of the step difference DS at the top surface of the gate electrode GE1 at the stage upon completion of the polishing step of FIGS. 35 and 36.

Further, the effect of the application of the present embodiment to the case where the polishing rate (polishing speed) of the gate electrode GE1 is lower than each polishing rate (polishing speed) of the insulation film IL2 and the insulation film IL1 in the polishing step of FIGS. 35 and 36 is very large. The reason for this is as follows.

Namely, in the polishing step of FIGS. 35 and 36, it is the insulation films (insulation films IL2 and IL1, the cap insulation films CP1, CP2, and CP3, and the sidewall spacers SW) that are mainly polished. Accordingly, a polishing solution (polishing slurry) appropriate to polish the insulation film is used. This results in the use of a polishing solution such that the polishing rate of the silicon film (the control gate electrode CG, the memory gate electrode MG, the dummy gate electrode DG, and the gate electrode GE1) is lower than that of the insulation films (insulation films IL2 and IL1, the cap insulation films CP1, CP2, and CP3, and the sidewall spacers SW) in the polishing step of FIGS. 35 and 36. For example, a polishing solution such that the polishing rate of a silicon film is lower than the polishing rate of a silicon oxide film or a silicon nitride film is used. However, when such a polishing solution is used, the manufacturing steps of the Study Example are applied. Then, when the interlayer insulation films (IL102 and IL101) are polished, thereby to expose the top surface of the gate electrode GE1, the step difference DS becomes more likely to be formed at the top surface of the gate electrode GE1. In contrast, in the present embodiment, even when such a polishing solution is used, by previously etching the gate electrode GE1 in the etching step of FIGS. 29 and 30, it is possible to suppress or prevent the formation of an equivalent of the step difference DS at the top surface of the gate electrode GE1 at the stage upon completion of the polishing step of FIGS. 35 and 36. For this reason, the effect of the application of the present embodiment to the case where the polishing rate (polishing speed) of the gate electrode GE1 in the polishing step of FIGS. 35 and 36 is lower than the polishing rate (polishing speed) of the insulation film IL2 and the insulation film IL1 in the polishing step of FIGS. 35 and 36 is very large. Further, the application of the present embodiment widens the range of selection of the polishing solution to be used in the polishing step of FIGS. 35 and 36. This can also provide an effect of allowing use of a polishing solution appropriate for the polishing step of FIGS. 35 and 36.

Further, in the present embodiment, the thickness (first thickness) T1 of the portion of the gate electrode GE1 exposed from the opening OP2 at the stage upon completion of an etching treatment of the gate electrode GE1 in the etching step of FIGS. 29 and 30 is preferably almost the same as the thickness (second thickness) T2 of the control gate electrode CG at the stage upon completion of a polishing treatment in the polishing step of FIGS. 35 and 36 (i.e., T1=T2). Incidentally, the thickness T1 is shown in FIG. 30, and the thickness T2 is shown in FIG. 35. The reason for this will be described below.

Namely, when the thickness T1 is set larger than the thickness T2, in the polishing step of FIGS. 35 and 36, the portion of the gate electrode GE1 overlapping the opening OP2 in a plan view is also required to be polished to a certain extent. For this reason, the possibility of the formation of a step difference at the top surface of the gate electrode GE1 at the stage upon completion of the polishing step of FIGS. 35 and 36 is smaller than that of the case of the Study Example, but is present to a degree. On the other hand, when the thickness T1 is set smaller than the thickness T2, it becomes almost unnecessary to polish the portion of the gate electrode GE1 overlapping the opening OP2 in a plan view in the polishing step of FIGS. 35 and 36. However, when the thickness T1 is set too small, a polishing residue of the insulation film IL2 may be accordingly generated over the gate electrode GE1 upon completion of the polishing. When the polishing residue of the insulation film IL2 is generated over the gate electrode GE1 in the polishing step of FIGS. 35 and 36, for example, the polishing residue of the insulation film IL2 over the gate electrode GE1 may inhibit the formation of the metal silicide layer SL2 at the top of the gate electrode GE1 for forming the metal silicide layer SL later. In contrast, when the thickness T1 is set equal to the thickness T2 (T1=T2), in the polishing step of FIGS. 35 and 36, it is almost unnecessary to polish the portion of the gate electrode GE1 overlapping the opening OP2 in a plan view. Further, it is also possible to avoid the concern about the polishing residue of the insulation film IL2 over the gate electrode GE1 upon completion of the polishing associated with the excessive reduction of the thickness T1. For this reason, the thickness T1 of the portion of the gate electrode GE1 exposed from the opening OP2 at the stage upon completion of the etching step of FIGS. 29 and 30 is more preferably set nearly equal to the thickness T2 of the control gate electrode CG at the stage upon completion of the polishing step of FIGS. 35 and 36. With this configuration, it is possible to more precisely suppress or prevent the generation of the polishing residue of the insulation film IL2 over the gate electrode GE1 at the stage upon completion of the polishing step of FIGS. 35 and 36. In addition, it is possible to more precisely suppress or prevent the formation of an equivalent of the step difference DS at the top surface of the gate electrode GE1.

Incidentally, the thickness T1 is equal to the thickness T2 (T1=T2). This corresponds to the following: the polishing amount (polishing thickness or the thickness of the polished portion) of the control gate electrode CG in the polishing step of FIGS. 35 and 36 is set nearly equal to the etching amount (etching thickness or the thickness of the etched portion) of the gate electrode GE1 in the etching step of FIGS. 29 and 30. In the present embodiment, the gate electrode GE1 is preferably previously etched by the polishing amount of the control gate electrode CG in the the polishing step of FIGS. 35 and 36 in the etching step of FIGS. 29 and 30. As a result, it is possible to more precisely enhance the flatness of the top surface of the gate electrode GE1 at the stage upon completion of the polishing step of FIGS. 35 and 36. Further, it is possible to more precisely prevent the generation of the polishing residue of the insulation film IL2 over the gate electrode GE1.

Further, the thickness (third thickness) T3 of the central part (the central part in the gate length direction) of the gate electrode GE1 at the stage upon completion of a polishing treatment in the polishing step of FIGS. 35 and 36 is preferably equal to the thickness T2 of the control gate electrode CG at the stage upon completion of a polishing treatment in the polishing step of FIGS. 35 and 36 (i.e., T3=T2). Herein, the thickness T3 is shown in FIG. 36, and the thickness T2 is shown in FIG. 35. Herein, the thickness T2 of the control gate electrode CG is typically the thickness of the central part (the central part in the gate length direction) of the control gate electrode CG. When, at the stage upon completion of the polishing step of FIGS. 35 and 36, the thickness T3 of the central part of the gate electrode GE1 with a large gate length is equal to the thickness T2 of the control gate electrode CG with a small gate length, the flatness of the top surface of the gate electrode GE1 with a large gate length can be set at the same level as that of the flatness of the top surface of the control gate electrode CG with a small gate length. In this case, it can be said that the effect of the application of the present embodiment has been sufficiently able to be enjoyed.

Then, by reference to FIGS. 61 to 64, the relationship between the gate electrode GE1 and the opening OP2 will be further described. FIGS. 61 to 64 are each an essential part plan view of the semiconductor device of the present embodiment during a manufacturing step, and each show the same step stage as that of FIGS. 29 and 30. Incidentally, for ease of understanding, in FIGS. 61 to 64, only the gate electrode GE1 and the opening OP2 are shown, and other constituent elements are not shown. The cross sectional view of FIG. 30 corresponds to the case of FIG. 61. Incidentally, in each drawing of FIGS. 61 to 64, the planar position of the opening OP1 is substantially in agreement with the planar position of the opening OP2.

Figure 61:
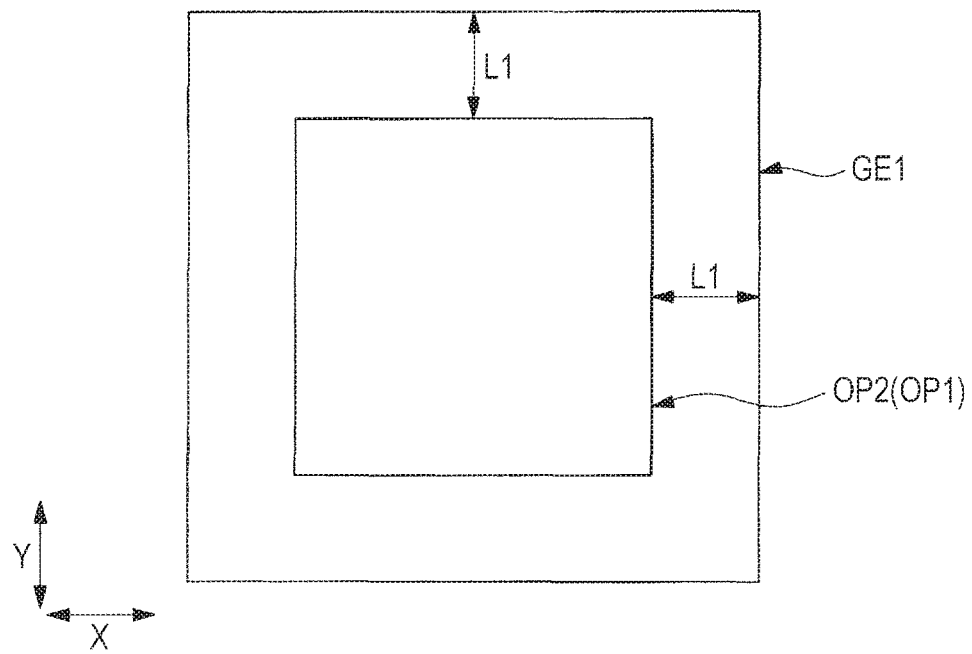
FIG. 61 is an essential part plan view of a semiconductor device of one example during a manufacturing step.

In the case of FIG. 61, one opening OP2 is provided for each gate electrode GE1. Namely, over the gate electrode GE1, one opening OP2 is formed in the insulation film IL1 (and the cap insulation film CP3). The portion of the gate electrode GE1 exposed from the opening OP2, namely, the portion of the gate electrode GE1 overlapping the opening OP2 in a plan view is etched in the etching step of FIGS. 29 and 30, thereby to be reduced in height. FIG. 61 shows the case where the planar configuration of the opening OP2 is a rectangle. However, other planar configurations than a rectangle can also be adopted.

The case of FIG. 61 is characterized in that the opening OP2 is internally included in the gate electrode GE1 in a plan view. Namely, the planar dimensions (planar area) of the opening OP2 is smaller than the planar dimensions (planar area) of the gate electrode GE1. In a plan view, the opening OP2 is internally included in the gate electrode GE1. The reason why the opening OP2 is internally included in the gate electrode GE1 in a plan view is as follows.

Namely, in the etching step of FIGS. 29 and 30, the portion of the gate electrode GE1 exposed from the opening OP2 is etched. This is for reducing the polishing area of the gate electrode GE1 in the polishing step of FIGS. 35 and 36, and for increasing the corner part of the top surface of the gate electrode GE1. In a plan view, the opening OP2 is internally included in the gate electrode GE1. As a result, by etching the portion of the gate electrode GE1 exposed from the opening OP2 in the etching step of FIGS. 29 and 30, it is possible to form the corner part at a position along the outer periphery (sidewall) of the opening OP2 at the top surface of the gate electrode GE1. This can precisely enhance the flatness of the top surface of the gate electrode GE1 at the stage upon completion of the polishing step of FIGS. 35 and 36. Accordingly, it is possible to precisely suppress or prevent the formation of the step difference DS as shown in FIG. 60 at the top surface of the gate electrode GE1.

Alternatively, when in a plan view, the opening OP2 is not internally included in the gate electrode GE1, and the opening OP2 extends off the gate electrode GE1, the opening OP1 of the the photoresist pattern PR1 necessarily extends off the gate electrode GE1. In such a case, in the etching step of FIGS. 27 and 28, at a position immediately under the portion of the opening OP1 extending off the gate electrode GE1 in a plan view, the insulation film IL1 and the sidewall spacer SW may be excessively etched, which is undesirable. When as in the present embodiment, the opening OP2 is internally included in the gate electrode GE1 in a plan view, necessarily, the opening OP1 of the photoresist pattern PR1 does not extend off the gate electrode GE1 in a plan view. This can prevent the insulation film IL1 and the sidewall spacers SW from being excessively etched in the etching step of FIGS. 27 and 28. Also from this viewpoint, preferably, in a plan view, the opening OP2 is internally included in the gate electrode GE1.

Further, in a plan view, the distance (space or minimum distance) between the outer periphery of the gate electrode GE1 and the opening OP2 L1 is preferably set at about 80 nm or more (L1≥80 nm). Namely, in a plan view, the region within 80 nm from the outer periphery of the gate electrode GE1 of the top surface of the gate electrode GE1 is preferably set so as not to overlap the opening OP2 (not to be exposed from the opening OP2). As a result, even when the formation position of the photoresist pattern PR1 is deviated from the designed position due to the misalignment of the photomask, or the like, the conditions under which the opening OP2 is internally included in the gate electrode GE1 in a plan view can be attained with a precision. This is common not only to the case of FIG. 61, but also to the case of FIG. 62, the case of FIG. 63, and the case of FIG. 64.

Figure 62:
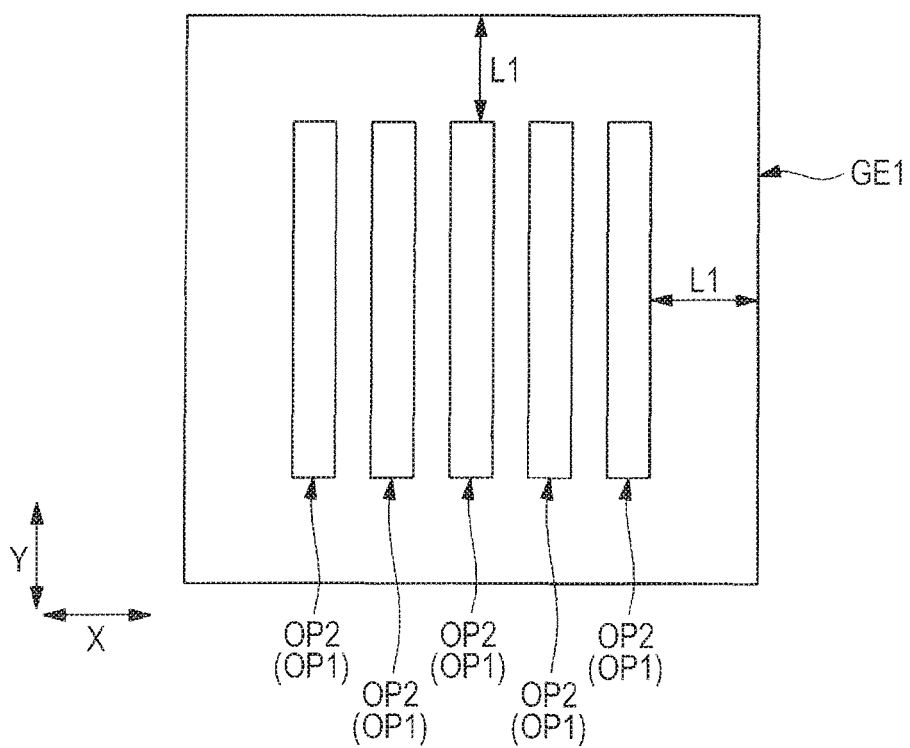
FIG. 62 is an essential part plan view of a semiconductor device of one example during a manufacturing step.

Then, the case of FIG. 62, the case of FIG. 63, and the case of FIG. 64 will be described. In the case of FIG. 62, the case of FIG. 63, and the case of FIG. 64, a plurality of openings OP2 are provided for each gate electrode GE1. Namely, over the gate electrode GE1, a plurality of openings OP2 are formed in the insulation film IL1 (and the cap insulation film CP3). The portions of the gate electrode GE1 exposed from the plurality of openings OP2, namely, the portions of the gate electrode GE1 overlapping the plurality of openings OP2 in a plan view are etched in the etching step of FIGS. 29 and 30, thereby to be reduced in height.

In the case of FIG. 62, a plurality of openings OP2 extending in a band shape (in a linear shape) in the Y direction are aligned in the X direction. Each opening OP2 has a larger dimension in the Y direction than the dimension in the X direction.

Herein, the X direction and the Y direction are the directions substantially in parallel with the main surface of the semiconductor substrate SB. In addition, the X direction and the Y direction are orthogonal to each other. It can be assumed that the X direction is one of the gate length direction and the gate width direction of the gate electrode GE1, and that the Y direction is the other of the gate length direction and the gate width direction of the gate electrode GE1.

Figure 63:
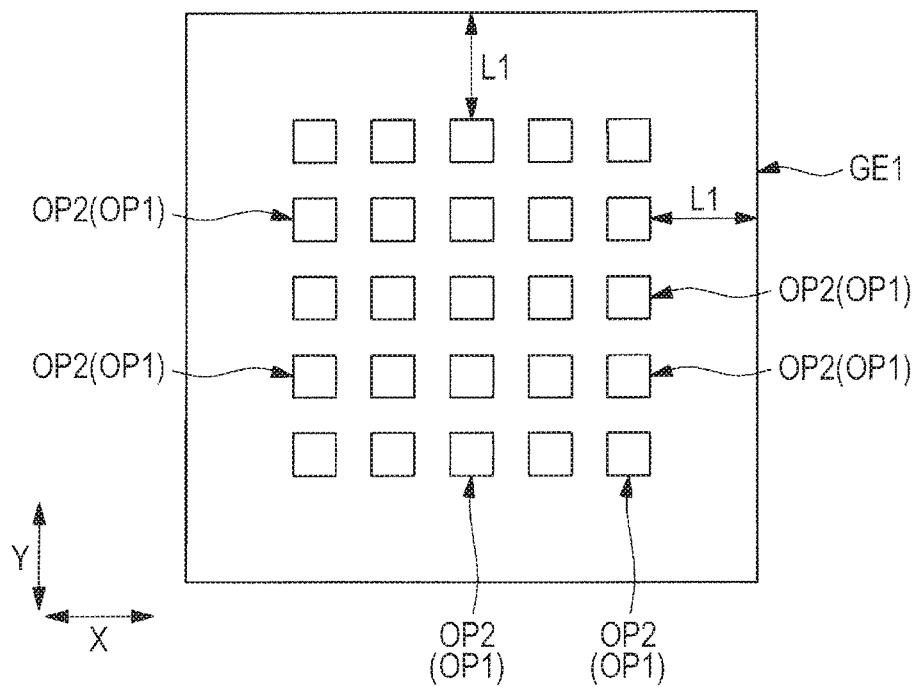
FIG. 63 is an essential part plan view of a semiconductor device of one example during a manufacturing step.

In the case of FIG. 63, for example, a plurality of openings OP2 each in a rectangular shape are arranged in the X direction and the Y direction in an array (matrix). Further, in the arrangement (array-like arrangement) of the openings OP2 of FIG. 63, the arrangement can also be shifted by ½ pitch for each line, thereby to arrange the plurality of openings OP2 in a so-called staggered arrangement. That case (the case of the staggered arrangement) is shown in FIG. 64. Further, FIGS. 62 to 64 each show the case where the planar configuration of the opening OP2 is a rectangle. However, other planar configurations than a rectangle can also be adopted.

Figure 64:
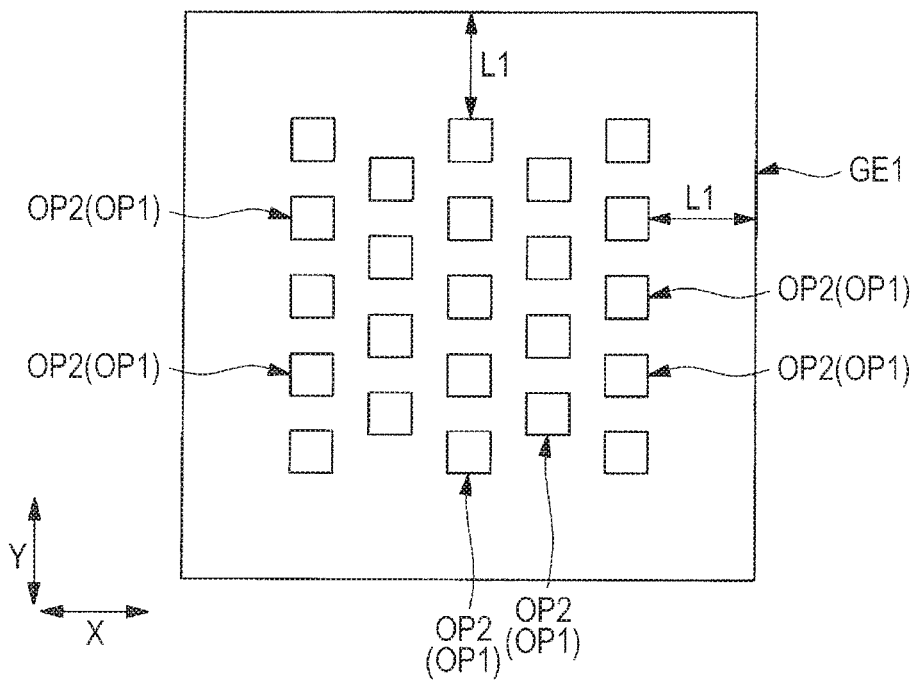
FIG. 64 is an essential part plan view of a semiconductor device of one example during a manufacturing step.

The case of FIG. 62, the case of FIG. 63, and the case of FIG. 64 are characterized in that a plurality of openings OP2 are formed over the gate electrode GE1, and the plurality of openings OP2 are internally included in the gate electrode GE1 in a plan view. The reason why the plurality of openings OP2 are internally included in the gate electrode GE1 in a plan view is the same as the reason why the openings OP2 are internally included in the gate electrode GE1 in the case of FIG. 61. Accordingly, a repeated description thereon is herein omitted.

Alternatively, the case where as in each case of FIGS. 62 to 64, a plurality of openings OP2 are provided for each gate electrode GE1 can provide the following effects.

Namely, in the case where a plurality of openings OP2 are provided for each gate electrode GE1, even without an increase in total area of the plurality of openings OP2, the corner part can be efficiently formed at the top surface of the gate electrode GE1 in the etching step of FIGS. 29 and 30. For this reason, when a plurality of openings OP2 are provided for each gate electrode GE1, the total area of the plurality of openings OP2 tends to be adjusted to a given value. This facilitates the adjustment of the area of the cap insulation film CP3 and the insulation film IL1 present over the gate electrode GE1 after the etching step of FIGS. 29 and 30. For this reason, it is possible to adjust the area of the cap insulation film CP3 and the insulation film IL1 present over the gate electrode GE1 in the high breakdown voltage MIS region 1C in consideration of the balance with the occupancy rate of the cap insulation film (CP1 or CP2), and the insulation film IL1 thereover in other regions. Accordingly, the polishing step of FIGS. 35 and 36 becomes more likely to be performed. For example, in the polishing step of FIGS. 35 and 36, the polishing area of the insulation film IL1, and the polishing area of the cap insulation film become more likely to be equalized among the memory region 1A, the low breakdown voltage MIS region 1B, and the high breakdown voltage MIS region 1C. For this reason, the polishing step of FIGS. 35 and 36 becomes more likely to be performed.

Up to this point, the invention completed by the present inventors was described specifically byway of embodiments thereof. However, it is naturally understood that the present invention is not limited to the embodiments, and may be variously changed within the scope not departing the gist thereof.

What is claimed is:

1. A method for manufacturing a semiconductor device including a memory cell of a nonvolatile memory, a first MISFET, and a second MISFET, comprising the steps of:
   (a) providing a semiconductor substrate;
   (b) over the semiconductor substrate, forming a first gate electrode for the memory cell via a first insulation film, forming a second gate electrode for the memory cell via a second insulation film having a charge accumulation part in the inside thereof, forming a third gate electrode for the first MISFET via a third insulation film, and forming a dummy gate electrode via a fourth insulation film;
   (c) forming a fifth insulation film in such a manner as to cover the first gate electrode, the second gate electrode, the third gate electrode, and the dummy gate electrode;

(d) forming an opening exposing a part of the third gate electrode in the fifth insulation film;

(e) etching the third gate electrode exposed from the opening, and reducing the height of the top surface of a portion of the third gate electrode exposed from the opening;

(f) after the step (e), forming a sixth insulation film over the fifth insulation film in such a manner as to cover a portion of the third gate electrode exposed from the opening;

(g) polishing the sixth insulation film and the fifth insulation film, and exposing the first gate electrode, the second gate electrode, the third gate electrode, and the dummy gate electrode;

(h) after the step (g), removing the dummy gate electrode; and (i) forming a fourth gate electrode for the the second MISFET in a trench of a region from which the dummy gate electrode has been removed in the step (h), wherein, the gate length of the third gate electrode is larger than the gate length of the first gate electrode.

2. The method for manufacturing a semiconductor device according to claim 1,
wherein the gate length of the third gate electrode is larger than the gate length of the second gate electrode.

3. The method for manufacturing a semiconductor device according to claim 1,
wherein the second gate electrode is adjacent to the first gate electrode via the second insulation film.

4. The method for manufacturing a semiconductor device according to claim 1,
wherein the first gate electrode, the second gate electrode, the third gate electrode, and the dummy gate electrode are each a silicon gate electrode.

5. The method for manufacturing a semiconductor device according to claim 4,
wherein the fourth gate electrode is a metal gate electrode.

6. The method for manufacturing a semiconductor device according to claim 1,
wherein the gate length of the third gate electrode is 300 nm or more.

7. The method for manufacturing a semiconductor device according to claim 1,
wherein the polishing rate of the third gate electrode in the step (g) is lower than the polishing rate of the sixth insulation film and the fifth insulation film in the step (g).

8. The method for manufacturing a semiconductor device according to claim 1,
wherein the step (d) includes the steps of:
(d1) forming a resist pattern over the fifth insulation film; and
(d2) etching the fifth insulation film using the resist pattern as an etching mask, and thereby forming the opening in the fifth insulation film.

9. The method for manufacturing a semiconductor device according to claim 1,
wherein in the step (b), over the semiconductor substrate, a first lamination body having the first gate electrode and a first cap insulation film over the first gate electrode is formed via the first insulation film, the second gate electrode is formed via the second insulation film, a second lamination body having the third gate electrode and a second cap insulation film over the third gate electrode is formed via the third insulation film, and a third lamination body having the dummy gate electrode and a third cap insulation film over the dummy gate electrode is formed via the fourth insulation film, wherein in the step (c), the fifth insulation film is formed in such a manner as to cover the first lamination body, the second gate electrode, the second lamination body, and the third lamination body, and wherein in the step (g), the first cap insulation film, the second cap insulation film, and the third cap insulation film are also polished.

10. The method for manufacturing a semiconductor device according to claim 9,
wherein the first cap insulation film, the second cap insulation film, and the third cap insulation film are formed of the same material as that for the fifth insulation film.

11. The method for manufacturing a semiconductor device according to claim 9, further comprising, after the step (b), and before the step (c), a step of:
(b1) forming a first metal silicide layer over the second gate electrode.

12. The method for manufacturing a semiconductor device according to claim 11,
wherein in the step (g), the first metal silicide layer is polished and removed.

13. The method for manufacturing a semiconductor device according to claim 1, further comprising, after the step (i), a step of:
(j) forming a second metal silicide layer at each top of the first gate electrode, the second gate electrode, and the third gate electrode.

14. The method for manufacturing a semiconductor device according to claim 1, further comprising, after the step (g), and before the step (h), a step of:
(g1) forming a seventh insulation film covering the first gate electrode, the second gate electrode, and the third gate electrode, and exposing the dummy gate electrode.

15. The method for manufacturing a semiconductor device according to claim 14,
wherein the step (i) includes the steps of:
(i1) forming a first conductive film for the fourth gate electrode over the seventh insulation film including the inside of the trench; and
(i2) removing the first conductive film outside the trench, and leaving the first conductive film in the trench, to form the fourth gate electrode.

16. The method for manufacturing a semiconductor device according to claim 1,
wherein the opening is internally included in the third gate electrode in a plan view.

17. The method for manufacturing a semiconductor device according to claim 1,
wherein in the step (d), the plural openings are formed over the third gate electrode,
wherein the openings are internally included in the third gate electrode in a plan view.

18. The method for manufacturing a semiconductor device according to claim 1, further comprising: after the step (b), and before the step (c), a step of:
(b2) forming a first semiconductor region for a source or a drain of the memory cell, a second semiconductor region for a source or a drain of the first MISFET, and a third semiconductor region for a source or a drain of the second MISFET over the semiconductor substrate.

19. The method for manufacturing a semiconductor device according to claim 1, wherein in the step (b), the first gate electrode, the third gate electrode, and the dummy gate electrode are formed of a common film, and wherein a first thickness of a portion of the the third gate electrode exposed from the opening at the stage upon completion of an etching treatment of the third gate electrode is equal to a second thickness of the first gate electrode at the stage upon completion of a polishing treatment in the step (g).

20. The method for manufacturing a semiconductor device according to claim 19, wherein a third thickness of the central part of the third gate electrode at the stage upon completion of a polishing treatment in the step (g) is equal to the second thickness.

* * * * *